United States Patent
Yamazaki et al.

(10) Patent No.: US 7,314,785 B2
(45) Date of Patent: Jan. 1, 2008

(54) DISPLAY DEVICE AND MANUFACTURING METHOD THEREOF

(75) Inventors: Shunpei Yamazaki, Setagaya (JP); Osamu Nakamura, Atsugi (JP); Aki Yamamiti, Atsugi (JP); Naoto Yamade, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 306 days.

(21) Appl. No.: 10/968,240

(22) Filed: Oct. 20, 2004

(65) Prior Publication Data

US 2005/0087769 A1 Apr. 28, 2005

(30) Foreign Application Priority Data

Oct. 24, 2003 (JP) .............................. 2003-365229

(51) Int. Cl.
  *H01L 21/336* (2006.01)
  *H01L 21/00* (2006.01)
  *H01L 21/84* (2006.01)

(52) U.S. Cl. ........................ 438/149; 438/153; 438/257

(58) Field of Classification Search ................ 438/149, 438/153, 257
See application file for complete search history.

(56) References Cited

U.S. PATENT DOCUMENTS 5,789,298 A * 8/1998 Gardner et al. ............. 438/286
5,882,761 A   3/1999 Kawami et al.
6,909,409 B2 * 6/2005 Tanada ......................... 345/51
2002/0113248 A1 8/2002 Yamagata et al.

FOREIGN PATENT DOCUMENTS

| EP | 0 993 235 | 4/2000 |
|---|---|---|
| JP | 09-148066 | 6/1997 |
| JP | 11-271753 | 10/1999 |
| JP | 11-330239 | 11/1999 |
| JP | 2001-203076 | 7/2001 |
| JP | 2003-255845 | 9/2003 |

OTHER PUBLICATIONS

Miyashita et al., "Full Color Displays Fabricated by Ink-Jet Printing," Asia Display / IDW '01, pp. 1399-1402.

* cited by examiner

*Primary Examiner*—Chuong A. Luu
(74) *Attorney, Agent, or Firm*—Eric J. Robinson; Robinson Intellectual Property Law Office, P.C.

(57) ABSTRACT

A display device with improved reliability and a manufacturing method of the same with improved yield. A display device according to the invention comprises a display area including a first electrode, an insulating layer covering an edge of the first electrode, a layer containing an organic compound, which is formed on the first electrode, and a second electrode. The first electrode and the insulating layer are doped with an impurity element of one conductivity.

10 Claims, 30 Drawing Sheets peripheral portion | pixel portion peripheral portion | pixel portion peripheral portion | pixel portion peripheral portion | pixel portion peripheral portion | pixel portion peripheral portion | pixel portion

DISPLAY DEVICE AND MANUFACTURING METHOD THEREOF

BACKGROUND OF THE INVENTION

1. Field of the Invention

The present invention relates to a display device that comprises an element including a light emitting material sandwiched between electrodes (hereinafter referred to as a light emitting element), and to a manufacturing method of the display device. In particular, the invention relates to a display device using a light emitting material that generates EL (Electro Luminescence) (hereinafter referred to as an EL material).

2. Description of the Related Art

In recent years, an EL display device utilizing electro luminescence (hereinafter referred to as EL) has been developed. The EL display device, as well as a liquid crystal display device that has been in practical use, comprises pixels arranged in matrix to display images. Known as a driving method of pixels are a passive matrix method and an active matrix method using transistors. In either case, what attracts attention is that self-luminous type pixels each including an EL element formed of an EL material provide wide viewing angle and high contrast.

It is said that an EL element emits light through the following mechanism: a voltage is applied between a pair of electrodes that sandwich an organic compound layer, electrons injected from the cathode and holes injected from the anode are re-combined at the luminescent center of the organic compound layer to form molecular excitons, and the molecular excitons return to a ground state while releasing energy to cause the EL element to emit light. Excitation state includes a singlet exciton and a triplet exciton, and it is considered that luminescence can be made through either excitation state.

However, an EL material (particularly, an organic EL material) that mainly constitutes an EL element is characterized in that it is sensitive to moisture and degrades easily. Therefore, a sealing technology is an essential part of manufacturing of an EL display device. Known as a sealing structure is the one in which a sealing member is provided so as to surround a display area including EL elements and a sealing substrate is formed with the sealing member interposed therebetween (for example, see Patent Document 1).

[Patent Document 1] Japanese Patent Laid-Open No. 2003-255845

SUMMARY OF THE INVENTION

Although the sealing structure allows a display area including EL elements to be sealed and prevents moisture from entering externally, it is not possible to inhibit completely degradation of an EL display device. That is, there may occur a punctate non-light emitting area (including an area in which luminance is lowered partially) in pixels, a defect due to enlargement of the area (hereinafter referred to as a dark spot), and a defect in which a non-light emitting area at the periphery of pixels is enlarged with time (hereinafter referred to as a shrink).

In view of the foregoing problems, the invention provides a display device that can prevent degradation of an EL material and a manufacturing method of the display device.

According to the invention, an interlayer insulating film provided for planarization is required to have high heat resistance, high insulation properties, and a high planarization rate. Therefore, a heat resistant planarized film is preferably used. Such an interlayer insulating film is preferably formed by an application method typified by a spin coating method instead of a CVD method or a vapor deposition method.

Specifically, it is desirable to use a heat resistant planarized film formed by an application method as an interlayer insulating film and an insulating layer (bank). The interlayer insulating film and the insulating layer (bank) are formed of an application film using a material that has a backbone structure obtained by binding silicon (Si) to oxygen (O) and has one or more substituents selected from hydrogen, fluorine, an alkyl group, and aromatic hydrocarbon. A film after being baked corresponds to a silicon oxide film (SiOx) containing an alkyl group. The silicon oxide film (SiOx) containing an alkyl group has a higher light transmittance than acryl resin and can endure heat treatment at a temperature of 300° C. or more.

According to the invention, an interlayer insulating film and an insulating layer (bank) are formed by an application method through the following steps. First, in order to increase the wettability, thinner pre-wet application is carried out after washing a substrate with purified water, and a liquid material called a varnish in which a low molecular weight component (precursor) with binding of silicon (Si) to oxygen (O) is dissolved in a solvent is applied on the substrate by a spin coating method or the like. Then, the varnish as well as the substrate is heated to accelerate volatilization (evaporation) of the solvent and crosslinking of the low molecular weight component, whereby a thin film can be obtained. Subsequently, an application film in a peripheral edge portion of the substrate is removed. In the case of an insulating layer (bank) being formed, the film may be patterned to obtain a desired shape. The film thickness is controlled by the spin rotation rate, the rotation time, the concentration and the viscosity of the varnish.

The use of the same material for an interlayer insulating film and an insulating layer (bank) will result in the reduction of the manufacturing cost. Further, since devices such as the one for coating and for etching can be used in common, cost reduction can also be achieved.

In general, ITO (Indium Tin Oxide) is employed for a first electrode (anode or cathode) of an EL element that includes a light emitting layer containing an organic compound. However, ITO has a high refractive index of approximately 2. Thus, according to the invention, the first electrode is formed of indium tin oxide containing silicon oxide (hereinafter referred to as ITSO). Unlike ITO, ITSO is not crystallized even when baked and remains in the amorphous state. Accordingly, the planarity of ITSO is superior to that of ITO, and the first electrode using ITSO is not short-circuited to the second electrode easily even when a layer containing an organic compound is thin, thus, ITSO is suitable for an electrode of a display element. In addition, when silicon oxide with a refractive index of approximately 1.46 is added, the refractive index of ITSO used as the first electrode can be changed.

Furthermore, a display device that includes ITSO for an electrode and uses for an interlayer insulating film a heat resistant planarized film obtained by an application method generates less heat, leading to improved reliability of the display device.

According to the display device of the invention, light from a light emitting layer is emitted outside of a substrate through stacked layers formed of a material with high light transmittance, whereby increased emission efficiency can be achieved.

According to the invention, a heat resistant planarized film, a first electrode, and an insulating layer (bank) are doped with at least one element selected from the elements belonging to Group 13 or Group 15 in the periodic table, which are impurities of one conductivity type. The doping may be carried out by an ion doping method, a plasma doping method, or an ion implantation method. As the elements belonging to Group 13 or Group 15 in the periodic table, B, Al, Ga, In, Tl, P, As, Sb, and Bi can be employed, and typically phosphorous (P) and boron (B) are employed. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. In addition, the baking effect of the doping itself allows moisture to be released during the treatment. When the first electrode is also doped with at least one element selected from the elements belonging to Group 13 or Group 15 in the periodic table, physical properties such as resistance can be controlled.

The dosage of at least one element selected from the elements belonging to Group 13 or Group 15 in the periodic table, which is included in the doped region (densified area), may be substantially equal in the heat resistant planarized film, the first electrode and the insulating layer (bank). Specifically, the concentration is preferably in the range of $1 \times 10^{18}$ to $5 \times 10^{21}/cm^3$, and more preferably in the range of $2 \times 10^{19}$ to $2 \times 10^{21}/cm^3$. It is to be noted that when a side surface of the insulating layer and a side surface of the planarized film are inclined to have a tapered shape, at least one element (ion species) selected from the elements belonging to Group 13 or Group 15 in the periodic table can be accelerated in an electric field to affect the side surfaces, leading to modification thereof. A taper angle at this time is preferably in the range between 30 and 75°.

According to the invention, in the case of, after forming a contact hole, an element with a conductivity being doped to the periphery of the contact hole, it is possible not only to densify the periphery of the contact hole but also to add the element with a conductivity to a semiconductor layer under the contact hole. Therefore, a high density impurity region can be formed in the semiconductor layer in a self-aligned manner.

At least one element selected from the elements belonging to Group 13 or Group 15 in the periodic table may be doped to each of the heat resistant planarized film, the first electrode, and the insulating layer (bank), or may be doped to one or two of them. Alternatively, it may be doped to the whole surface of them, or may be selectively doped to form a doped region partially. That is, only a side surface of the heat resistant planarized film may be doped with an element and covered with a sealing member, or a contact hole may be partially doped with an element. Needless to say, an element may be doped to the whole surface to make a high density region.

According to the invention, a substance containing an organic material can be used for a heat resistant planarized film and an insulating layer (bank). When such a substance being doped with at least one element selected from the elements belonging to Group 13 or Group 15 in the periodic table, the light transmittance thereof is lowered and the substance is colored. The reflectivity thereof remains low. In the case of the heat resistant planarized film being doped with at least one element selected from the elements belonging to Group 13 or Group 15 in the periodic table, the transmittance and reflectivity thereof are lowered due to the doping and the heat resistant planarized film is colored. In a top emission display device, the colored film can be used as a light shielding film that provides the effect of protecting TFT characteristics and the like. Even in a dual emission or a bottom emission display device, when a passivation film is formed on a heat resistant planarized film, the passivation film is not colored by at least one element selected from the elements belonging to Group 13 or Group 15 in the periodic table, therefore, only a part that exposes the heat resistant planarized film in a contact hole, is colored and densified. Accordingly, even in a dual emission or a bottom emission display device, light can be transmitted and extracted sufficiently. The densified area of a contact hole can prevent moisture from entering. As a result, contamination such as moisture can be prevented from entering through the contact hole, and thus the effect of preventing degradation of a display element is further enhanced.

Furthermore, when doping at least one element selected from the elements belonging to Group 13 or Group 15 in the periodic table, the light transmittance of an insulating layer (bank) is lowered and the insulating layer is colored in black. Accordingly, the light transmittance of the insulating layer (bank) can be controlled so that it is colored in black and used as a black matrix of a display device. According to the invention, an insulating layer (bank) can function as a densified barrier against contamination as well as a black matrix with low light transmittance, low reflectivity, and improved optical properties. As a result, it is possible to provide an inexpensive display device with improved yield and reliability.

According to one mode of the invention, a display device comprises a display area that includes a first electrode, an insulating layer covering an edge of the first electrode, a layer containing an organic compound formed on the first electrode, and a second electrode. The first electrode and the insulating layer are doped with an impurity element of one conductivity type.

According to one mode of the invention, a display device comprises a display area that includes a first electrode, a thin film transistor connected to the first electrode with a planarized film interposed therebetween, an insulating layer covering an edge of the first electrode, a layer containing an organic compound formed on the first electrode, and a second electrode. The first electrode, the insulating layer, and a side surface of the planarized film are doped with an impurity element of one conductivity.

According to one mode of the invention, a display device comprises a display area that includes a first electrode, a thin film transistor connected to the first electrode with a planarized film interposed therebetween, an insulating layer covering an edge of the first electrode, a layer containing an organic compound formed on the first electrode, and a second electrode. Either a source electrode or a drain electrode of the thin film transistor is connected to a semiconductor layer through an opening portion of the planarized film. The first electrode, the insulating layer, and a side surface and the opening portion of the planarized film are doped with an impurity element of one conductivity type.

In the aforementioned structures, the heat resistant planarized film and the insulating layer (bank) may be formed of the same material, and may be formed of a silicon oxide (SiOx) film containing an alkyl group. The use of the same material results in lowered manufacturing costs. Further, in the aforementioned structures, the first electrode may be formed of indium tin oxide containing silicon oxide (SiOx).

In the aforementioned structures, the semiconductor layer connected to the source electrode and the drain electrode may be a high density impurity region that is formed when, after forming the opening portion (contact hole), the heat resistant planarized film is doped with at least one element selected from the elements belonging to Group 13 or Group 15 in the periodic table.

In the aforementioned structures, the insulating layer (bank) that is doped with at least one element selected from the elements belonging to Group 13 or Group 15 in the periodic table is colored, and may be used as a black matrix (light shielding film).

In each of the aforementioned structures, the display element emits light of red, green, blue, or white color.

According to one mode of the invention, a manufacturing method of a display device comprises the steps of: forming on a substrate having an insulating surface a thin film transistor that includes a semiconductor layer having a source region, a drain region, and a channel forming region interposed therebetween, a gate insulating film, and a gate electrode; forming a planarized film on an irregular surface due to the form of the thin film transistor; forming a source electrode and a drain electrode that are connected to the source region and the drain region respectively; forming a first electrode connected to the drain electrode; forming an insulating layer covering an edge of the first electrode; doping an impurity element of one conductivity to the first electrode and the insulating layer; forming a layer containing an organic compound on the first electrode; and forming a second electrode on the layer containing an organic compound.

According to one mode of the invention, a manufacturing method of a display device comprises the steps of: forming on a first substrate having an insulating surface a thin film transistor that includes a semiconductor layer having a source region, a drain region, and a channel forming region interposed therebetween, a gate insulating film, and a gate electrode; forming a planarized film on an irregular surface due to the form of the thin film transistor; removing the planarized film selectively to form a planarized film having a tapered shape at a peripheral edge portion of the first substrate; forming a source electrode and a drain electrode that are connected to the source region and the drain region respectively; forming a first electrode connected to the drain electrode; forming an insulating layer covering an edge of the first electrode; doping an impurity element of one conductivity to the first electrode, the insulating layer, and at least an edge of the planarized film; forming a layer containing an organic compound on the first electrode; forming a second electrode on the layer containing an organic compound; and attaching a second substrate to the first substrate with a sealing member surrounding an outer edge of the planarized film.

According to one mode of the invention, a manufacturing method of a display device comprises the steps of: forming on a first substrate having an insulating surface a thin film transistor that includes a semiconductor layer having a source region, a drain region, and a channel forming region interposed therebetween, a gate insulating film, and a gate electrode; forming a planarized film on an irregular surface due to the form of the thin film transistor; removing the planarized film selectively to form an opening portion extending to the source region or the drain region and to form a planarized film having a tapered shape at a peripheral edge portion of the first substrate; doping an impurity element of one conductivity to the opening portion and the edge of the planarized film, the source region and the drain region; forming a high density impurity region in the source region and the drain region; forming a source electrode and a drain electrode that are connected to the source region and the drain region respectively; forming a first electrode connected to the drain electrode; forming an insulating layer covering an edge of the first electrode; doping an impurity element of one conductivity to the first electrode and the insulating layer; forming a layer containing an organic compound on the first electrode; forming a second electrode on the layer containing an organic compound; and attaching a second substrate to the first substrate with a sealing member surrounding an outer edge of the planarized film.

In the aforementioned structures, at least one element selected from the elements belonging to Group 13 or Group 15 in the periodic table is doped to the planarized film, the first electrode, and the insulating layer (bank) so that the dosage of the at least one element may be equal in the planarized film, the first electrode, and the insulating layer (bank) that are doped with the at least one element. More specifically, at least one element selected from the elements belonging to Group 13 or Group 15 in the periodic table is doped to the planarized film, the first electrode, and the insulating layer (bank) so that the concentration of the at least one element may be in the range of $1\times10^{18}$ to $5\times10^{21}/$cm$^3$, and more preferably in the range of $2\times10^{19}$ to $2\times10^{21}/$cm$^3$. The doping may be carried out at an energy of 1 to 150 kV, and more preferably at an energy of 50 to 80 kV, and at a dosage of $1\times10^{14}/$cm$^2$ or more, and more preferably at a dosage of $1\times10^{15}$ to $1\times10^{16}/$cm$^2$. It is to be noted that when a side surface of the insulating layer and a side surface of the planarized film are inclined to have a tapered shape, at least one element (ion species) selected from the elements belonging to Group 13 or Group 15 in the periodic table can be accelerated in an electric field to affect the side surfaces, leading to modification thereof. A taper angle at this time is preferably in the range between 30 and 75°.

As the elements belonging to Group 13 or Group 15 in the periodic table, B, Al, Ga, In, Tl, P, As, Sb, and Bi can be employed, and typically, phosphorous (P) and boron (B) are employed. At least one element selected from the elements belonging to Group 13 or Group 15 in the periodic table, which are relatively large in atomic diameter, is doped in order to generate distortions, modify or densify the surface (including side walls), and thereby preventing moisture and oxygen from entering. When the first electrode is also doped with at least one element selected from the elements belonging to Group 13 or Group 15 in the periodic table, physical properties such as resistance can be controlled.

In the aforementioned structures, the planarized film or the insulating layer (bank) is a silicon oxide (SiOx) film containing an alkyl group, which is formed by an application method. Further, in each of the aforementioned structures, an anode is formed by a sputtering method using indium tin oxide containing silicon oxide (SiOx) as a target.

In each of the aforementioned structures, the light emitting display device can be applied to both an active matrix type and a passive matrix type.

A light emitting element (EL element) as a display element comprises an anode, a cathode, and a layer containing an organic compound in which luminescence can be obtained when an electric field is applied (electro luminescence). The luminescence in an organic compound includes luminescence that is generated when an is excited singlet state returns to a ground state (fluorescence) and luminescence that is generated when an excited triplet state returns to a ground state (phosphorescence). A light emitting display device according to the invention can be applied to both types of the luminescence.

A light emitting element (EL element) including an EL layer has a structure in which the EL layer is sandwiched between a pair of electrodes. In general, the EL layer has a laminated structure and typically, a hole transporting layer, a light emitting layer, and an electron transporting layer are laminated in this order. This structure provides significantly increased emission efficiency, and almost all the light emitting devices being studied and developed now adopt this structure.

As another structure, a hole injection layer, a hole transporting layer, a light emitting layer, and an electron transporting layer may be laminated on an anode in this order, or a hole injection layer, a hole transporting layer, a light emitting layer, an electron transporting layer, and an electron injection layer may be laminated on an anode in this order. The light emitting layer may be doped with a fluorescent pigment or the like. All of these layers may be formed of a low molecular weight material or a high molecular weight material. Alternatively, a layer containing an inorganic material may be employed. It is to be noted that in this specification, all the layers disposed between an electrode functioning as a cathode and an electrode functioning as an anode are collectively called an EL layer. Therefore, the EL layer includes all of the aforementioned hole injection layer, hole transporting layer, light emitting layer, electron transporting layer, and electron injection layer.

In the light emitting device according to the invention, a driving method of dual emission display is not exclusively limited. For example, a dot-sequential driving method, a line-sequential driving method, a frame-sequential driving method and the like may be employed. Typically, the line-sequential driving method is used, and a time gray scale driving method and an area gray scale driving method may be adopted appropriately. In addition, an image signal inputted to a source line of the light emitting display device may be either an analog signal or a digital signal, and a driver circuit and the like may be designed appropriately in accordance with the image signal.

In a light emitting display device using a digital video signal, a video signal inputted to a pixel is driven by a constant voltage (CV) or a constant current (CC). When a video signal is driven by a constant voltage (CV), a voltage applied to a light emitting element is constant (CVCV) or a current supplied to a light emitting element is constant (CVCC). When a video signal is driven by a constant current (CC), a voltage applied to a light emitting element is constant (CCCV) or a current supplied to a light emitting element is constant (CCCC).

In this specification, light extraction efficiency means the rate of light emission from the surface of a transparent substrate to the atmosphere relative to light emission of an element.

The invention can be applied to any type of TFT. For example, a top gate TFT, a bottom gate (inverted staggered) TFT, or a forward staggered TFT can be adopted.

As an active layer of a TFT, an amorphous semiconductor film, a semiconductor film including a crystalline structure, a compound semiconductor film including an amorphous structure, and the like can be employed appropriately. Further, as an active layer of a TFT, a semi-amorphous semiconductor film (also called a microcrystalline semiconductor film) that is a semiconductor having an intermediate structure between amorphous and crystalline (including single crystalline and polycrystalline) structures. This semiconductor has a third state that is stable in free energy and a crystalline region having a short range order and a lattice distortion. At least a part of the semi-amorphous semiconductor film has crystal grains of 0.5 to 20 nm and Raman spectrum is shifted to the lower frequency band than 520 $cm^{-1}$. The semi-amorphous semiconductor has an x-ray diffraction pattern with peaks at (111) and (220) that are considered to be due to Si crystal lattice. Further, the semi-amorphous semiconductor film is mixed with at least 1 atom % of hydrogen or halogen as the neutralizing agent for dangling bond. The semi-amorphous semiconductor can be obtained by glow discharge decomposition of silicon gas (plasma CVD). As a silicon gas, $SiH_4$ can be used as well as $Si_2H_6$, $SiH_2Cl_2$, $SiHCl_3$, $SiCl_4$, $SiF_4$ or the like. The silicon gas may be diluted by one or more noble gas elements selected from $H_2$, $H_2$ and He, Ar, Kr, and Ne. In that case, the silicon gas is diluted at a dilution rate of 2 to 1000, at a pressure of about 0.1 to 133 Pa, a power supply frequency of 1 to 120 MHz, and more preferably of 13 to 60 MHz. The substrate may be heated at a temperature of 300° C. or less, and more preferably of 100 to 250° C. Among impurity elements added to the film, atmospheric elements such as oxygen, nitrogen and carbon desirably have a concentration of $1 \times 10^{20}$ $cm^{-1}$ or less. In particular, the concentration of oxygen is $5 \times 10^{19}$ $cm^3$ or less, and more preferably $1 \times 10^{19}$ $cm^3$ or less. The field effect mobility μ of a TFT using a semi-amorphous semiconductor film as an active layer is in the range of 1 to 10 $cm^2/Vsec$.

When an insulating layer used for a bank is doped with at least one element selected from the elements belonging to Group 13 or Group 15 in the periodic table, a surface and a side surface of the insulating layer are modified and densified, and thereby moisture entering externally and moisture included in the insulating layer are released so as not to adversely affect an EL layer. Accordingly, various defects such as a dark spot and a shrink can be prevented, leading to improved reliability of a display device.

When doping at least one element selected from the elements belonging to Group 13 or Group 15 in the periodic table, the resistivity of a first electrode can be controlled. Therefore, electrical properties of the electrode can be controlled so that the emission efficiency, the luminance and the like of a display device may be increased.

At the same time, when an insulating layer covering an edge of the first electrode is doped with at least one element selected from the elements belonging to Group 13 or Group 15 in the periodic table, the light transmittance of the insulating layer can be lowered so as to be used as a light shielding film (black matrix). As a result, the number of manufacturing steps is reduced, leading to lower cost and improved yield of the display device.

DETAILED DESCRIPTION OF THE INVENTION

Embodiment Mode 1

Figure 1A:
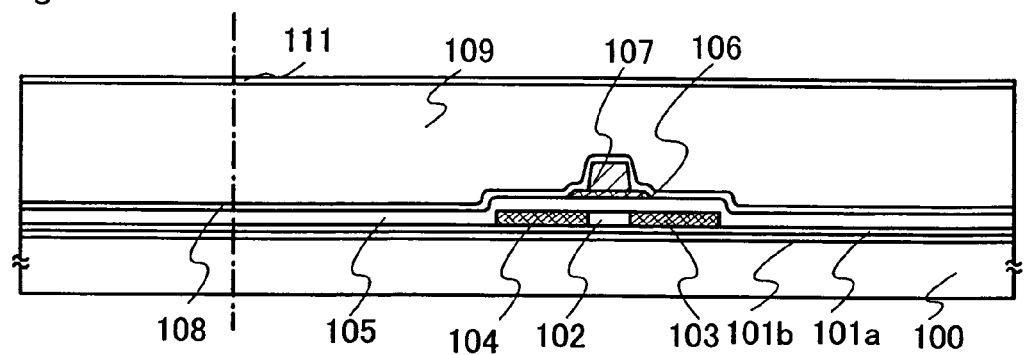
FIGS. 1A to 1D are diagrams showing a configuration of the invention.

An embodiment mode of the invention is described hereinafter.

A base film 101 is formed on a substrate 100 having an insulating surface. As the base film 101, a silicon oxynitride film 101b with a thickness of 10 to 200 nm (preferably 50 to 100 nm) is formed by plasma CVD and a silicon oxynitride film 101a with a thickness of 50 to 200 nm (preferably 100 to 150 nm) is formed thereon. It is possible to use as the substrate 100 a glass substrate, a quartz substrate, a silicon substrate, a metal substrate or a stainless substrate each of which has a surface covered with an insulating film. Alternatively, a plastic substrate having a heat resistance at a treatment temperature of this embodiment mode may be employed as well as a flexible substrate. The base film may have a two-layer structure, or may be formed of a single or two or more base (insulating) films.

Then, a semiconductor film is formed on the base film 101. The semiconductor film may be formed by a known method (sputtering, LPCVD, plasma CVD or the like) so as to have a thickness of 25 to 200 nm (preferably 30 to 150 nm). A material of the semiconductor film is not exclusively limited, though it is preferably formed of silicon, an alloy of silicon and germanium (SiGe), and the like.

For the semiconductor film, an amorphous semiconductor (typified by amorphous silicon hydride), or a crystalline semiconductor (typified by polysilicon) is employed. Polysilicon includes a so-called high temperature polysilicon that mainly uses polycrystalline silicon formed at a process temperature of 800° C. or more, a so-called low temperature polysilicon that mainly uses polycrystalline formed at a process temperature of 600° C. or less, a crystalline silicon that is crystallized by doping an element for promoting crystallization thereto, and the like.

As the semiconductor film, a semi-amorphous semiconductor or a semiconductor having a crystalline phase in a part of a semiconductor film may be used as well. The semi-amorphous semiconductor is a semiconductor having an intermediate structure between amorphous and crystalline (including single crystalline and polycrystalline) structures. This semiconductor has a third state that is stable in free energy, and it is a kind of a crystalline semiconductor that has a short range order and a lattice distortion. The semi-amorphous semiconductor typically includes silicon as a main component, and Raman spectrum is shifted to the lower frequency band than 520 $cm^{-1}$ due to the lattice distortion. Further, the semiconductor is mixed with at least 1 atom % of hydrogen or halogen as the neutralizing agent for dangling bond. Such a semiconductor is called herein a semi-amorphous semiconductor (SAS). The SAS is also called a microcrystalline semiconductor (typically microcrystalline silicon).

The SAS can be obtained by glow discharge decomposition of silicon gas. Typically, $SiH_4$ is used as a silicon gas, though $Si_2H_6$, $SiH_2Cl_2$, $SiHCl_3$, $SiCl_4$, $SiF_4$ or the like may be used as well. The formation of the SAS can be facilitated by using the silicon gas that is diluted by adding a single or a plurality of noble gas elements selected from hydrogen, hydrogen and helium, argon, krypton, and neon. The silicon gas is preferably diluted at a dilution rate of 5 to 1000. It is needless to say that the formation of the SAS by glow discharge decomposition is desirably performed under reduced pressure, but discharge under atmospheric pressure can also be utilized. Typically, the pressure may be in the range of about 0.1 to 133 Pa. The power supply frequency for generating the glow discharge is in the range of 1 to 120 MHz, and more preferably in the range of 13 to 60 MHz. An RF power may be set appropriately. The substrate is preferably heated at a temperature of 300° C. or less, and more preferably 100 to 200° C. Among impurity elements that are mainly doped during deposition, atmospheric elements such as oxygen, nitrogen and carbon desirably have a concentration of $1\times10^{20}$ $cm^{-3}$ or less. In particular, the concentration of oxygen is $5\times10^{19}$ $cm^{-3}$ or less, and more preferably $1\times10^{19}$ $cm^{-3}$ or less. When a noble gas element such as helium, argon, krypton, or neon is mixed into an SAS, the lattice distortion is increased and the stability is thus enhanced, leading to a good SAS.

In the case of a crystalline semiconductor film being used as the semiconductor film, it may be formed by a known method (laser crystallization, thermal crystallization, or thermal crystallization using an element such as nickel for promoting crystallization, and the like). Without introducing an element for promoting crystallization, hydrogen included in the amorphous silicon film may be released to lower the hydrogen concentration to $1\times10^{20}$ atoms/$cm^3$ or less by heating in a nitrogen atmosphere at a temperature of 500° C. for one hour, then laser light is irradiated to the amorphous silicon film. This is performed because the amorphous silicon film is damaged by laser irradiation when the film contains much hydrogen.

A method for doping a metal element into the amorphous semiconductor film is not exclusively limited as long as the metal element can exist on the surface of or inside the amorphous semiconductor film, and a method such as sputtering, CVD, plasma treatment (including plasma CVD), adsorption, or a method for applying a metal salt solution can be employed. Among them, a method using a solution is simple and easy, and is effective in adjusting the concentration of the metal element. Further, at this time, an oxide film is preferably formed by UV ray irradiation in an oxygen atmosphere, thermal oxidation, treatment with ozone water or hydrogen peroxide including hydroxyl radical, or the like in order to improve wettability of the surface of the amorphous semiconductor film and to spread water solution over an entire surface of the amorphous semiconductor film.

The amorphous semiconductor film may be crystallized by combining heat treatment and laser irradiation, and the heat treatment and the laser irradiation may be performed several times independently. In the case of the film being crystallized by heat treatment and laser irradiation, after doping the metal element, heat treatment is performed at a temperature of 500 to 550° C. for 4 to 20 hours to crystallize the amorphous semiconductor film (hereinafter referred to as a first crystalline semiconductor film).

Subsequently, a second crystalline semiconductor film is obtained by irradiating the first crystalline semiconductor film with laser light to promote crystallization. Laser crystallization is a method for irradiating the semiconductor film with laser light. As for the laser, a solid-state laser, a gas laser, or a metal laser of pulse oscillation or continuous wave oscillation is preferably used. The solid-state laser includes a YAG laser, a YVO$_4$ laser, a YLF laser, a YAlO$_3$ laser, a glass laser, a ruby laser, an alexandrite laser, a Ti:sapphire laser and the like. The gas laser includes an excimer laser, an Ar laser, a Kr laser, a CO$_2$ laser and the like. The metal layer includes a helium cadmium laser, a copper vapor laser, and a gold vapor laser. The laser beam may be converted to a harmonic by a non-linear optical element. A crystal used for the non-linear optical element such as LBO, BBO, KDP, KTP, KB5, or CLBO has the advantage of conversion efficiency. The conversion efficiency can be drastically increased by introducing these non-linear optical elements into a laser resonator. A laser of the harmonic is typically doped with Nd, Yb, Cr or the like, which are excited to oscillate a laser. A kind of the dopant may be selected appropriately.

After forming the crystalline semiconductor film in such a manner, a very small amount of impurity element (boron or phosphorous) is doped to control a threshold voltage of a TFT.

The semiconductor film is patterned by photolithography using a first photomask to obtain a semiconductor layer 102.

A gate insulating film 105 is formed so as to cover the semiconductor layer 102. The gate insulating film 105 is formed of an insulating film containing silicon by plasma CVD or sputtering so as to have a thickness of 40 to 150 nm. It is needless to say that the gate insulating film is not limited to a silicon oxynitride film, and it may be formed of a single or a plurality of other insulating films.

Subsequently, a first conductive film with a thickness of 20 to 100 nm and a second conductive film with a thickness of 100 to 400 nm are laminated in this order on the gate insulating film 105 to be used as a gate electrode. The first conductive film and the second conductive film may be formed of an element selected from Ta, W, Ti, Mo, Al, and Cu, or an alloy or a compound mainly containing the element. Alternatively, the first conductive film and the second conductive film may be formed of an AgPdCu alloy as well as a semiconductor film typified by a polycrystalline silicon film doped with an impurity element such as phosphorous. The conductive film is not limited to a two-layer structure, and may be a three-layer structure in which, for instance, a tungsten film with a thickness of 50 nm, an alloy film of aluminum and silicon (Al—Si) with a thickness of 500 nm, and a titanium nitride film with a thickness of 30 nm are laminated in this order. In the case of the three-layer structure being adopted, tungsten nitride may be used instead of tungsten as the first conductive film, an alloy film of aluminum and titanium (Al—Ti) may be used instead of the alloy film of aluminum and silicon (Al—Si) as the second conductive film, and a titanium film may be used instead of the titanium nitride film as the third conductive film. Alternatively, the conductive layer may have a single layer structure.

A second photomask using a resist is formed by photolithography to perform a first etching step for obtaining an electrode and a wiring. The first conductive film and the second conductive film can be etched so as to be have a desired tapered shape by ICP (Inductively Coupled Plasma) etching when etching conditions (amount of power applied to a coiled electrode, amount of power applied to an electrode on the substrate side, temperature of the electrode on the substrate side, and the like) are adjusted appropriately. As etching gas, chlorine gas typified by Cl$_2$, BCl$_3$, SiCl$_4$, CCl$_4$ or the like, or fluorinated gas typified by CF$_4$, SF$_6$, NF$_3$ or the like, can be employed appropriately as well as O$_2$.

Obtained by the first etching step is a conductive layer having a first shape, which includes a first conductive layer and a second conductive layer.

Then, a second etching step is performed without removing the mask using a resist. A W film is selectively etched herein. At this time, the second conductive layer is formed by the second etching step. On the other hand, the first conductive layer is hardly etched to form a conductive layer having a second shape. Accordingly, a conductive film 106 and a conductive film 107 are obtained. Although the conductive layers are formed by dry etching in this embodiment mode, they may be formed by wet etching.

After removing the resist mask, a resist mask as a third photomask is formed. Then, in order to form an N-channel TFT that is not shown in the drawing, a first doping step is performed to dope an impurity element that imparts an N-type conductivity (typically, phosphorous (P) or arsenic (As)) to a semiconductor at a low density. The resist mask covers an area to be used for a P-channel TFT and a periphery of the conductive layers. By the first doping step, through doping is performed through an insulating film to form a low density impurity region. One light emitting element is driven by a plurality of TFTs, however, in the case of the light emitting element being driven by P-channel TFTs only, the aforementioned doping step can be omitted.

After removing the resist mask, a resist mask as a fourth photomask is formed. Then, a second doping step is performed in order to dope an impurity element that imparts a P-type conductivity (typically, boron (B)) to a semiconductor at a high density. By the second doping step, through doping is performed through the gate insulating film 105 to form high density impurity regions 103 and 104.

Subsequently, a resist mask as a fifth photomask is formed. Then, in order to form an N-channel TFT that is not shown in the drawing, a third doping step is performed to dope an impurity element that imparts an N-type conductivity (typically, P or As) to a semiconductor at a high density. The conditions of the third doping step are such that the dosage is in the range of $1\times10^{13}$ to $5\times10^{15}/cm^2$ and the accelerating voltage is in the range of 60 to 100 keV. The resist mask covers an area to be used for a P-channel TFT and a periphery of the conductive layers. By the third doping step, through doping is performed through the gate insulating film 105 to form an N-type high density impurity region.

In this manner, an impurity region is formed in each of the semiconductor layers.

Then, the resist mask is removed and an insulating film 108 containing hydrogen is formed as a passivation film. The insulating film 108 is formed of an insulating film containing silicon by plasma CVD or sputtering so as to have a thickness of 100 to 200 nm. The insulating film 108 is not limited to a silicon nitride film and may be formed of a silicon nitride oxide (SiNO) film by plasma CVD. Alternatively, the insulating film 108 may be formed of a single or a plurality of other insulating films containing silicon.

Furthermore, heat treatment is carried out in a nitrogen atmosphere at a temperature of 300 to 550° C. (preferably 400 to 500° C.) for 1 to 12 hours, and a hydrogenation step of the semiconductor layers is performed. This step is carried out for terminating dangling bonds of the semiconductor layers by hydrogen contained in the insulating film 108.

The insulating film 108 is formed of a material selected from silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), and a carbon film containing nitrogen (CN). It is also possible to use a material that has a backbone structure obtained by binding silicon (Si) to oxygen (O) and has at least a hydrogen substituent, or a material that has one or more substituents selected from fluorine, an alkyl group, and aromatic hydrocarbon.

In order to activate the impurity element, heat treatment, intense light irradiation, or laser irradiation may be carried out. In addition to the activation, plasma damage to the gate insulating film can be recovered as well as plasma damage to an interface between the gate insulating film and the semiconductor layers.

Subsequently, a heat resistant planarized film 109 functioning as an interlayer insulating film is formed. The heat resistant planarized film 109 is formed by using an insulating film that has a backbone structure obtained by binding silicon (Si) to oxygen (O) and that is obtained by an application method.

Forming steps of the heat resistant planarized film 109 are hereinafter described in detail.

First, purified water cleaning of a substrate to be processed is performed. Megasonic cleaning may also be performed. After dehydrobaking being performed at a temperature of 140° C. for 110 seconds, a temperature of the substrate is regulated by cooling with a water-cooled plate for 120 seconds. Next, the substrate is transferred to be placed in a spin coating apparatus.

The spin coating apparatus comprises a nozzle and an application cup. The spin coating apparatus has a mechanism in which the solution of an applied material is dropped on the substrate, the substrate is placed horizontally in the application cup, and the entire application cup rotates. The spin coating apparatus also has a mechanism in which the pressure of atmosphere in the application cup can be controlled.

Subsequently, pre-wet application is carried out to improve wettability with the use of an organic solvent such as thinner (a volatile mixture solvent formed by mixing aromatic hydrocarbon (toluene or the like), alcohols, ester acetate and the like). The thinner is thoroughly spread by centrifugal force by spinning the substrate (rotation rate of 100 rpm) while dropping 70 ml of the thinner, then, the thinner is thrown off by spinning the substrate at high speed (rotation rate of 450 rpm).

Then, the solution of the applied material prepared by dissolving siloxane based polymer in a solvent (propylene glycolmonomethyl ether) is thoroughly spread by centrifugal force while gradually spinning (rotation rate from 0 to 1000 rpm) the substrate and dropping the solution of the applied material from the nozzle. Siloxane can be classified into, for example, silica glass, alkylsiloxane polymer, alkylsilsesquioxane polymer, hydrogenated silsesquioxane polymer, hydrogenated alkylsilsesquioxane polymer and the like according to the structure thereof. As examples of the siloxane based polymer, there are PSB-K1 or PSB-K31 as a material of an application insulating film produced by Toray, and ZRS-5PH as a material of an application insulating film produced by Shokubai Kasei. After holding the substrate for approximately 30 seconds, the substrate is gradually spun (rotation rate from 0 to 1400 rpm) again to level a film formed by the application step.

Inside of the application cup is exhausted to reduce the pressure, and then reduced-pressure drying is performed for within one minute.

Edge removing treatment is performed then by an edge remover equipped in the spin coating apparatus. The edge remover comprises a moving means that moves in parallel along the periphery of the substrate. The edge remover also comprises a thinner spraying nozzle so as to sandwich one side of the substrate, and the application film at the peripheral edge portion of the substrate is dissolved by the thinner, thereby the application film at the peripheral edge portion of the substrate edge is removed by evacuating liquid and gas.

Then, prebaking is carried out by performing baking at a temperature of 110° C. for 170 seconds.

The substrate is transferred from the spin coating apparatus and cooled. Afterwards, baking is further carried out at a temperature of 270° C. for one hour. Thus, the heat resistant planarized film 109 with a thickness of 0.8 μm is obtained. When the planarity of the obtained heat resistant planarized film 109 is observed by an AFM (Atomic Force Microscope) within an area of 10 μm×10 μm, the peak to valley (P-V) value (difference between the highest and the lowest values) is approximately 5 nm and the surface roughness Ra is approximately 1.3 nm.

The transmittance of the heat resistant planarized film 109 can be changed by varying baking temperature of the film. When the transmittance and refractive index of the heat resistant planarized film 109 (SiOx film containing an alkyl group) with a thickness of 0.8 μm is measured at baking temperatures of 270° C. and 410° C., the transmittance is increased and the reflective index is lowered in the case of 410° C. as compared with the case of 270° C.

In such a manner, the heat resistant planarized film 109 is obtained.

The heat resistant planarized film 109 may be formed by ink-jet. A material solution can be saved by the use of ink-jet.

The heat resistant planarized film 109 may be formed of an insulating film that has a backbone structure obtained by binding silicon (Si) to oxygen (O) as well as a film including a single or more kinds of materials having high heat resistance and high planarization rate, such as an inorganic material (silicon oxide, silicon nitride, silicon oxynitride, silicon nitride oxide and the like), a photosensitive or non-photosensitive organic material (organic resin material) (polyimide, acryl, polyamide, polyimide amide, resist, benzocyclobutene and the like), and a Low k material as a low dielectric constant material. Alternatively, films including these materials may be laminated to be used as the heat resistant planarized film 109.

Subsequently, an insulating film 111 is formed as a passivation film (see FIG. 1A). The insulating film 111 is formed of an insulating film containing silicon by plasma CVD or sputtering so as to have a thickness of 100 to 200 nm. When patterning a wiring 112 (used as a drain electrode or a source electrode) in subsequent steps, the insulating film 111 is used as an etching stopper film for protecting the heat resistant planarized film 109 that functions as an interlayer insulating film.

Needless to say, the insulating film 111 is not limited to a silicon oxynitride film, and may be formed of a single or a plurality of layers of other insulating films containing silicon. Although a silicon nitride film formed by sputtering is used in this embodiment mode, a silicon nitride oxide (SiNO) film formed by plasma CVD may be employed as well. In this embodiment mode, Ar in the film has a concentration of approximately $5\times10^{18}$ to $5\times10^{20}$ atoms/cm$^3$.

The insulating film 111 is formed of a material selected from silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), and a carbon film containing nitrogen (CN). It is also possible to use, as in this embodiment mode, a material that has a backbone structure obtained by binding silicon (Si) to oxygen (O) and has at least a hydrogen substituent, or a material that has one or more substituents selected from fluorine, an alkyl group, and aromatic hydrocarbon.

The heat resistant planarized film 109 at a peripheral edge portion of the substrate is removed simultaneously with the formation of a contact hole 130 in the heat resistant planarized film 109 with the use of a resist mask. Etching (wet etching or dry etching) is performed herein under the conditions that high etch selectivity is secured relative to the insulating film. Etching gas to be used may be added with inert gas. As the inert gas, a single or more kinds of gas selected from He, Ne, Ar, Kr, and Xe can be used. Among them, argon that is inexpensive and relatively large in atomic diameter is preferably employed. In this embodiment mode, CF$_4$, O$_2$, He, and Ar are used. Dry etching is performed by setting the flow of CF$_4$ at 380 sccm; O$_2$, 290 sccm; He, 500 sccm; Ar, 500 sccm; RF power, 3000 W; and pressure, 25 Pa. According to such conditions, etching residue can be reduced.

Note that, the etching time may be increased at the rate of approximately 10 to 20% for etching the gate insulating film 105 without leaving a residue on its surface. One time of etching or plural times of etching may be conducted to obtain a tapered shape. In addition, the tapered shape may be obtained by performing the second dry etching with the use of CF$_4$, O$_2$, and He by setting the flow of CF$_4$ at 550 sccm; O$_2$, 450 sccm; He, 350 sccm; RF power, 3000 W; and pressure, 25 Pa. A taper angle at the edge of the heat resistant planarized film 109 is desirably in the range between 30 to 75°.

The heat resistant planarized film 109 at a peripheral portion of the substrate may be doped with at least one element selected from the elements belonging to Group 13 or Group 15 in the periodic table to form a densified area in the tapered portion of the heat resistant planarized film 109. The doping may be carried out by an ion doping method, a plasma doping method, or an ion implantation method. As the elements belonging to Group 13 or Group 15 in the periodic table, B, Al, Ga, In, Ti, P, As, Sb, and Bi can be employed, and typically phosphorous (P) and boron (B) are employed. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. In addition, the baking effect of the doping itself allows moisture to be released during the treatment. At least one element selected from the elements belonging to Group 13 or Group 15 in the periodic table, which is included in the densified area, has a concentration of $1\times10^{18}$ to $5\times10^{21}$/cm$^3$, and typically $2\times10^{19}$ to $2\times10^{21}$/cm$^3$. It is to be noted that the tapered shape of the heat resistant planarized film at the peripheral edge portion of the substrate allows the side surface of the heat resistant planarized film 109 to be doped easily.

In the case of the heat resistant planarized film 109 being doped with at least one element selected from the elements belonging to Group 13 or Group 15 in the periodic table, the transmittance and reflectivity are lowered due to the doping and the heat resistant planarized film 109 is colored. In a top emission display device, the colored film can be used as a light shielding film that provides the effect of protecting TFT characteristics and the like. Even in a dual emission or a bottom emission display device, when the insulating film 111 as a passivation film is formed on the heat resistant planarized film 109 as in this embodiment mode, the passivation film is not colored by at least one element selected from the elements belonging to Group 13 or Group 15 in the periodic table. Therefore, only a part that exposes the heat resistant planarized film 109 in the contact hole is colored and densified. Accordingly, even in a dual emission or a bottom emission display device, light can be transmitted and extracted sufficiently. The densified area of the contact hole can prevent moisture from entering. As a result, contamination such as moisture can be prevented from entering through the contact hole, and thus the effect of preventing degradation of a display element is further enhanced.

The gate insulating film 105 is etched to form an opening portion that extends to a source region or a drain region. In order to form the opening portion, the insulating film 108 and the gate insulating film 105 may be etched with a mask that is formed after etching the heat resistant planarized film 109 or with the etched heat resistant planarized film 109 used as a mask. The gate insulating film 105 is etched by using CHF$_4$ and Ar as etching gas. By the etching step under such conditions, the contact hole that has a surface with few irregularities and has a high planarization rate can be obtained while reducing etching residue. It is to be noted that the etching time may be increased at the rate of approximately 10 to 20% to perform the etching while further reducing residues on the semiconductor layer. Through the aforementioned steps, a contact hole 130 is formed (see FIG. 1B).

A metal film is formed and etched to form a wiring 112 that is electrically connected to each impurity region. The wiring 112 functions also as a source electrode or a drain electrode. For the metal film, elements such as aluminum (Al), titanium (Ti), molybdenum (Mo), tungsten (W), and silicon (Si) may be used as well as an alloy film using these elements. In this embodiment mode, TiN, Al, and TiN are laminated so as to have a thickness of 100 nm, 350 nm, and 100 nm respectively, and then patterned to make a desired shape, thereby forming the wiring 112 (see FIG. 1C). Note that TiN is one of the materials having excellent adhesiveness with the heat resistant planarized film. When silicon oxide (SiOx) containing an alkyl group is used for the heat resistant planarized film and Ti is laminated as the wiring, a Si—O—Ti binding occurs at the interface, which produces an O—Ti binding a. On the other hand, when TiN is laminated as the wiring, a Si—N—Ti binding occurs at the interface, which produces a Si—N binding b and an N—Ti binding c. Since the O—Ti binding has a weak binging strength, it does not exhibit excellent adhesiveness. However, the Si—N binding b and the N—Ti binding c have a strong binding strength, therefore, they exhibit excellent adhesiveness and the film is not easily peeled off. In addition, TiN preferably contains N with a concentration of less than 44 atomic % in order to form a contact with the source region or the drain region of the TFT. More preferably, the concentration of N is contained in TiN is in the range between 7 and 44 atomic %. The conductive film may have a two-layer structure of TiN/Al, leading to simplification of the manufacturing steps.

Etching is carried out by ICP (Inductively Coupled Plasma) using $BCl_3$ and $Cl_2$. Etching conditions are such that the amount of power applied to a coiled electrode is 450 W; the amount of power applied to an electrode on the substrate side is 100 W; and pressure is 1.9 Pa. At this time, the insulating film 111 that has been formed previously functions as an etching stopper. When the wiring 112 and the insulating film 111 have high etch selectivity, the insulating film 111 can be planarized without leaving a residue on the surface thereof. The insulating film 111 having high planarization rate prevents a first electrode formed on the insulating film 111 as a pixel electrode from being broken or short-circuited, leading to improved reliability of a display device.

Through the aforementioned steps, an active matrix substrate having a TFT is completed. Although only a P-channel TFT is formed in a pixel region in this embodiment mode, an N-channel TFT may also be formed and the N-channel TFT may have a single gate structure including one channel forming region, a double gate structure including two channel forming regions, or a triple gate structure including three channel forming regions. Furthermore, a TFT in a driver circuit may also have a single gate structure, a double gate structure, or a triple gate structure.

The manufacturing method of a TFT is not limited to the one shown in this embodiment mode. The invention can be applied to a top gate (planer) TFT, a bottom gate (inverted staggered) TFT, a dual gate TFT that has two gate electrodes above and below a channel region with gate insulating films interposed therebetween, or other types of TFTs.

Subsequently, a first electrode (referred to as a pixel electrode) 113 is formed so as to be connected to the wiring 112. The first electrode 113 functions as an anode or a cathode. The first electrode 113 may be formed of a film or a laminated film that mainly includes an element selected from Ti, TiN, $TiSi_xN_y$, Ni, W, $WSi_x$, $WN_x$, $WSi_xN_y$, NbN, Cr, Pt, Zn, Sn, In, and Mo, or an alloy or a compound based on the element, which has a total thickness of 100 to 800 nm.

This embodiment mode adopts a structure in which a light emitting element is used as a display element and light from the light emitting element is extracted from the first electrode side, therefore, the first electrode transmits light. A transparent conductive film is formed and etched to be a desired shape to form the first electrode 113. As the first electrode 113, a transparent conductive film such as ITO, IZO, ITSO, and indium oxide mixed with zinc oxide (ZnO) of 2 to 20% may be employed. Alternatively, a titanium nitride film or a titanium film may also be used as the first electrode 113. In that case, after forming the transparent conductive film, a titanium nitride film or a titanium film is formed to be thin enough to transmit light (preferably about 5 to 30 nm). In this embodiment mode, ITSO is used as the first electrode 113. Unlike ITO, ITSO is not crystallized even when baked and remains in the amorphous state. Accordingly, the planarity of ITSO is superior to that of ITO, and the first electrode using ITSO is not short-circuited to the cathode easily even when a layer containing an organic compound is thin. The first electrode 113 may be swabbed by a polyvinyl alcohol based porous body and polished by CMP so that the surface thereof may be planarized. In addition, after being polished by CMP, the surface of the first electrode 113 may be irradiated with UV rays or treated with oxygen plasma and the like.

Then, an insulator (insulating layer) 114 (referred to as a bank, a barrier or the like) is formed so as to cover the edge of the first electrode 113 and the wiring 112. As the insulator 114, an SOG film (for example, a $SiO_X$ film containing an alkyl group) is formed by an application method so as to have a thickness of 0.8 to 1 μm. Etching may be either dry etching or wet etching. Here, the insulator 114 is formed by dry etching using a mixed gas of $CF_4$, $O_2$ and He (see FIG. 1D). The dry etching is performed under such conditions as 5 Pa of pressure, 1500 W, 25 sccm of $CF_4$, 25 sccm of $O_2$, and 50 sccm of He. In this dry etching step, the etching rate of the SiOx film containing an alkyl group is in the range of 500 to 600 nm/min whereas the etching rate of the ITSO film is 10 nm/min or less, thus, they can have sufficiently high etch selectivity. Further, since the wiring 112 is covered with the insulator 114 formed of the SiOx film containing an alkyl group, a TiN film having excellent adhesiveness is the outer surface. The insulator 114 may be formed of an insulating film that has a backbone structure obtained by binding silicon (Si) to oxygen (O) as well as a film including a single or more kinds of materials having high heat resistance and high planarization rate, such as an inorganic material (silicon oxide, silicon nitride, silicon oxynitride, silicon nitride oxide and the like), a photosensitive or non-photosensitive organic material (organic resin material) (polyimide, acryl, polyamide, polyimide amide, resist, benzocyclobutene and the like), and a Low k material as a low dielectric constant material. Alternatively, films including these materials may be laminated to be used as the insulator 114.

Figure 2A:
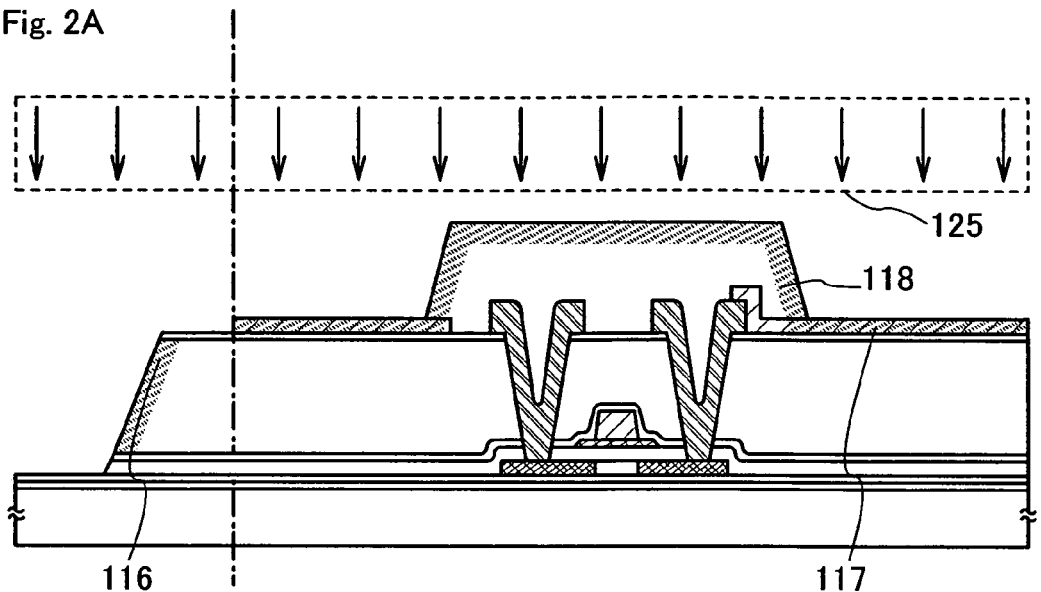
FIGS. 2A and 2B are diagrams showing a configuration of the invention.

According to the invention, the edge of the heat resistant planarized film 109, the first electrode 113, and the insulator 114 are doped with at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. In this embodiment mode, a gas 125 containing B as at least one element selected from the elements belonging to Group 13 or Group 15 in the periodic table is doped to form doped regions 116, 117 and 118 (see FIG. 2A). According to the invention, the doped regions 116, 117 and 118 in the heat resistant planarized film 109 and the insulator 114 are densified. Further, in the doped region 117 in the first electrode 113, physical properties such as resistance can be controlled. At least one element selected from the elements belonging to Group 13 or Group 15 in the periodic table, which are relatively large in atomic diameter, is added in order to generate distortions, modify or densify the surface (including side walls), and thereby preventing moisture and oxygen from entering. In addition, the baking effect of the doping itself allows moisture to be released during the treatment. At least one element selected from the elements belonging to Group 13 or Group 15 in the periodic table, which is included in the doped regions, has a concentration of $1 \times 10^{18}$ to $5 \times 10^{21}/cm^3$, and typically $2 \times 10^{19}$ to $2 \times 10^{21}/cm^3$. It is to be noted that the tapered shape of the edge of the heat resistant planarized film allows the side surface of the heat resistant planarized film 109 to be doped easily. The doping may be carried out at an energy of 1 to 150 kV, and more preferably at an energy of 50 to 80 kV, and at a dosage of $1 \times 10^{14}/cm^2$ or more, and more preferably at a dosage of $1 \times 10^{15}$ to $1 \times 10^{16}/cm^2$. In a case that phosphorous (P) is doped to the surface of the heat resistant planarized film or insulating layer, phosphorous exists up to about 5000 Å in the depth direction from the surface to which phosphorous is added. In a case that boron (B) is doped, boron exists up to about 8000 Å in the depth direction from the surface to which boron is added.

When doping at least one element selected from the elements belonging to Group 13 or Group 15 in the periodic table, the doped region 118 in the insulator (insulating layer) 114 functioning as a bank is colored in black. Accordingly, the insulating layer (bank) can be used as a black matrix. Thus, according to the invention, the insulating layer (bank) can function as a densified barrier against contamination as well as a black matrix with low light transmittance, low reflectivity, and improved optical properties. As a result, it is possible to provide an inexpensive display device with improved yield and reliability.

In order to improve reliability, it is preferable to perform vacuum heating before forming a light emitting layer 119 containing an organic compound, thereby performing degasification. For example, it is preferable to perform heat treatment at a temperature of 200 to 300° C. under a reduced pressure atmosphere or an inert atmosphere in order to remove gas contained in the substrate, before evaporating an organic compound material. Since the interlayer insulating film and the insulating layer (bank) are herein formed of a SiOx film having high heat resistance, heat treatment at a high temperature can be carried out without any problem. Accordingly, heat treatment steps for improving reliability can be performed sufficiently.

The light emitting layer 119 is formed on the first electrode 113 (doped region 117). Although FIGS. 2E and 2F show one pixel only, different light emitting layers each corresponding to one of R (red), G (green), and B (blue) colors are formed in this embodiment mode. The luminescence in all the light emitting layers may be either luminescence that is generated when an excited single state returns to a ground state (fluorescence) or luminescence that is generated when an excited triplet state returns to a ground state (phosphorescence). The luminescence in one color light emitting layer may be fluorescence (or phosphorescence) while the luminescence in other two color light emitting layers may be phosphorescence (or fluorescence).

The luminescence in R light emitting layer may be phosphorescence and the luminescence in G and B light emitting layers may be fluorescence. Specifically, the light emitting layer 119 may have a laminated structure of a hole injection layer formed of copper phthalocyanine (CuPc) with a thickness of 20 nm and a light emitting layer formed of tris-8-quinolinolato aluminum complex ($Alq_3$) with a thickness of 70 nm. Light emitting color can be controlled by adding to $Alq_3$ fluorescent pigment such as quinacridone, perylene, or DCM1.

However, the aforementioned material is one example of the organic light emitting materials used as a light emitting layer, and the invention is not limited to this at all. A light emitting layer (layer for transporting carriers to emit light) may be formed by appropriately combining a light emitting layer, an electron transporting layer or an electron injection layer. For example, a low molecular weight organic light emitting material is used as a light emitting layer in this embodiment mode, though a medium molecular weight organic light emitting material or a high molecular weight organic light emitting material may also be employed. Note that in this specification, a medium molecular weight organic light emitting material means an organic light emitting material that does not have sublimation properties and that has a molecularity of 20 or less, or a length of chained molecules of 10 μm or less. As an example of a light emitting layer using a high molecular weight organic light emitting material, a polythiophene (PEDOT) film with a thickness of 20 nm is formed by spin coating as a hole injection layer, and a paraphenylene vinylene (PPV) film with a thickness of about 100 nm is formed thereon as a light emitting layer. It should be noted that if π conjugated system polymer of PPV is used, the light emitting wavelengths from red color to blue color can be selected. Moreover, an inorganic material such as silicon carbide can also be used as an electron transporting layer and an electron injection layer. Known materials can be used as these organic light emitting materials and inorganic materials.

Subsequently, a second electrode 120 formed of a conductive film is provided on the light emitting layer 119. Since the first electrode functions as an anode whereas the second electrode functions as a cathode in this embodiment mode, the second electrode 120 may be formed of a material having a low work function (Al, Ag, Li, Ca, or an alloy of these elements such as MgAg, MgIn, AlLi, $CaF_2$, or CaN). This embodiment mode adopts a structure in which the second electrode 120 functions as a cathode and light is extracted from the first electrode 113 side that functions as an anode. Therefore, the second electrode 120 is preferably formed by using a metal film (with a thickness of 50 to 200 nm) formed of Al, Ag, Li, Ca, or an alloy of these elements such as MgAg, MgIn, or AlLi. However, the invention is not limited to this structure, and it is also possible to adopt a structure in which an N-channel TFT is used as a TFT in a pixel portion, and the first electrode 113 functions as a cathode whereas the second electrode 120 functions as an anode.

It is effective to provide a passivation film 121 so as to cover the second electrode 120. Used as the passivation film 121 is a single layer or a laminated layer of an insulating film formed of silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), or a carbon film containing nitrogen (CN). It is also possible to use a material that has a backbone structure obtained by binding silicon (Si) to oxygen (O) and has at least a hydrogen substituent, or a material that has one or more substituents selected from fluorine, an alkyl group, and aromatic hydrocarbon.

The passivation film 121 is preferably formed of a film having excellent coverage, and a carbon film, in particular a DLC film is employed efficiently. Since a DLC film can be formed at a temperature ranging from room temperature to 100° C., it can be easily formed over the light emitting layer 119 with low heat resistance. A DLC film may be formed by plasma CVD (typically, RF plasma CVD, microwave CVD, electron cyclotron resonance (ECR) CVD, hot-filament CVD or the like), combustion-flame, sputtering, ion beam vapor deposition, laser vapor deposition, and the like. As for reaction gas to be used for forming a film, hydrogen gas and hydrocarbon gas (for example, $CH_4$, $C_2H_2$, $C_6H_6$ or the like) are used. These gases are ionized by glow discharge, and after being accelerated in velocity, the resultant ions collides with a cathode that is applied with negative self-bias, thereby forming a film. Further, a CN film may be formed by using $C_2H_4$ gas and $N_2$ gas as reaction gas. A DLC film has a beneficial effect of blocking oxygen, and thereby the light emitting layer 119 can be prevented from being oxidized. Accordingly, the problem in that the light emitting layer 119 is oxidized during a subsequent sealing step can be solved.

Figure 2B:
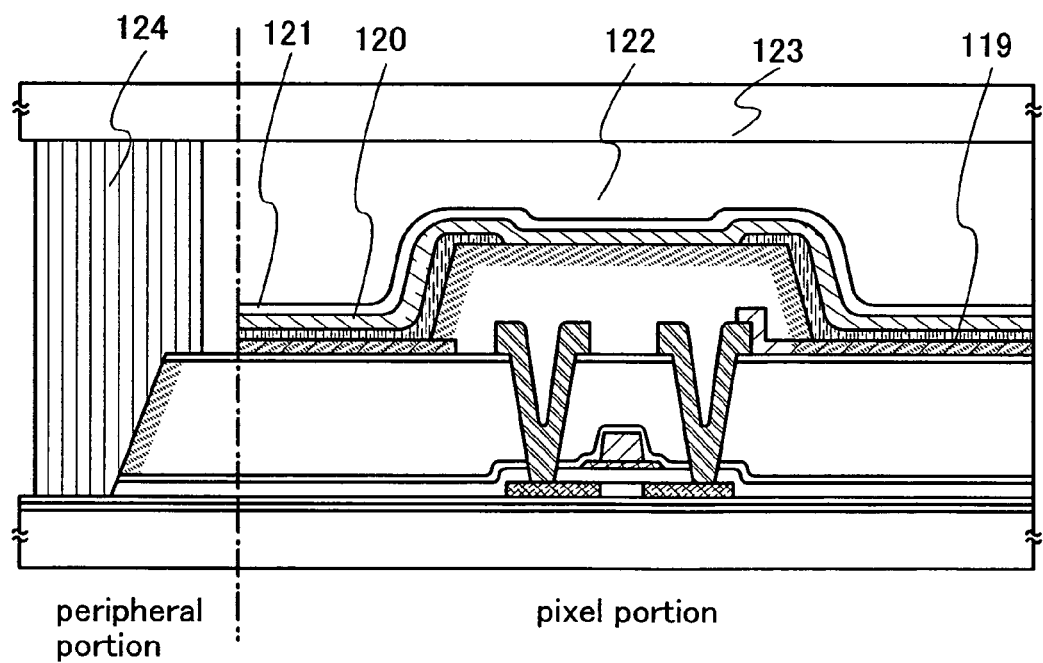

Then, a sealing substrate 123 is attached with a sealing member 124 to seal the light emitting element. The sealing substrate 123 is attached so that the sealing member 124 may cover the edge of the heat resistant planarized film 109 (doped region 116). The sealing member 124 prevents moisture from entering, thus degradation of the light emitting element can be prevented and reliability of a display device is improved. Note that a region surrounded by the sealing member 124 is filled with a filler 122 (see FIG. 2B). In this embodiment mode, light is extracted from the first electrode 113 side, therefore, the filler 122 is not required to transmit light. However, in the case of light being extracted through the filler 122, the filler 122 is required to transmit light. Typically, a visible light curable epoxy resin, a UV curable epoxy resin, or a heat curable epoxy resin may be used. Here, a high heat resistant UV epoxy resin (product name: 2500 Clear, manufactured by Electrolite Corporation) is used, which has a refractive index of 1.50, a viscosity of 500 cps, a Shore D hardness of 90, a tensile strength of 3000 psi, a Tg point of 150° C., a volume resistivity of $1 \times 10^{15}$ Ω·cm, and a withstand voltage of 450 V/mil. In addition, total transmittance can be improved by filling a region between a pair of substrates with the filler 122.

In a display device manufactured in this manner, the heat resistant planarized film 109, typically an interlayer insulating film of a TFT (used later as a base film of a light emitting element), which has a backbone structure obtained by binding silicon (Si) to oxygen (O), and the insulating layer (bank) 114 have an edge or an opening portion having a tapered shape. In addition, the heat resistant planarized film 109 and the insulator (bank) 114 are doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode 113 is doped with at least one element selected from the elements belonging to Group 13 or Group 15 in the periodic table, physical properties such as resistance can be controlled.

Embodiment Mode 2

Embodiment Mode 2 is described in detail with reference to FIGS. 3A to 3D, FIGS. 4E and 4F, and FIG. 5.

In this embodiment mode, after forming the heat resistant planarized film, the first electrode, and the insulating layer (bank), each of them is doped with at least one element selected from the elements belonging to Group 13 or Group 15 in the periodic table.

As described in Embodiment Mode 1, base films 301a and 301b are formed on a substrate 300, and a semiconductor layer 302 including impurity regions 303 and 304 is formed thereon. Conductive layers 306 and 307 as gate electrodes are formed over the semiconductor layer 302 with a gate insulating film 305 interposed therebetween, and an insulating film 308 is formed thereon as a passivation film. Then, a heat resistant planarized film 309 is formed as an interlayer film (see FIG. 3A). These manufacturing steps are described in detail (materials, forming conditions and the like) in Embodiment Mode 1. In this embodiment mode, the heat resistant planarized film 309 is formed of an insulating film that has a backbone structure obtained by binding silicon (Si) to oxygen (O).

In this embodiment mode, a contact hole (opening portion) 330 is formed in the heat resistant planarized film 309 by using a mask formed of a resist, and the heat resistant planarized film at the peripheral edge portion of the substrate is removed at the same time. Then, the heat resistant planarized film 309 is doped with a gas 315 having at least one element selected from the elements belonging to Group 13 or Group 15 in the periodic table to form a doped region 316 (see FIG. 3B).

The doping may be performed by an ion doping method, a plasma doping method, or an ion implantation method. As the elements belonging to Group 13 or Group 15 in the periodic table, B, Al, Ga, In, Tl, P, As, Sb, and Bi can be employed, and typically phosphorous (P) and boron (B) are employed. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. In addition, the baking effect of the doping itself allows moisture to be released during the treatment. At least one element selected from the elements belonging to Group 13 or Group 15 in the periodic table, which is included in the densified area, has a concentration of $1 \times 10^{18}$ to $5 \times 10^{21}/cm^3$, and typically $2 \times 10^{19}$ to $2 \times 10^{21}/cm^3$. It is to be noted that the tapered shape of the edge allows the side surface of the heat resistant planarized film 309 to be doped easily.

In the case of, after forming the contact hole 330, an element with a conductivity being doped to the periphery of the contact hole 330, it is possible not only to densify the periphery of the contact hole 330 but also to add the element with a conductivity to the semiconductor layer 302 under the contact hole 330. In this embodiment mode, the semiconductor layer 302 having a P-channel impurity region is doped with boron (B) as at least one element selected from the elements belonging to Group 13 or Group 15 in the periodic table, therefore, a high density impurity region 331 can be formed in the semiconductor layer 302 in a self-aligned manner. In addition, the heat resistant planarized film 309 can be densified to form a high density impurity region by the same step. Accordingly, reliability of a display device can be improved and electrical properties can be controlled without increasing the number of manufacturing steps. Such steps for controlling an impurity concentration and forming a desired impurity region can be applied to Embodiment Modes 1, 3 to 5 and Embodiments 1 to 6.

Figure 3A:
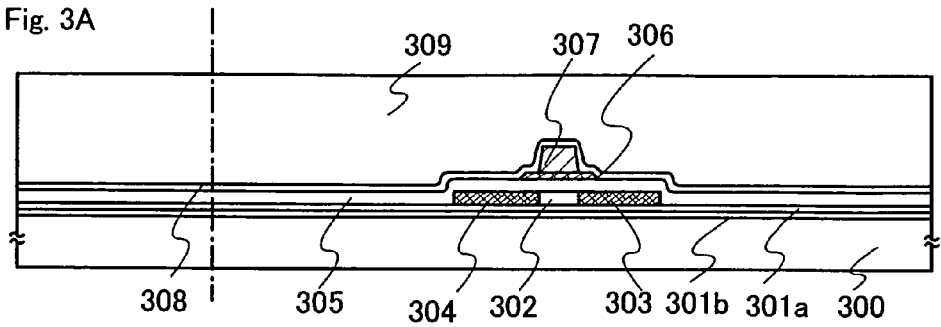
FIGS. 3A to 3D are diagrams showing a configuration of the invention.
Figure 3B:
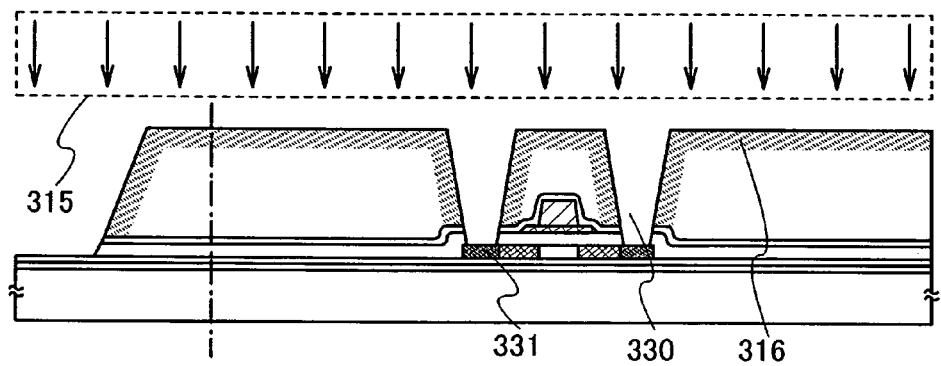
Figure 3C:
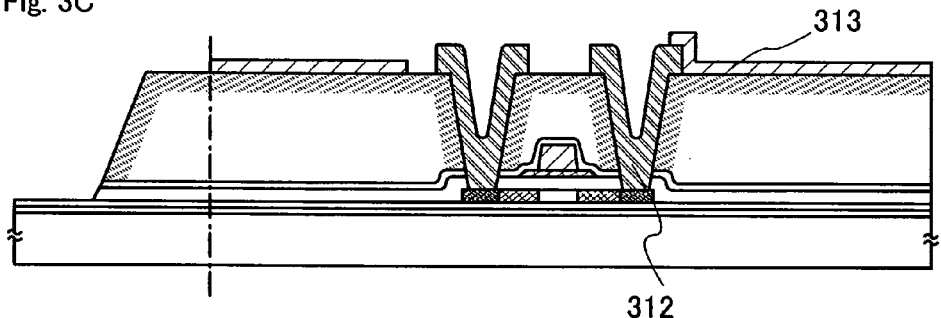
Figure 3D:
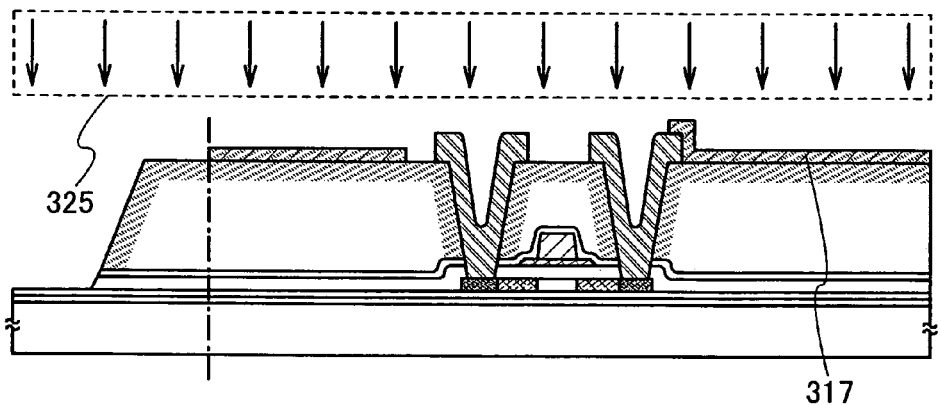

Next, a wiring 312 is formed, and then a first electrode 313 is formed so as to be connected to the wiring 312 (see FIG. 3C). In this embodiment mode, TiN, Al, and TiN are laminated so as to have a thickness of 100 nm, 350 nm, and 100 nm respectively, and patterned to make a desired shape, thereby forming the wiring 312. It is to be noted that TiN is one of the materials having excellent adhesiveness with the heat resistant planarized film.

This embodiment mode adopts a structure in which a light emitting element is used as a display element and light from the light emitting element is extracted from the first electrode side, therefore, the first electrode transmits light. A transparent conductive film is formed and etched to be a desired shape to form the first electrode 313. As the first electrode 313, a transparent conductive film such as ITO, IZO, ITSO, and indium oxide mixed with zinc oxide (ZnO) of 2 to 20% may be employed. In this embodiment mode, ITSO is used as the first electrode 313. Unlike ITO, ITSO is not crystallized even when baked and remains in the amorphous state. Accordingly, the planarity of ITSO is superior to that of ITO, and the first electrode using ITSO is not short-circuited to the cathode easily even when a layer containing an organic compound is thin. The first electrode 313 may be swabbed by a polyvinyl alcohol based porous body and polished by CMP so that the surface thereof may be planarized. In addition, after being polished by CMP, the surface of the first electrode 313 may be irradiated with UV rays or treated with oxygen plasma and the like.

In this embodiment mode, after forming the first electrode 313, the first electrode 313 and a part of the heat resistant planarized film 309 are doped with a gas 325 containing at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. In this embodiment mode, the gas 325 containing boron (B) as at least one element selected from the elements belonging to Group 13 or Group 15 in the periodic table is doped to form a doped region 317 (see FIG. 3D). According to the invention, in the doped region 317 in the first electrode 313, physical properties such as resistance are varied by the doped element having a conductivity. Thus, electrical properties of the electrode can be controlled according to the invention.

Then, an insulating layer 314 (referred to as a bank, a barrier or the like) is formed so as to cover the edge of the first electrode 313 and the wiring 312. As the insulating layer 314, an SOG film (for example, a $SiO_X$ film containing an alkyl group) is formed by an application method so as to have a thickness of 0.8 to 1 µm. Etching may be either dry etching or wet etching. Here, the insulating layer 314 is formed by dry etching using a mixed gas of $CF_4$, $O_2$ and He. The dry etching is performed under such conditions as 5 Pa of pressure, 1500 W, 25 sccm of $CF_4$, 25 sccm of $O_2$, and 50 sccm of He. In this dry etching step, the etching rate of the SiOx film containing an alkyl group is in the range of 500 to 600 nm/min whereas the etching rate of the ITSO film is 10 nm/min or less, thus, they can have sufficiently high etch selectivity. Further, since the wiring 312 is covered with the insulating layer 314 formed of the SiOx film containing an alkyl group, a TiN film having excellent adhesiveness is the outer surface. The insulating layer 314 may be formed of an insulating film that has a backbone structure obtained by binding silicon (Si) to oxygen (O) as well as a film including a single or more kinds of materials having high heat resistance and high planarization rate, such as an inorganic material (silicon oxide, silicon nitride, silicon oxynitride, silicon nitride oxide and the like), a photosensitive or non-photosensitive organic material (organic resin material) (polyimide, acryl, polyamide, polyimide amide, resist, benzocyclobutene and the like), and a Low k material as a low dielectric constant material. Alternatively, films including these materials may be laminated to be used as the insulating layer 314.

After forming the insulating layer 314, the insulating layer 314 is doped with at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. In this embodiment mode, a gas 335 containing B as at least one element selected from the elements belonging to Group 13 or Group 15 in the periodic table is doped to form a doped region 318 (see FIG. 4A). According to the invention, the doped region 318 in the heat resistant planarized film and the insulator is densified. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. At least one element selected from the elements belonging to Group 13 or Group 15 in the periodic table, which is included in the doped region, has a concentration of $1\times10^{18}$ to $5\times10^{21}/cm^3$, and typically $2\times10^{19}$ to $2\times10^{21}/cm^3$. It is to be noted that the tapered shape of the heat resistant planarized film at the peripheral edge portion of the substrate allows the side surface of the heat resistant planarized film to be doped easily.

When doping at least one element selected from the elements belonging to Group 13 or Group 15 in the periodic table, the doped region 318 in the insulating layer 314 functioning as a bank is colored in black. Accordingly, the bank can be used as a black matrix. Thus, according to the invention, the bank can function as a densified barrier against contamination as well as a black matrix with low light transmittance, low reflectivity, and improved optical properties. As a result, it is possible to provide an inexpensive display device with improved yield and reliability.

Shown in this embodiment mode is an example in which the insulating layer functioning as a bank is formed and patterned, and then the first electrode and the bank are doped with at least one element selected from the elements belonging to Group 13 or Group 15 in the periodic table. However, patterning may be performed after forming the insulator functioning as a bank and doping the whole surface thereof with at least one element selected from the elements belonging to Group 13 or Group 15 in the periodic table to be colored. In this case, the first electrode is not doped with at least one element selected from the elements belonging to Group 13 or Group 15 in the periodic table during the doping step, therefore, the concentration of an element, the area to be doped, and the like can be determined arbitrarily, which expands the design flexibility.

In order to improve reliability, it is preferable to perform vacuum heating before forming a light emitting layer 319 containing an organic compound, thereby performing degasification. For example, it is preferable to perform heat treatment at a temperature of 200 to 300° C. under a reduced pressure atmosphere or an inert atmosphere in order to remove gas contained in the substrate, before evaporating an organic compound material. Since the interlayer insulating film and the bank are herein formed of a SiOx film having high heat resistance, heat treatment at a high temperature can be carried out without any problem. Accordingly, heat treatment steps for improving reliability can be performed sufficiently.

The light emitting layer 319 is formed on the first electrode 313 (doped region 317). Specifically, the light emitting layer 319 may have a laminated structure of a hole injection layer formed of copper phthalocyanine (CuPc) with a thickness of 20 nm and a light emitting layer formed of tris-8-quinolinolato aluminum complex ($Alq_3$) with a thickness of 70 nm. Light emitting color can be controlled by adding to $Alq_3$ fluorescent pigment such as quinacridone, perylene, or DCM1.

However, the aforementioned material is one example of the organic light emitting materials used as a light emitting layer, and the invention is not limited to this at all. A light emitting layer (layer for transporting carriers to emit light) may be formed by appropriately combining a light emitting layer, an electron transporting layer or an electron injection layer.

Then, a second electrode 320 formed of a conductive film is provided on the light emitting layer 319. Since the first electrode functions as an anode whereas the second electrode functions as a cathode in this embodiment mode, the second electrode 320 may be formed of a material having a low work function (Al, Ag, Li, Ca, or an alloy of these elements such as MgAg, MgIn, AlLi, $CaF_2$, or CaN). This embodiment mode adopts a structure in which the second electrode 320 functions as a cathode and is light is extracted from the first electrode 313 side that functions as an anode. Therefore, the second electrode 320 is preferably formed by using a metal film (with a thickness of 50 to 200 nm) formed of Al, Ag, Li, Ca, or an alloy of these elements such as MgAg, MgIn, or AlLi. However, the invention is not limited to this structure, and it is also possible to adopt a structure in which an N-channel TFT is used as a TFT in a pixel portion, and the first electrode 313 functions as a cathode whereas the second electrode 320 functions as an anode.

It is effective to provide a passivation film 321 so as to cover the second electrode 320. Used as the passivation film 321 is a single layer or a laminated layer of an insulating film formed of silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), or a carbon film containing nitrogen (CN). It is also possible to use a material that has a backbone structure obtained by binding silicon (Si) to oxygen (O) and has at least a hydrogen substituent, or a material that has one or more substituents selected from fluorine, an alkyl group, and aromatic hydrocarbon.

Figure 4A:
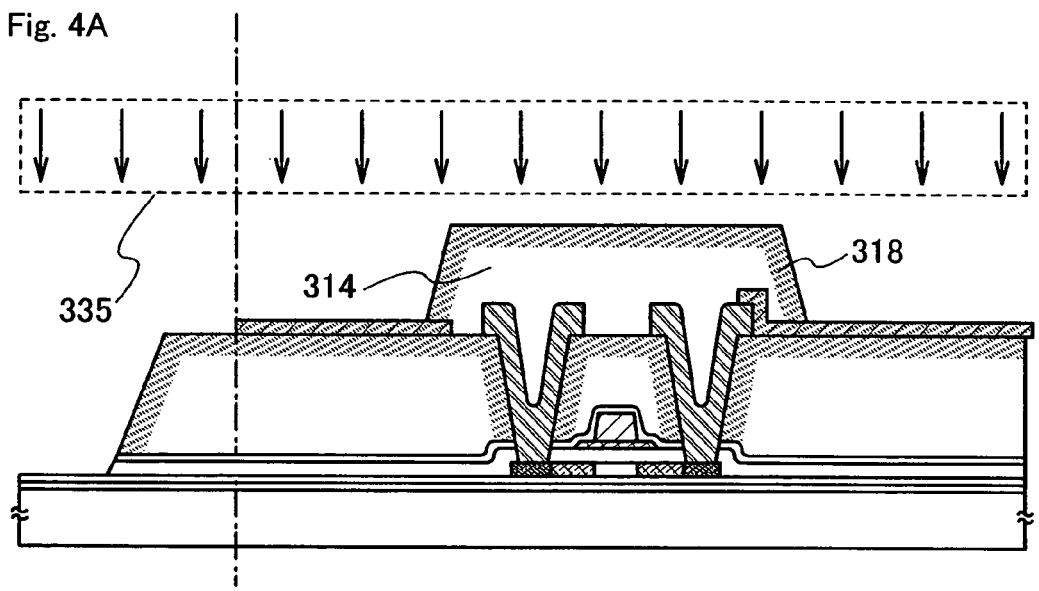
FIGS. 4A and 4B are diagrams showing a configuration of the invention.
Figure 4B:
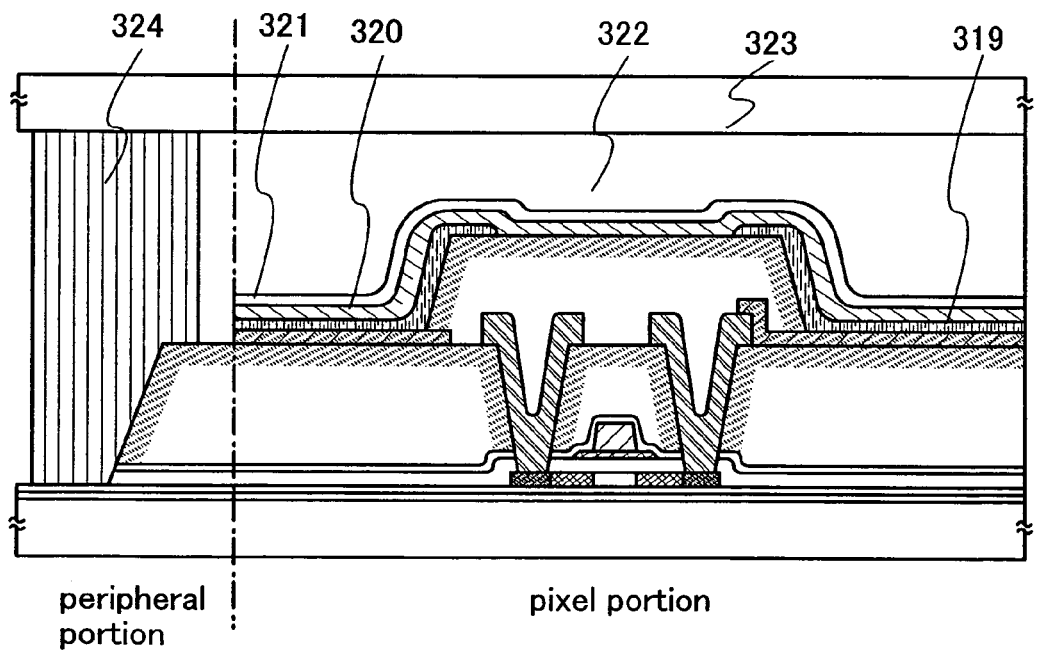

Subsequently, a sealing substrate 323 is attached with a sealing member 324 to seal the light emitting element. The sealing substrate 323 is attached so that the sealing member 324 may cover the edge of the heat resistant planarized film 309 (doped region 316). The sealing member 324 prevents moisture from entering, thus degradation of the light emitting element can be prevented and reliability of a display device is improved. Note that a region surrounded by the sealing member 324 is filled with a filler 322 (see FIG. 4B). In this embodiment mode, light is extracted from the first electrode 313 side, therefore, the filler 322 is not required to transmit light. However, in the case of light being extracted through the filler 322, the filler 322 is required to transmit light. Here, a high heat resistant UV epoxy resin (product name: 2500 Clear, manufactured by Electrolite Corporation) is used, which has a refractive index of 1.50, a viscosity of 500 cps, a Shore D hardness of 90, a tensile strength of is 3000 psi, a Tg point of 150° C., a volume resistivity of $1 \times 10^{15}$ Ω·cm, and a withstand voltage of 450 V/mil. In addition, total transmittance can be improved by filling a region between a pair of substrates with the filler 322.

In a display device manufactured in this manner, the heat resistant planarized film 309, typically an interlayer insulating film of a TFT (used later as a base film of a light emitting element), which has a backbone structure obtained by binding silicon (Si) to oxygen (O), and the insulating layer (bank) 314 have an edge or an opening portion having a tapered shape. In addition, the heat resistant planarized film 309 and the insulator (bank) 314 are doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode 313 is doped with at least one element selected from the elements belonging to Group 13 or Group 15 in the periodic table, physical properties such as resistance can be controlled.

Figure 5:
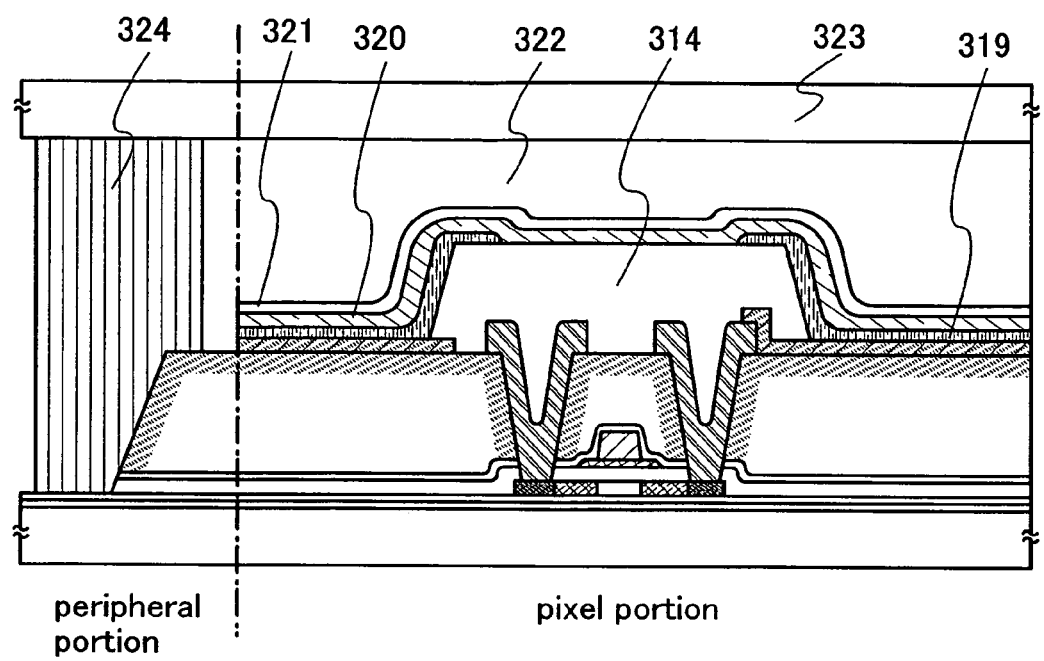
FIG. 5 is a diagram showing a configuration of the invention.

FIG. 5 shows a case in which after the insulating layer (bank) 314 being formed, it is not doped with at least one element selected from the elements belonging to Group 13 or Group 15 in the periodic table. In that case, the insulating layer 314 used as a bank does not include the doped region 318. However, the heat resistant planarized film 309 includes the doped region 316 that is densified, thus moisture or the like can be prevented from entering. Accordingly, a display device with improved reliability can be provided.

Embodiment Mode 3

Embodiment Mode 3 is described in detail with reference to FIGS. 6A to 6D and FIG. 7.

In this embodiment mode, after forming the first electrode, a part of the heat resistant planarized film and the first electrode are doped with at least one element selected from the elements belonging to Group 13 or Group 15 in the periodic table.

As described in Embodiment Mode 1, base films 601a and 601b are formed on a substrate 600, and a semiconductor layer 602 including impurity regions 603 and 604 is formed thereon. Conductive layers 606 and 607 as gate electrodes are formed over the semiconductor layer 602 with a gate insulating film 605 interposed therebetween, and an insulating film 608 is formed as a passivation film. Then, a heat resistant planarized film 609 is formed as an interlayer film (see FIG. 6A). In this embodiment mode, the heat resistant planarized film 609 is formed of an insulating film that has a backbone structure obtained by binding silicon (Si) to oxygen (O).

Figure 6A:
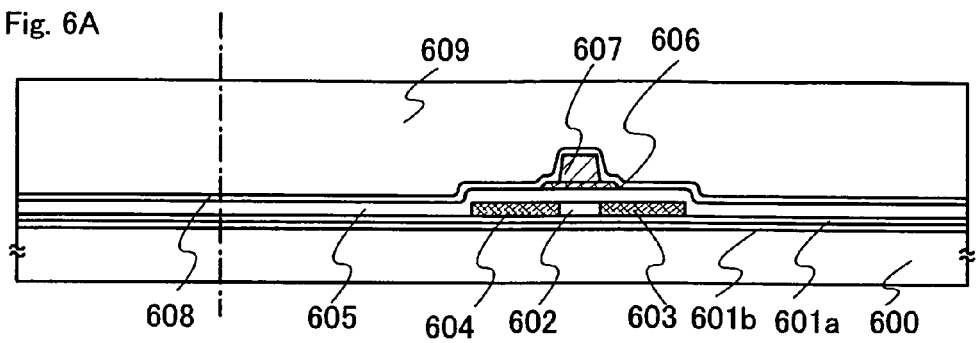
FIGS. 6A to 6D are diagrams showing a configuration of the invention.
Figure 6B:
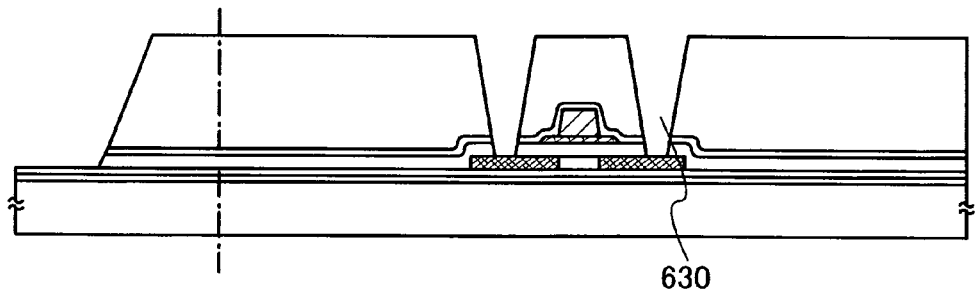

A contact hole (opening portion) 630 is formed in the heat resistant planarized film 609 by using a mask formed of a resist, and the heat resistant planarized film 609 at the peripheral edge portion of the substrate is removed at the same time (see FIG. 6B).

Figure 6C:
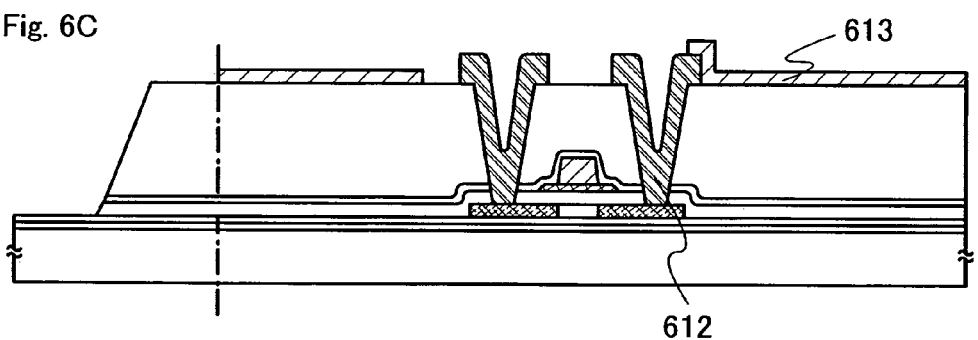
Figure 6D:
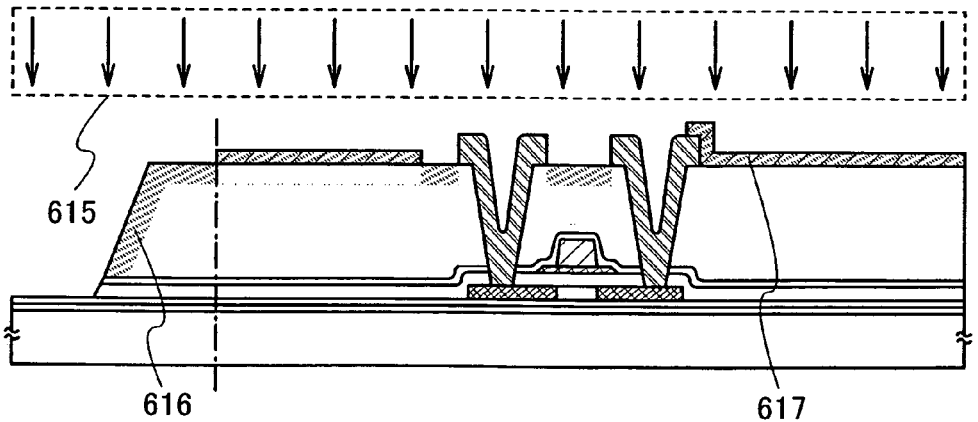

Subsequently, a wiring 612 is formed, and a first electrode 613 is formed so as to be connected to the wiring 612 (see FIG. 6C). In this embodiment mode, TiN, Al, and TiN are laminated so as to have a thickness of 100 nm, 350 nm, and 100 nm respectively, and patterned to make a desired shape, thereby forming the wiring 612. It is to be noted that TiN is one of the materials having excellent adhesiveness with the heat resistant planarized film.

This embodiment mode adopts a structure in which a light emitting element is used as a display element and light from the light emitting element is extracted from the first electrode side, therefore, the first electrode transmits light. A transparent conductive film is formed and etched to be a desired shape to form the first electrode 613. As the first electrode 613, a transparent conductive film such as ITO, IZO, ITSO, and indium oxide mixed with zinc oxide (ZnO) of 2 to 20% may be employed. In this embodiment mode, ITSO is used as the first electrode 613. Unlike ITO, ITSO is not crystallized even when baked and remains in the amorphous state. Accordingly, the planarity of ITSO is superior to that of ITO, and the first electrode using ITSO is not short-circuited to the cathode easily even when a layer containing an organic compound is thin. The first electrode 613 may be swabbed by a polyvinyl alcohol based porous body and polished by CMP so that the surface thereof may be planarized. In addition, after being polished by CMP, the surface of the first electrode 613 may be irradiated with UV rays or treated with oxygen plasma and the like. These manufacturing steps are described in detail (materials, forming conditions and the like) in Embodiment Mode 1.

In this embodiment mode, after forming the first electrode 613, the first electrode 613 and a part of the heat resistant planarized film 609 are doped with a gas 615 containing at least one element selected from the elements belonging to Group 13 or Group 15 in the periodic table. As the elements belonging to Group 13 or Group 15 in the periodic table, B, Al, Ga, In, Ti, P, As, Sb, and Bi can be employed, and typically phosphorous (P) and boron (B) are employed. The doping may be carried out by an ion doping method, a plasma doping method, or an ion implantation method. In this embodiment mode, the gas 615 containing boron (B) as at least one element selected from the elements belonging to Group 13 or Group 15 in the periodic table is doped to form doped regions 616, 617 (see FIG. 6D). Further, a part of the heat resistant planarized film 609, which is not covered with the first electrode 613, is doped with at least one element selected from the elements belonging to Group 13 or Group 15 in the periodic table, and densified. Therefore, moisture, gas and the like are prevented from entering and contamination of a display device is prevented, leading to improved reliability of the display device. According to the invention, in the doped region 617 in the first electrode 613, physical properties such as resistance can be controlled.

Then, an insulating layer 614 (referred to as a bank, a barrier or the like) is formed so as to cover the edge of the first electrode 613 and the wiring 612. As the insulating layer 614, an SOG film (for example, a $SiO_X$ film containing an alkyl group) is formed by an application method so as to have a thickness of 0.8 to 1 μm. Etching may be either dry etching or wet etching. Here, the insulating layer 614 is formed by dry etching using a mixed gas of $CF_4$, $O_2$ and He. The dry etching is performed under such conditions as 5 Pa of pressure, 1500 W, 25 sccm of $CF_4$, 25 sccm of $O_2$, and 50 sccm of He. In this dry etching step, the etching rate of the SiOx film containing an alkyl group is in the range of 500 to 600 nm/min whereas the etching rate of the ITSO film is 10 nm/min or less, thus, they can have sufficiently high etch selectivity. Further, since the wiring 612 is covered with the insulating layer 614 formed of the SiOx film containing an alkyl group, a TiN film having excellent adhesiveness is the outer surface. The insulator 614 may be formed of an insulating film that has a backbone structure obtained by binding silicon (Si) to oxygen (O) as well as a film including a single or more kinds of materials having high heat resistance and high planarization rate, such as an inorganic material (silicon oxide, silicon nitride, silicon oxynitride, silicon nitride oxide and the like), a photosensitive or non-photosensitive organic material (organic resin material) (polyimide, acryl, polyamide, polyimide amide, resist, benzocyclobutene and the like), and a Low k material as a low dielectric constant material. Alternatively, films including these materials may be laminated to be used as the insulating layer 614.

Although not shown in this embodiment mode, the insulating layer 614 may be doped with at least one element selected from the elements belonging to Group 13 or Group 15 in the periodic table after the formation thereof. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. It is to be noted that the doping can be performed more easily when an edge portion has a tapered shape.

When doping at least one element selected from the elements belonging to Group 13 or Group 15 in the periodic table, the doped region 618 in the insulating layer 614 functioning as a bank is colored in black. Accordingly, the bank can be used as a black matrix.

Or, patterning may be performed after forming the insulator functioning as a bank and doping the whole surface thereof with at least one element selected from the elements belonging to Group 13 or Group 15 in the periodic table to be colored. In this case, the first electrode is not doped with at least one element selected from the elements belonging to Group 13 or Group 15 in the periodic table during the doping step, therefore, the concentration of an element, the area to be doped, and the like can be determined arbitrarily, which expands the design flexibility.

In order to improve reliability, it is preferable to perform vacuum heating before forming a light emitting layer 619 containing an organic compound, thereby performing degasification. For example, it is preferable to perform heat treatment at a temperature of 200 to 300° C. under a reduced pressure atmosphere or an inert atmosphere in order to remove gas contained in the substrate, before evaporating an organic compound material. Since the interlayer insulating film and the bank are herein formed of a SiOx film having high heat resistance, heat treatment at a high temperature can be carried out without any problem. Accordingly, heat treatment steps for improving reliability can be performed sufficiently.

The light emitting layer 619 is formed on the first electrode 613 (doped region 617). Specifically, the light emitting layer 619 may have a laminated structure of a hole injection layer formed of copper phthalocyanine (CuPc) with a thickness of 20 nm and a light emitting layer formed of tris-8-quinolinolato aluminum complex ($Alq_3$) with a thickness of 70 nm. Light emitting color can be controlled by adding to $Alq_3$ fluorescent pigment such as quinacridone, perylene, or DCM1.

However, the aforementioned material is one example of the organic light emitting materials used as a light emitting layer, and the invention is not limited to this at all. A light emitting layer (layer for transporting carriers to emit light) may be formed by appropriately combining a light emitting layer, an electron transporting layer or an electron injection layer.

Then, a second electrode 620 formed of a conductive film is provided on the light emitting layer 619. Since the first electrode functions as an anode whereas the second electrode functions as a cathode in this embodiment mode, the second electrode 620 may be formed of a material having a low work function (Al, Ag, Li, Ca, or an alloy of these elements such as MgAg, MgIn, AlLi, $CaF_2$, or CaN). This embodiment mode adopts a structure in which the second electrode 620 functions as a cathode and light is extracted from the first electrode 613 side that functions as an anode. Therefore, the second electrode 620 is preferably formed by using a metal film (with a thickness of 50 to 200 nm) formed of Al, Ag, Li, Ca, or an alloy of these elements such as MgAg, MgIn, or AlLi. However, the invention is not limited to this structure, and it is also possible to adopt a structure in which an N-channel TFT is used as a TFT in a pixel portion, and the first electrode 613 functions as a cathode whereas the second electrode 620 functions as an anode.

It is effective to provide a passivation film 621 so as to cover the second electrode 620. Used as the passivation film 621 is a single layer or a laminated layer of an insulating film formed of silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), or a carbon film containing nitrogen (CN). It is also possible to use a material that has a backbone structure obtained by binding silicon (Si) to oxygen (O) and has at least a hydrogen substituent, or a material that has one or more substituents selected from fluorine, an alkyl group, and aromatic hydrocarbon.

Figure 7:
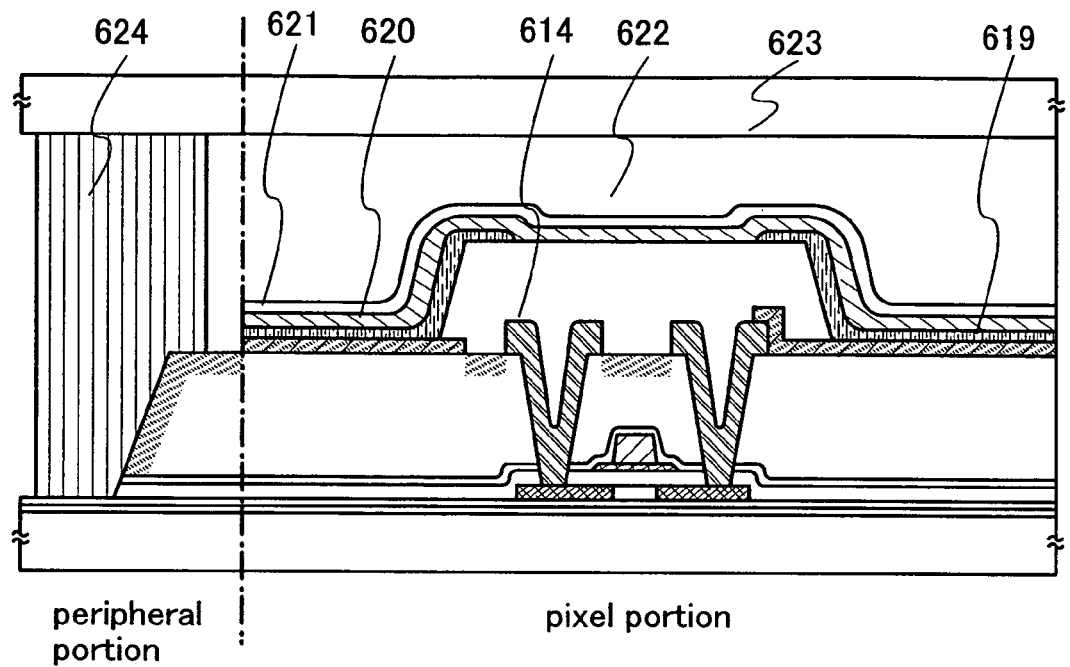
FIG. 7 is a diagram showing a configuration of the invention.

Subsequently, a sealing substrate 623 is attached with a sealing member 624 to seal the light emitting element (see FIG. 7). The sealing substrate 623 is attached so that the sealing member 624 may cover the edge of the heat resistant planarized film 609 (doped region 616). The sealing member 624 prevents moisture from entering, thus degradation of the light emitting element can be prevented and reliability of a display device is improved. Note that a region surrounded by the sealing member 624 is filled with a filler 622. In this embodiment mode, light is extracted from the first electrode 613 side, therefore, the filler 622 is not required to transmit light. However, in the case of light being extracted through the filler 622, the filler 622 is required to transmit light. Here, a high heat resistant UV epoxy resin (product name: 2500 Clear, manufactured by Electrolite Corporation) is used, which has a refractive index of 1.50, a viscosity of 500 cps, a Shore D hardness of 90, a tensile strength of 3000 psi, a Tg point of 150° C., a volume resistivity of $1 \times 10^{15}$ Ω·cm, and a withstand voltage of 450 V/mil. In addition, total transmittance can be improved by filling a region between a pair of substrates with the filler 622.

In a display device manufactured in this manner, the heat resistant planarized film 609 (typically an interlayer insulating film of a TFT and used later as a base film of a light emitting element), which has a backbone structure obtained by binding silicon (Si) to oxygen (O), has an opening portion or a tapered shape at a peripheral edge portion of the substrate. In addition, the heat resistant planarized film 609 is doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode 613 is doped with at least one element selected from the elements belonging to Group 13 or Group 15 in the periodic table, physical properties such as resistance can be controlled.

Embodiment Mode 4

Embodiment Mode 4 is described in detail with reference to FIGS. 9A to 9D and FIGS. 10E and 10F.

In this embodiment mode, the heat resistant planarized film and the bank (insulating layer) are formed, and then doped with at least one element selected from the elements belonging to Group 13 or Group 15 in the periodic table.

As described in Embodiment Mode 1, base films 901a and 901b are formed on a substrate 900, and a semiconductor layer 902 including impurity regions 903 and 904 is formed thereon. Conductive layers 906 and 907 as gate electrodes are formed over the semiconductor layer 902 with a gate insulating film 905 interposed therebetween, and an insulating film 908 is formed as a passivation film. Then, a heat resistant planarized film 909 is formed as an interlayer film (see FIG. 9A). In this embodiment mode, the heat resistant planarized film 909 is formed of an insulating film that has a backbone structure obtained by binding silicon (Si) to oxygen (O).

A contact hole (opening portion) 930 is formed in the heat resistant planarized film 909 by using a mask formed of a resist, and the heat resistant planarized film 909 at the peripheral edge portion of the substrate is removed at the same time. Then, the heat resistant planarized film 909 is doped with a gas 915 containing at least one element selected from the elements belonging to Group 13 or Group 15 in the periodic table to form a doped region 916 (see FIG. 9B).

The doping may be performed by an ion doping method, a plasma doping method, or an ion implantation method. As the elements belonging to Group 13 or Group 15 in the periodic table, B, Al, Ga, In, Tl, P, As, Sb, and Bi can be employed, and typically phosphorous (P) and boron (B) are employed. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. At least one element selected from the elements belonging to Group 13 or Group 15 in the periodic table, which is included in the densified area (doped region 916), has a concentration of $1 \times 10^{18}$ to $5 \times 10^{21}/cm^3$, and typically $2 \times 10^{19}$ to $2 \times 10^{21}/cm^3$. It is to be noted that the tapered shape of the edge allows the side surface of the heat resistant planarized film 909 to be doped easily.

Figure 9A:
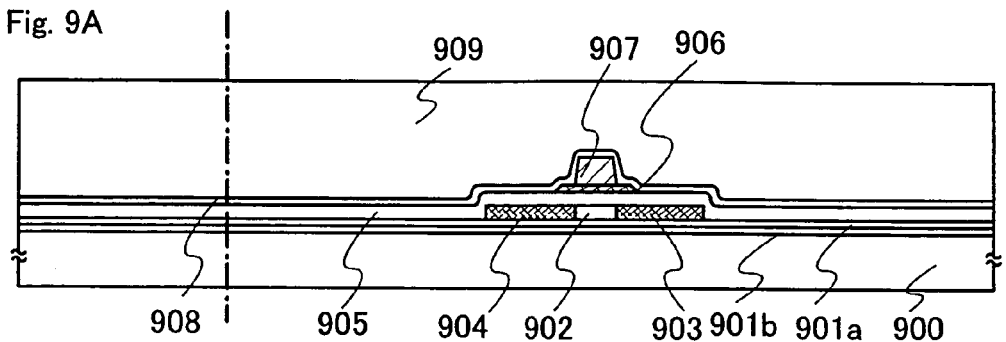
FIGS. 9A to 9D are diagrams showing a configuration of the invention.
Figure 9B:
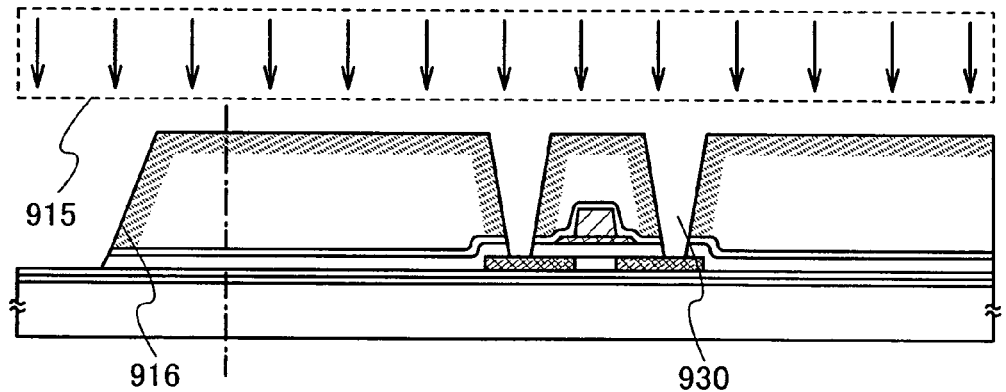
Figure 9C:
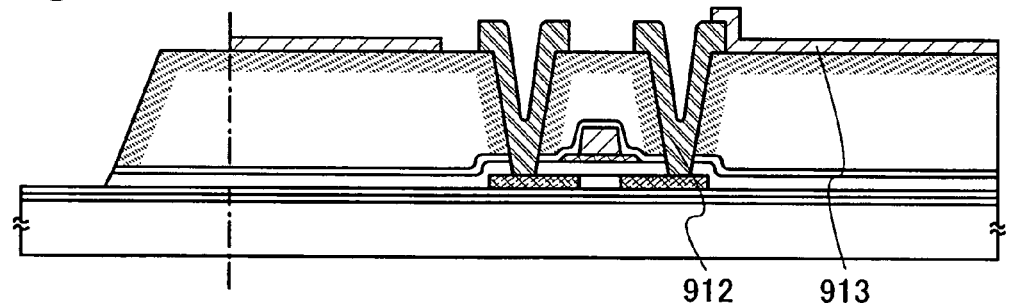

Subsequently, a wiring 912 is formed, and a first electrode 913 is formed so as to be connected to the wiring 912 (see FIG. 9C). In this embodiment mode, TiN, Al, and TiN are laminated so as to have a thickness of 100 nm, 350 nm, and 100 nm respectively, and patterned to make a desired shape, thereby forming the wiring 912. It is to be noted that TiN is one of the materials having excellent adhesiveness with the heat resistant planarized film.

This embodiment mode adopts a structure in which a light emitting element is used as a display element and light from the light emitting element is extracted from the first electrode side, therefore, the first electrode transmits light. A transparent conductive film is formed and etched to be a desired shape to form the first electrode 913. As the first electrode 913, a transparent conductive film such as ITO, IZO, ITSO, and indium oxide mixed with zinc oxide (ZnO) of 2 to 20% may be employed. In this embodiment mode, ITSO is used as the first electrode 913. Unlike ITO, ITSO is not crystallized even when baked and remains in the amorphous state. Accordingly, the planarity of ITSO is superior to that of ITO, and the first electrode using ITSO is not short-circuited to the cathode easily even when a layer containing an organic compound is thin. The first electrode 913 may be swabbed by a polyvinyl alcohol based porous body and polished by CMP so that the surface thereof may be planarized. In addition, after being polished by CMP, the surface of the first electrode 913 may be irradiated with UV rays or treated with oxygen plasma and the like. These manufacturing steps are described in detail (materials, forming conditions and the like) in Embodiment Modes 1 and 2.

Figure 9D:
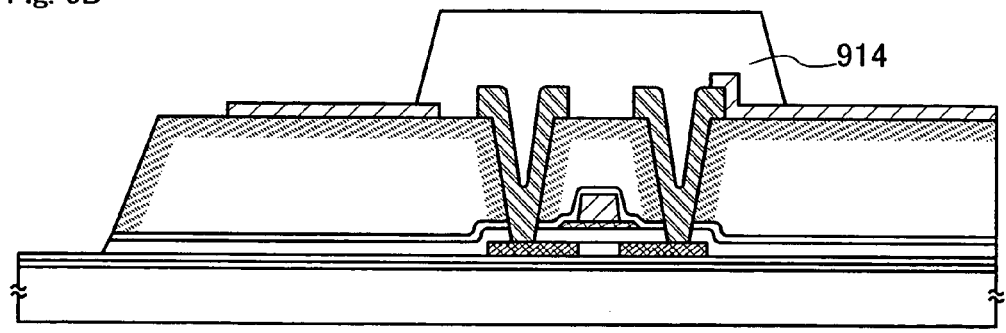

Then, an insulator 914 (referred to as a bank, a barrier or the like) is formed so as to cover the edge of the first electrode 913 and the wiring 912 (see FIG. 9D). As the insulator 914, an SOG film (for example, a $SiO_X$ film containing an alkyl group) is formed by an application method so as to have a thickness of 0.8 to 1 µm. Etching may be either dry etching or wet etching. Here, the insulating layer 914 is formed by dry etching using a mixed gas of $CF_4$, $O_2$ and He. The dry etching is performed under such conditions as 5 Pa of pressure, 1500 W, 25 sccm of $CF_4$, 25 sccm of $O_2$, and 50 sccm of He. In this dry etching step, the etching rate of the SiOx film containing an alkyl group is in the range of 500 to 600 nm/min whereas the etching rate of the ITSO film is 10 nm/min or less, thus, they can have sufficiently high etch selectivity. Further, since the wiring 912 is covered with the insulator 914 formed of the SiOx film containing an alkyl group, a TiN film having excellent adhesiveness is the outer surface. The insulator 914 may be formed of an insulating film that has a backbone structure obtained by binding silicon (Si) to oxygen (O) as well as a film including a single or more kinds of materials having high heat resistance and high planarization rate, such as an inorganic material (silicon oxide, silicon nitride, silicon oxynitride, silicon nitride oxide and the like), a photosensitive or non-photosensitive organic material (organic resin material) (polyimide, acryl, polyamide, polyimide amide, resist, benzocyclobutene and the like), and a Low k material as a low dielectric constant material. Alternatively, films including these materials may be laminated to be used as the insulator 914.

After forming the insulator 914, the first electrode 913 and the insulator 914 are doped with at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. In this embodiment mode, a gas 935 containing boron (B) as at least one element selected from the elements belonging to Group 13 or Group 15 in the periodic table is doped to form is doped regions 917 and 918 (see FIG. 10A). According to the invention, the doped regions 917 and 918 in the heat resistant planarized film and the insulator are densified. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. At least one element selected from the elements belonging to Group 13 or Group 15 in the periodic table, which is included in the doped regions, has a concentration of $1\times10^{18}$ to $5\times10^{21}/cm^3$, and typically $2\times10^{19}$ to $2\times10^{21}/cm^3$. It is to be noted that the tapered shape of the heat resistant planarized film allows the side surface to be doped easily. In addition, when the first electrode 913 is also doped with at least one element selected from the elements belonging to Group 13 or Group 15 in the periodic table, physical properties such as resistance can be controlled.

When doping at least one element selected from the elements belonging to Group 13 or Group 15 in the periodic table, the doped region 918 in the insulator 914 functioning as a bank is colored in black. Accordingly, the bank can be used as a black matrix. Thus, according to the invention, the bank can function as a densified barrier against contamination as well as a black matrix with low light transmittance, low reflectivity, and improved optical properties. As a result, it is possible to provide an inexpensive display device with improved yield and reliability.

Shown in this embodiment mode is an example in which the insulating layer functioning as a bank is formed and patterned, and then the first electrode and the bank are doped with at least one element selected from the elements belonging to Group 13 or Group 15 in the periodic table. However, patterning may be performed after forming the insulating layer functioning as a bank and doping the whole surface thereof with at least one element selected from the elements belonging to Group 13 or Group 15 in the periodic table to be colored. In this case, the first electrode is not doped with at least one element selected from the elements belonging to Group 13 or Group 15 in the periodic table during the doping step, therefore, the concentration of an element, the area to be doped, and the like can be determined arbitrarily, which expands the design flexibility.

In order to improve reliability, it is preferable to perform vacuum heating before forming a light emitting layer 919 containing an organic compound, thereby performing degasification. For example, it is preferable to perform heat treatment at a temperature of 200 to 300° C. under a reduced pressure atmosphere or an inert atmosphere in order to remove gas contained in the substrate, before evaporating an organic compound material. Since the interlayer insulating film and the bank are herein formed of a SiOx film having high heat resistance, heat treatment at a high temperature can be carried out without any problem. Accordingly, heat treatment steps for improving reliability can be performed sufficiently.

The light emitting layer 919 is formed on the first electrode 913 (doped region 917). Specifically, the light emitting layer 919 may have a laminated structure of a hole injection layer formed of copper phthalocyanine (CuPc) with a thickness of 20 nm and a light emitting layer formed of tris-8-quinolinolato aluminum complex ($Alq_3$) with a thickness of 70 nm. Light emitting color can be controlled by adding to $Alq_3$ fluorescent pigment such as quinacridone, perylene, or DCM1.

However, the aforementioned material is one example of the organic light emitting materials used as a light emitting layer, and the invention is not limited to this at all. A light emitting layer (layer for transporting carriers to emit light) may be formed by appropriately combining a light emitting layer, an electron transporting layer or an electron injection layer.

Then, a second electrode 920 formed of a conductive film is provided on the light emitting layer 919. Since the first electrode functions as an anode whereas the second electrode functions as a cathode in this embodiment mode, the second electrode 920 may be formed of a material having a low work function (Al, Ag, Li, Ca, or an alloy of these elements such as MgAg, MgIn, AlLi, CaF$_2$, or CaN). This embodiment mode adopts a structure in which the second electrode 920 functions as a cathode and light is extracted from the first electrode 913 side that functions as an anode. Therefore, the second electrode 920 is preferably formed by using a metal film (with a thickness of 50 to 200 nm) formed of Al, Ag, Li, Ca, or an alloy of these elements such as MgAg, MgIn, or AlLi. However, the invention is not limited to this structure, and it is also possible to adopt a structure in which an N-channel TFT is used as a TFT in a pixel portion, and the first electrode 913 functions as a cathode whereas the second electrode 920 functions as an anode.

It is effective to provide a passivation film 921 so as to cover the second electrode 920. Used as the passivation film 921 is a single layer or a laminated layer of an insulating film formed of silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), or a carbon film containing nitrogen (CN). It is also possible to use a material that has a backbone structure obtained by binding silicon (Si) to oxygen (O) and has at least a hydrogen substituent, or a material that has one or more substituents selected from fluorine, an alkyl group, and aromatic hydrocarbon.

Figure 10A:
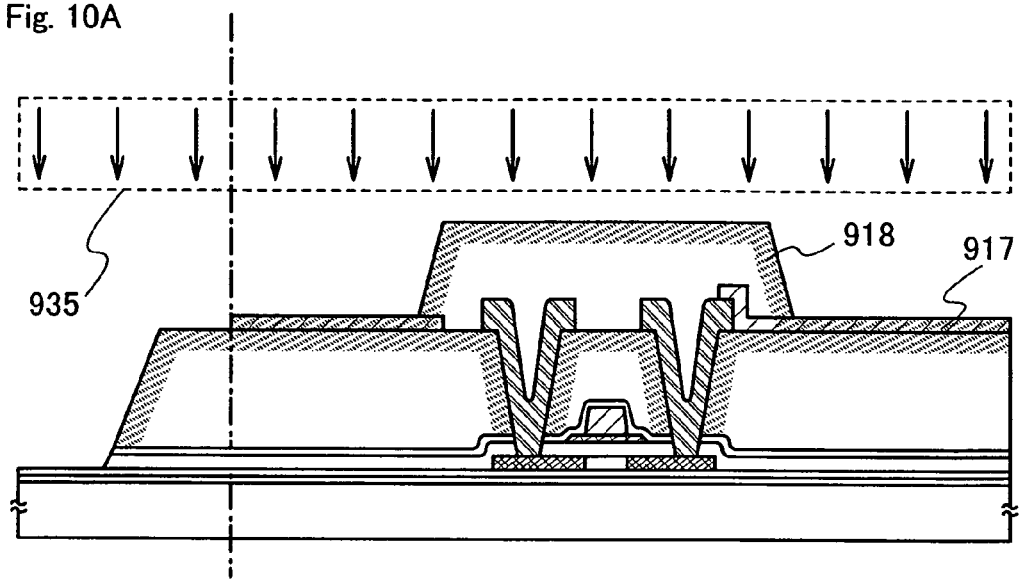
FIGS. 10A and 10B are diagrams showing a configuration of the invention.
Figure 10B:
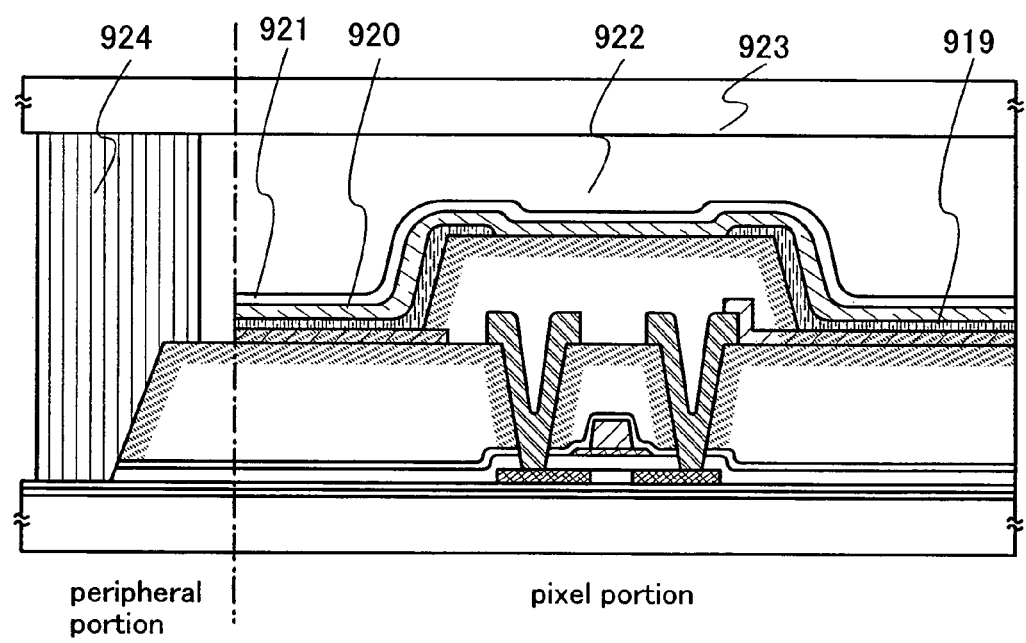

Subsequently, a sealing substrate 923 is attached with a sealing member 924 to seal the light emitting element. The sealing substrate 923 is attached so that the sealing member 924 may cover the edge of the heat resistant planarized film 909 (doped region 916). The sealing member 924 prevents moisture from entering, thus degradation of the light emitting element can be prevented and reliability of a display device is improved. Note that a region surrounded by the sealing member 924 is filled with a filler 922 (see FIG. 10B). In this embodiment mode, light is extracted from the first electrode 913 side, therefore, the filler 922 is not required to transmit light. However, in the case of light being extracted through the filler 922, the filler 922 is required to transmit light. Here, a high heat resistant UV epoxy resin (product name: 2500 Clear, manufactured by Electrolite Corporation) is used, which has a refractive index of 1.50, a viscosity of 500 cps, a Shore D hardness of 90, a tensile strength of 3000 psi, a Tg point of 150° C., a volume resistivity of $1\times10^{15}$ Ω·cm, and a withstand voltage of 450 V/mil. In addition, total transmittance can be improved by filling a region between a pair of substrates with the filler 922.

In a display device manufactured in this manner, the heat resistant planarized film 909 (typically an interlayer insulating film of a TFT and used later as a base film of a light emitting element), which has a backbone structure obtained by binding silicon (Si) to oxygen (O), and the insulating layer (bank) 914 have an edge or an opening portion having a tapered shape. In addition, the heat resistant planarized film 909 and the insulator 914 are doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode 913 is also doped with at least one element selected from the elements belonging to Group 13 or Group 15 in the periodic table, physical properties such as resistance can be controlled.

Embodiment Mode 5

In this embodiment mode, an example of a display device in which the first electrode and the wiring are connected in a different manner is described with reference to FIGS. 11A to 11D and FIGS. 12A and 12B.

As described in Embodiment Mode 1, base films 1101a and 1101b are formed on a substrate 1100, and a semiconductor layer 1102 including impurity regions 1103 and 1104 is formed thereon. Conductive layers 1106 and 1107 as gate electrodes are formed over the semiconductor layer 1102 with a gate insulating film 1105 interposed therebetween, and an insulating film 1108 is formed as a passivation film. Then, a heat resistant planarized film 1109 is formed as an interlayer insulating film (see FIG. 11A). These manufacturing steps are described in detail (materials, forming conditions and the like) in Embodiment Mode 1. In this embodiment mode, the heat resistant planarized film 1109 is formed of an insulating film that has a backbone structure obtained by binding silicon (Si) to oxygen (O).

Figure 11A:
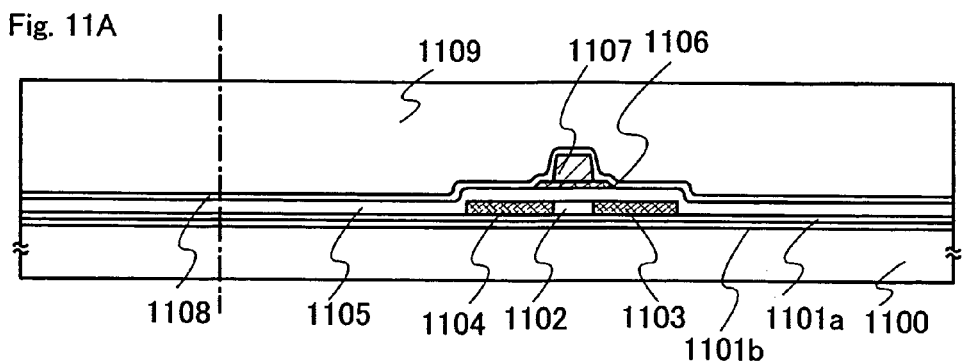
FIGS. 11A to 11D are diagrams showing a configuration of the invention.
Figure 11B:
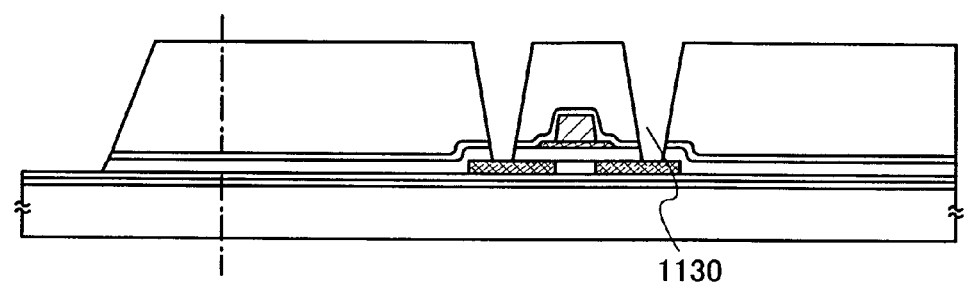
Figure 11C:
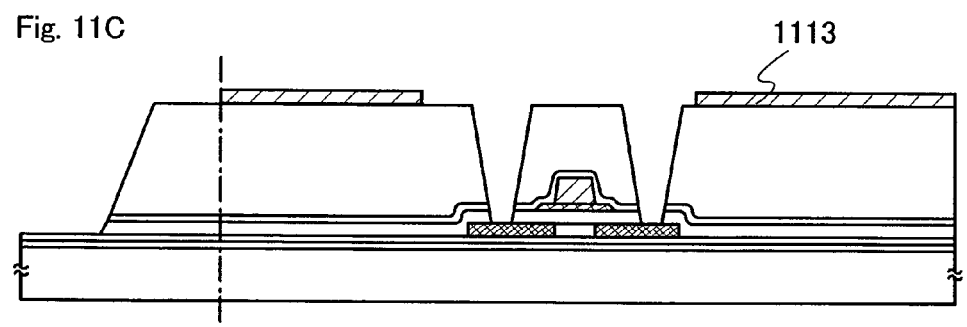
Figure 11D:
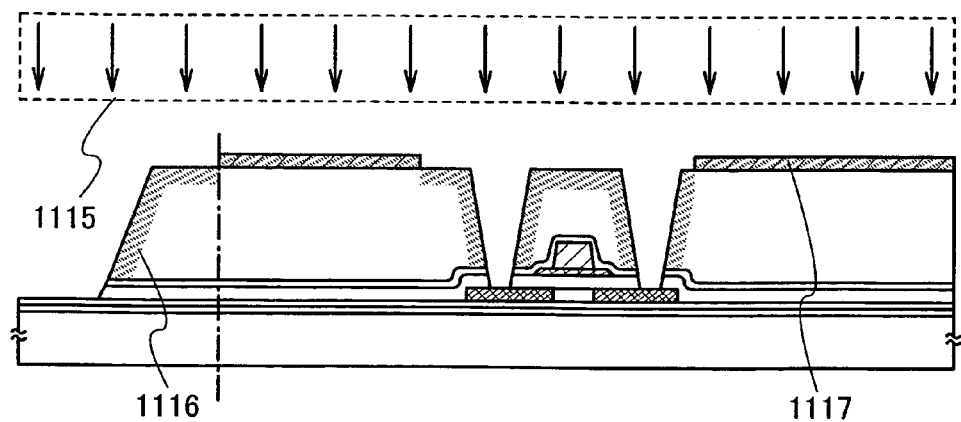

A contact hole (opening portion) 1130 is formed in the heat resistant planarized film 1109 by using a mask formed of a resist, and the heat resistant planarized film 1109 at the peripheral edge portion of the substrate is removed at the same time (see FIG. 11B). The heat resistant planarized film 1109 at the peripheral edge portion of the substrate may be etched so as to have a tapered shape as shown in FIGS. 11A to 11D.

Subsequently, a first electrode 1113 is selectively formed on the heat resistant planarized film 1109. This embodiment mode adopts a structure in which a light emitting element is used as a display element and light from the light emitting element is extracted from the first electrode side, therefore, the first electrode transmits light. A transparent conductive film is formed and etched to make a desired shape to form the first electrode 1113. As the first electrode 1113, a transparent conductive film such as ITO, IZO, ITSO, and indium oxide mixed with zinc oxide (ZnO) of 2 to 20% may be employed. In this embodiment mode, ITSO is used as the first electrode 1113. Unlike ITO, ITSO is not crystallized even when baked and remains in the amorphous state. Accordingly, the planarity of ITSO is superior to that of ITO, and the first electrode using ITSO is not short-circuited to the cathode easily even when a layer containing an organic compound is thin. The first electrode 1113 may be swabbed by a polyvinyl alcohol based porous body and polished by CMP so that the surface thereof may be planarized. In this embodiment mode, the first electrode can be formed without irregularity because it is formed on the heat resistant planarized film 1109 having the planarity. Moreover, treatment of the surface such as polishing can also be performed easily and sufficiently.

After forming the first electrode 1113, the first electrode 1113 and an edge of the heat resistant planarized film 1109 are doped with at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. In this embodiment mode, a gas 1115 containing B as at least one element selected from the elements belonging to Group 13 or Group 15 in the periodic table is doped to form doped regions 1116 and 1117 (see FIG. 11D). According to the invention, the edge of the heat resistant planarized film 1109 and the doped region 1116 at the periphery of the contact hole 1130 are densified. At least one element selected from the elements belonging to Group 13 or Group 15 in the periodic table, which are relatively large in atomic diameter, is doped to generate distortions and modify or densify the surface (including side walls), and thereby moisture and oxygen can be prevented from entering. At least one element selected from the elements belonging to Group 13 or Group 15 in the periodic table, which is included in the doped regions, has a concentration of $1\times10^{18}$ to $5\times10^{21}/cm^3$, and typically $2\times10^{19}$ to $2\times10^{21}/cm^3$. It is to be noted that the tapered shape of the heat resistant planarized film allows the side surface thereof to be doped easily. Moreover, when the first electrode 1113 is doped with at least one element selected from the elements belonging to Group 13 or Group 15 in the periodic table, physical properties such as resistance can be controlled.

Figure 12A:
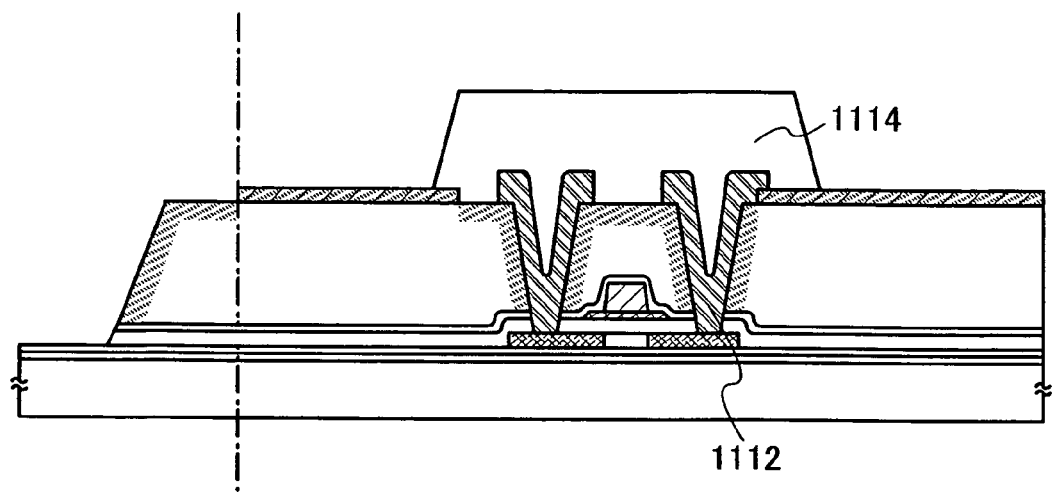
FIGS. 12A and 12B are diagrams showing a configuration of the invention.
Figure 12B:
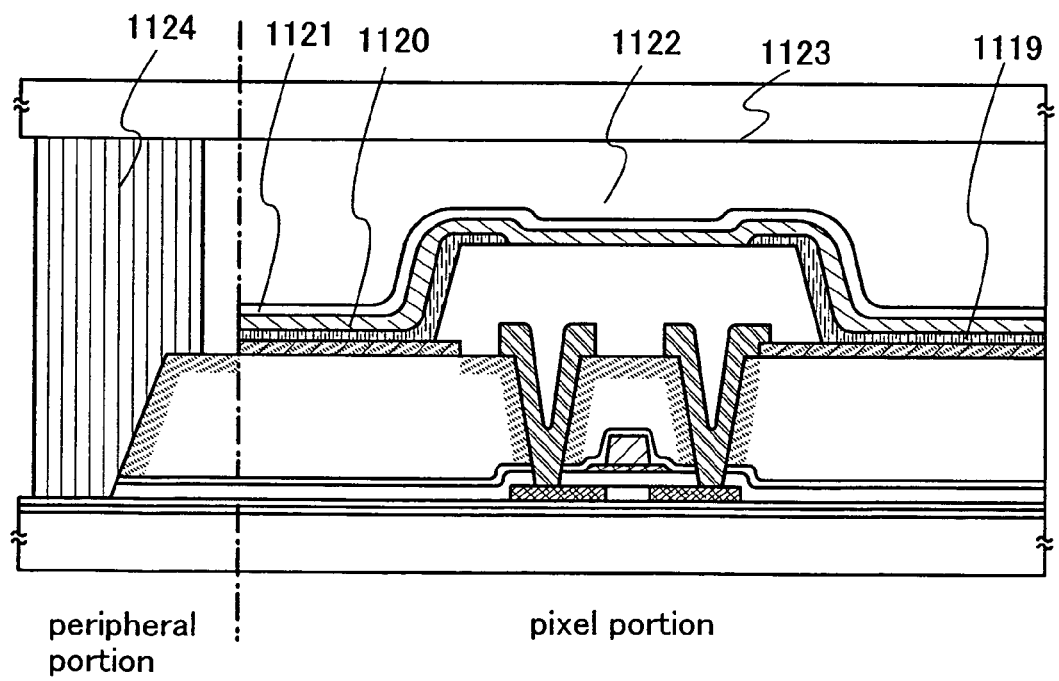

Subsequently, a wiring 1112 is formed so as to be connected to the first electrode 1113 (see FIG. 12A). In this embodiment mode, TiN, Al, and TiN are laminated so as to have a thickness of 100 nm, 350 nm, and 100 nm respectively, and patterned to make a desired shape, thereby forming the wiring 1112. It is to be noted that TiN is one of the materials having excellent adhesiveness with the heat resistant planarized film. Further, in this embodiment mode, the wring 1112 can be etched by using as an etching stopper the first electrode 1113 that has been formed previously. Accordingly, an etching stopper film is not required to be formed separately, thus, the number of manufacturing steps can be reduced.

Then, an insulating layer 1114 (referred to as a bank, a barrier or the like) is formed so as to cover the edge of the first electrode 1113 and the wiring 1112. As the insulating layer 1114, an SOG film (for example, a $SiO_X$ film containing an alkyl group) is formed by an application method so as to have a thickness of 0.8 to 1 µm. Etching may be either dry etching or wet etching. Here, the insulating layer 1114 is formed by dry etching using a mixed gas of $CF_4$, $O_2$ and He. The dry etching is performed under such conditions as 5 Pa of pressure, 1500 W, 25 sccm of $CF_4$, 25 sccm of $O_2$, and 50 sccm of He. In this dry etching step, the etching rate of the SiOx film containing an alkyl group is in the range of 500 to 600 nm/min whereas the etching rate of the ITSO film is 10 nm/min or less, thus, they can have sufficiently high etch selectivity. Further, since the wiring 1112 is covered with the insulator 1114 formed of the SiOx film containing an alkyl group, a TiN film having excellent adhesiveness is the outer surface. The insulating layer 1114 may be formed of an insulating film that has a backbone structure obtained by binding silicon (Si) to oxygen (O) as well as a film including a single or more kinds of materials having high heat resistance and high planarization rate, such as an inorganic material (silicon oxide, silicon nitride, silicon oxynitride, silicon nitride oxide and the like), a photosensitive or non-photosensitive organic material (organic resin material) (polyimide, acryl, polyamide, polyimide amide, resist, benzocyclobutene and the like), and a Low k material as a low dielectric constant material. Alternatively, films including these materials may be laminated to be used as the insulator 1114.

Although not shown in the, after forming the insulating layer 1114, the first electrode 1113 and the insulating layer 1114 may be doped with at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. The doped region of the insulator 1114 is densified by the doping step, and the surface (including side walls) is modified to prevent contamination such as moisture from entering.

In addition, by doping at least one element selected from the elements belonging to Group 13 or Group 15 in the periodic table, the doped region of the insulating layer 1114 functioning as a bank is colored in black. Therefore, the bank can also be used as a black matrix. Thus, according to the invention, the bank can function as a densified barrier against contamination as well as a black matrix with low light transmittance, low reflectivity, and improved optical properties. As a result, it is possible to provide an inexpensive display device with improved yield and reliability.

The first electrode and the bank may be doped with at least one element selected from the elements belonging to Group 13 or Group 15 in the periodic table, after they are formed and patterned. Alternatively, patterning may be performed after forming the insulating layer functioning as a bank and doping the whole surface thereof with at least one element selected from the elements belonging to Group 13 or Group 15 in the periodic table to be colored. In this case, the first electrode is not doped with at least one element selected from the elements belonging to Group 13 or Group 15 in the periodic table during the doping step, therefore, the concentration of an element, the area to be doped, and the like can be determined arbitrarily, which expands the design flexibility.

In order to improve reliability, it is preferable to perform vacuum heating before forming a light emitting layer 1119 (layer containing an organic compound), thereby performing degasification. For example, it is preferable to perform heat treatment at a temperature of 200 to 300° C. under a reduced pressure atmosphere or an inert atmosphere in order to remove gas contained in the substrate, before evaporating an organic compound material. Since the interlayer insulating film and the bank are herein formed of a SiOx film having high heat resistance, heat treatment at a high temperature can be carried out without any problem. Accordingly, heat treatment steps for improving reliability can be performed sufficiently.

The light emitting layer 1119 is formed on the first electrode 1113 (doped region 1117). Specifically, the light emitting layer 1119 may have a laminated structure of a hole injection layer formed of copper phthalocyanine (CuPc) with a thickness of 20 nm and a light emitting layer formed of tris-8-quinolinolato aluminum complex ($Alq_3$) with a thickness of 70 nm. Light emitting color can be controlled by adding to $Alq_3$ fluorescent pigment such as quinacridone, perylene, or DCM1.

However, the aforementioned material is one example of the organic light emitting materials used as a light emitting layer, and the invention is not limited to this at all. A light emitting layer (layer for transporting carriers to emit light) may be formed by appropriately combining a light emitting layer, an electron transporting layer or an electron injection layer.

Then, a second electrode 1120 formed of a conductive film is provided on the light emitting layer 1119. Since the first electrode functions as an anode whereas the second electrode functions as a cathode in this embodiment mode, the second electrode 1120 may be formed of a material having a low work function (Al, Ag, Li, Ca, or an alloy of these elements such as MgAg, MgIn, AlLi, CaF$_2$, or CaN). This embodiment mode adopts a structure in which the second electrode 1120 functions as a cathode and light is extracted from the first electrode 1113 side that functions as an anode. Therefore, the second electrode 1120 is preferably formed by using a metal film (with a thickness of 50 to 200 nm) formed of Al, Ag, Li, Ca, or an alloy of these elements such as MgAg, MgIn, or AlLi. However, the invention is not limited to this is structure, and it is also possible to adopt a structure in which an N-channel TFT is used as a TFT in a pixel portion, and the first electrode 1113 functions as a cathode whereas the second electrode 1120 functions as an anode.

It is effective to provide a passivation film 1121 so as to cover the second electrode 1120. Used as the passivation film 1121 is a single layer or a laminated layer of an insulating film formed of silicon nitride, silicon oxide, silicon oxynitride (SiON), silicon nitride oxide (SiNO), aluminum nitride (AlN), aluminum oxynitride (AlON), aluminum nitride oxide (AlNO) that contains more nitrogen than oxygen, aluminum oxide, diamond like carbon (DLC), or a carbon film containing nitrogen (CN). It is also possible to use a material that has a backbone structure obtained by binding silicon (Si) to oxygen (O) and has at least a hydrogen substituent, or a material that has one or more substituents selected from fluorine, an alkyl group, and aromatic hydrocarbon.

Subsequently, a sealing substrate 1123 is attached with a sealing member 1124 to seal the light emitting element. The sealing substrate 1123 is attached so that the sealing member 1124 may cover the edge of the heat resistant planarized film 1109 (doped region 1116) (see FIG. 12B). The sealing member 1124 prevents moisture from entering, thus degradation of the light emitting element can be prevented and reliability of a display device is improved. Note that a region surrounded by the sealing member 1124 is filled with a filler 1122. In this embodiment mode, light is extracted from the first electrode 1113 side, therefore, the filler 1122 is not required to transmit light. However, in the case of light being extracted through the filler 1122, the filler 1122 is required to transmit light. Here, a high heat resistant UV epoxy resin (product name: 2500 Clear, manufactured by Electrolite Corporation) is used, which has a refractive index of 1.50, a viscosity of 500 cps, a Shore D hardness of 90, a tensile strength of 3000 psi, a Tg point of 150° C., a volume resistivity of $1\times10^{15}$ Ω·cm, and a withstand voltage of 450 V/mil. In addition, total transmittance can be improved by filling a region between a pair of substrates with the filler 1122.

In a display device manufactured in this manner, the heat resistant planarized film 1109 (typically an interlayer insulating film of a TFT and used later as a base film of a light emitting element), which has a backbone structure obtained by binding silicon (Si) to oxygen (O), has an edge or an opening portion having a tapered shape. In addition, the heat resistant planarized film 1109 is doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode 1113 is also doped with at least one element selected from the elements belonging to Group 13 or Group 15 in the periodic table, physical properties such as resistance can be controlled and emission efficiency, luminance and the like can also be increased.

Embodiment 1

In this embodiment, manufacturing steps of the display device explained in Embodiment Modes 1 to 5 are described with reference to FIGS. 1A to 1D, FIGS. 2E and 2F, and FIG. 8.

On the substrate 100 formed of glass, a silicon oxynitride film with a thickness of 50 nm and a silicon oxynitride film with a thickness of 100 nm are formed by plasma CVD to be used as the base film 101.

Then, a semiconductor film is formed on the base film. In this embodiment, an amorphous silicon film with a thickness of 54 nm is formed by plasma CVD to be used as the semiconductor film. According to this embodiment, the amorphous silicon film is crystallized by laser irradiation to form a crystallized semiconductor layer. Before irradiating the amorphous silicon film with laser light, the amorphous silicon film is heated in a nitrogen atmosphere at a temperature of 500° C. for one hour so that hydrogen included in the film may be released to lower hydrogen concentration to $1\times10^{20}$ atoms/cm$^3$ or less.

Laser crystallization is a method for irradiating a semiconductor film with laser light. As for the laser, a solid-state laser, a gas laser, or a metal laser of pulse oscillation or continuous wave oscillation is preferably used. The solid-state laser includes a YAG laser, a YVO$_4$ laser, a YLF laser, a YAIO$_3$ laser, a glass laser, a ruby laser, an alexandrite laser, a Ti:sapphire laser and the like. The gas laser includes an excimer laser, an Ar laser, a Kr laser, a CO$_2$ laser and the like. The metal layer includes a helium cadmium laser.

The crystalline semiconductor film obtained in this manner is doped with a small amount of impurity element (boron or phosphorous) in order to control a threshold voltage of a TFT.

The semiconductor film is patterned by photolithography using the first photomask to form the semiconductor layer 102.

The gate insulating film 105 is formed so as to cover the semiconductor layer 102. In this embodiment, a silicon oxynitride film with a thickness of 115 nm is formed by plasma CVD to be used as the semiconductor layer 102.

Then, the first conductive film with a thickness of 20 to 100 nm and the second conductive film with a thickness of 100 to 400 nm are laminated in this order on the gate insulating film 105 to be used as a gate electrode. In this embodiment, a tantalum nitride with a thickness of 30 nm is formed on the gate insulating film 105 as the first conductive film, and a tungsten film with a thickness of 370 nm is formed thereon as the second conductive film.

The second photomask using a resist is formed by photolithography to perform a first etching step for obtaining an electrode and a wiring. The first conductive film and the second conductive film can be etched so as to have a tapered shape by ICP (Inductively Coupled Plasma) etching when etching conditions (amount of power applied to a coiled electrode, amount of power applied to an electrode on the substrate side, temperature of the electrode on the substrate side, and the like) are adjusted appropriately. As etching gas, chlorine gas typified by Cl$_2$, BCl$_3$, SiCl$_4$, CCl$_4$ or the like, or fluorinated gas typified by CF$_4$, SF$_6$, NF$_3$ or the like, can be employed appropriately as well as O$_2$.

Obtained by the first etching step is a conductive layer having a first shape, which includes a first conductive layer and a second conductive layer.

Then, a second etching step is performed without removing the mask using a resist. A W film is selectively etched herein. At this time, the second conductive layer is formed by the second etching step. On the other hand, the first conductive layer is hardly etched to form a conductive layer having a second shape. Accordingly, the conductive film 106 and the conductive film 107 are obtained. In this embodiment, the conductive layers are formed by dry etching.

After removing the resist mask, a resist mask as a third photomask is formed. Then, in order to form an N-channel TFT that is not shown in the drawing, a first doping step is performed to dope an impurity element that imparts an N-type conductivity (typically, phosphorous (P) or arsenic (As)) to a semiconductor at a low density. The resist mask covers an area to be used for a P-channel TFT and a periphery of the conductive layers. By the first doping step, through doping is performed through an insulating film to form a low density impurity region. One light emitting element is driven by a plurality of TFTs, however, in the case of the light emitting element being driven by P-channel TFTs only, the aforementioned doping step can be omitted.

After removing the resist mask, a resist mask as a fourth photomask is formed. Then, a second doping step is performed in order to dope an impurity element that imparts a P-type conductivity (typically, boron (B)) to a semiconductor at a high density. By the second doping step, through doping is performed through the gate insulating film 105 to form the high density impurity regions 103 and 104.

Subsequently, a resist mask as a fifth photomask is formed. Then, in order to form an N-channel TFT that is not shown in the drawing, a third doping step is performed to dope an impurity element that imparts an N-type conductivity (typically, P or As) to a semiconductor at a high density. The conditions of the third doping step are such that the dosage is in the range of $1 \times 10^{13}$ to $5 \times 10^{15}/cm^2$ and the accelerating voltage is in the range of 60 to 100 keV. The resist mask covers an area to be used for a P-channel TFT and a periphery of the conductive layers. By the third doping step, through doping is performed through the gate insulating film 105 to form an N-type high density impurity region.

In this manner, an impurity region is formed in each semiconductor layer.

After removing the resist mask, the insulating film 108 containing hydrogen is formed as a passivation film. In this embodiment, a silicon nitride film is formed by sputtering. The insulating film 108 may contain Ar, and in this embodiment, the concentration of Ar contained in the film is in the range of approximately $5 \times 10^{18}$ to $5 \times 10^{20}$ atoms/cm$^3$.

Furthermore, the semiconductor layer is hydrogenated. In this embodiment, a heat treatment is carried out in a nitrogen atmosphere at a temperature of 410° C. for one hour to hydrogenate the semiconductor layer.

Then, the heat resistant planarized film 109 is formed as an interlayer insulating film. As the heat resistant planarized film 109, an insulating film that has a is backbone structure obtained by binding silicon (Si) to oxygen (O) is formed by an application method.

Manufacturing steps of the heat resistant planarized film 109 are described in Embodiment Mode 1, and thus are omitted herein.

The heat resistant planarized film 109 is formed in this manner.

Figure 1B:
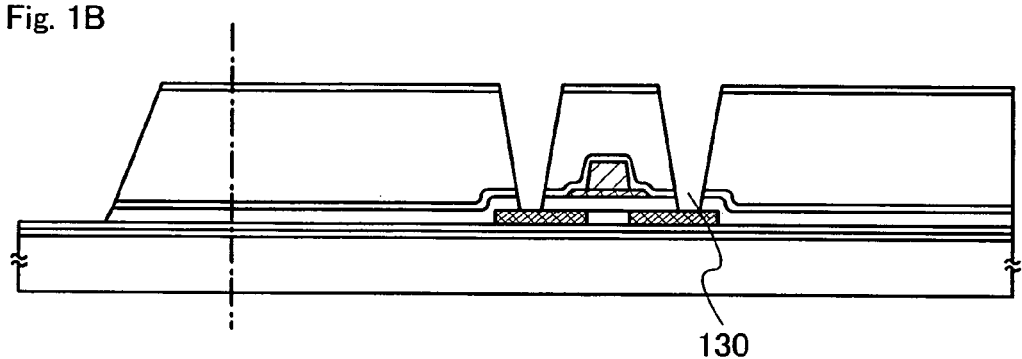

The insulating film 111 is formed as a passivation film (see FIG. 1A). In this embodiment, a silicon nitride oxide (SiNO) film is formed by plasma CVD so as to have a thickness of 100 nm. When patterning the wiring 112 (used as a drain electrode or a source electrode) in subsequent steps, the insulating film 111 can be used as an etching stopper film for protecting the heat resistant planarized film 109 that functions as an interlayer insulating film.

The heat resistant planarized film 109 at the peripheral edge portion of the substrate is removed simultaneously with the formation of the contact hole 130 in the heat resistant planarized film 109 with the use of a resist mask. Etching (wet etching or dry etching) is performed herein under the conditions that high etch selectivity is secured relative to the insulating film 105. In this embodiment, $CF_4$, $O_2$, He, and Ar are used. Dry etching is performed by setting the flow of $CF_4$ at 380 sccm; $O_2$, 290 sccm; He, 500 sccm; Ar, 500 sccm; RF power, 3000 W; and pressure, 25 Pa.

Note that, the etching time may be increased at the rate of approximately 10 to 20% for etching the gate insulating film 105 without leaving a residue on its surface. In addition, the tapered shape may be obtained by performing the second dry etching with the use of $CF_4$, $O_2$, and He by setting the flow of $CF_4$ at 550 sccm; $O_2$, 450 sccm; He, 350 sccm; RF power, 3000 W; and pressure, 25 Pa. A taper angle θ at the edge of the heat resistant planarized film 109 is desirably in the range between 30 to 75°.

The gate insulating film 105 is etched to form an opening portion that extends to a source region or a drain region. In this embodiment, the heat resistant planarized film 109 is etched, and then, the gate insulating film 105 is etched by using the etched heat resistant planarized film 109 as a mask to form the opening portion. $CHF_3$ and Ar are used as etching gas for etching the gate insulating film 105. It is to be noted that the etching time may be increased at the rate of approximately 10 to 20% for etching the gate insulating film 105 without leaving a residue on its surface. Through these manufacturing steps, the contact hole 130 is formed (see FIG. 1B).

Figure 1C:
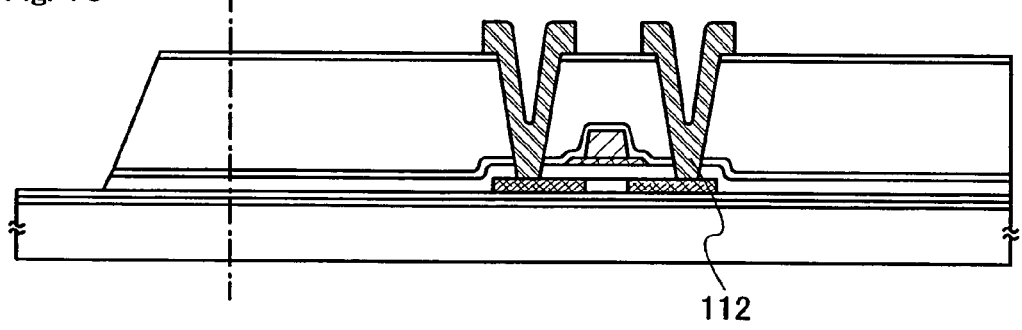

A metal film is formed and etched to form the wiring 112 electrically connected to each impurity region (see FIG. 1C). In this embodiment, TiN, Al, and TiN are laminated so as to have a thickness of 100 nm, 350 nm, and 100 nm respectively, and patterned to make a desired shape, thereby forming the wiring 112. It is to be noted that TiN is one of the materials having excellent adhesiveness with the heat resistant planarized film. Further, in order to be connected to the source region or the drain region of the TFT, TiN preferably contains N at a concentration of less than 44%.

Etching is carried out by ICP (Inductively Coupled Plasma) using $BCl_3$ and $Cl_2$. Etching conditions are such that the amount of power applied to a coiled electrode is 450 W; the amount of power applied to an electrode on the substrate side is 100 W; and pressure is 1.9 Pa.

Through the aforementioned steps, an active matrix substrate including a TFT is completed.

Subsequently, the first electrode (also called a pixel electrode) 113 is formed so as to be connected to the wiring 112.

Since this embodiment adopts a structure in which a light emitting element is used as a display element and light from the light emitting element is extracted from the first electrode 113 side, the first electrode 113 transmits light. In this embodiment, ITSO is used for the first electrode 113. The ITSO is formed by sputtering using as a target ITO that contains 2 to 10% of silicon oxide. The first electrode 113 may be swabbed by a polyvinyl alcohol based porous body and polished by CMP so that the surface thereof may be planarized.

Figure 1D:
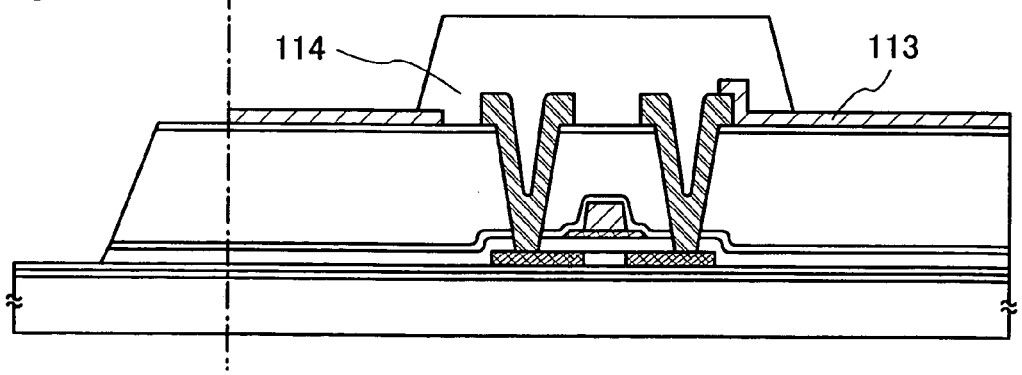

Then, the insulator 114 (referred to as a bank, a barrier or the like) is formed so as to cover the edge of the first electrode 113 and the wiring 112 (see FIG. 1D). As the insulator 114, an SOG film (for example, a $SiO_X$ film containing an alkyl group) is formed by an application method so as to have a thickness of 0.8 to 1 μm. The insulator 114 is formed by dry etching using a mixed gas of $CF_4$, $O_2$ and He. The dry etching is performed under such conditions as 5 Pa of pressure, 1500 W, 25 sccm of $CF_4$, 25 sccm of $O_2$, and 50 sccm of He. Since the wiring 112 is covered with the insulator 114 formed of the SiOx film containing an alkyl group, a TiN film having excellent adhesiveness is the outer surface.

According to the invention, the edge of the heat resistant planarized film 109, the first electrode 113, and the insulator 114 are doped with at least one element selected from the elements belonging to Group 13 or Group 15 in the periodic table. As the elements belonging to Group 13 or Group 15 in the periodic table, B, Al, Ga, In, Tl, P, As, Sb, and Bi can be employed, and typically phosphorous (P) and boron (B) are employed. The doping may be carried out by an ion doping method, a plasma doping method, or an ion implantation method. In this embodiment, the gas 125 containing P as at least one element selected from the elements belonging to Group 13 or Group 15 in the periodic table is doped to form the doped regions 116, 117, and 118 (see FIG. 2A). The doping may be carried out at an energy of 1 to 150 kV, and more preferably at an energy of 50 to 80 kV, and at a dosage of $1\times10^{14}/cm^2$ or more, and more preferably at a dosage of $1\times10^{15}$ to $1\times10^{16}/cm^2$. In this embodiment, the doping is performed at a dosage of $1\times10^{16}/cm^2$. In a case that phosphorous (P) is doped to the surface of the heat resistant planarized film or insulating layer, phosphorous exists up to about 5000 Å in the depth direction from the surface to which phosphorous is added. In a case that boron (B) is doped, boron exists up to about 8000 Å in the depth direction from the surface to which boron is added.

The amount of moisture in a silicon oxide (SiOx) film containing an alkyl group that is used for a heat resistant planarized film and a bank is measured by TDS (Thermal Desorption Spectroscopy) analysis. The TDS analysis is a spectroscopy for measurement of a gas molecule that is released from the sample at each temperature when heating the sample to be measured. Used as the sample is a film obtained by applying the invention to a sample formed by patterning a silicon oxide (SiOx) film containing an alkyl group with a resist and removing the resist with a resist stripper. As a comparative example, a film to which the invention is not applied is employed. The resist stripper used here contains as a composition 2-aminoethanol $HOC_2H_4NH_2$ (30 wt %) and glycol ether R—$(OCH_2)_2OH$ (70 wt %). The film to which the invention is applied is doped with P and B at a dosage of $1\times10^{16}/cm^2$ as at least one element selected from the elements belonging to Group 13 or Group 15 in the periodic table.

Figure 27:
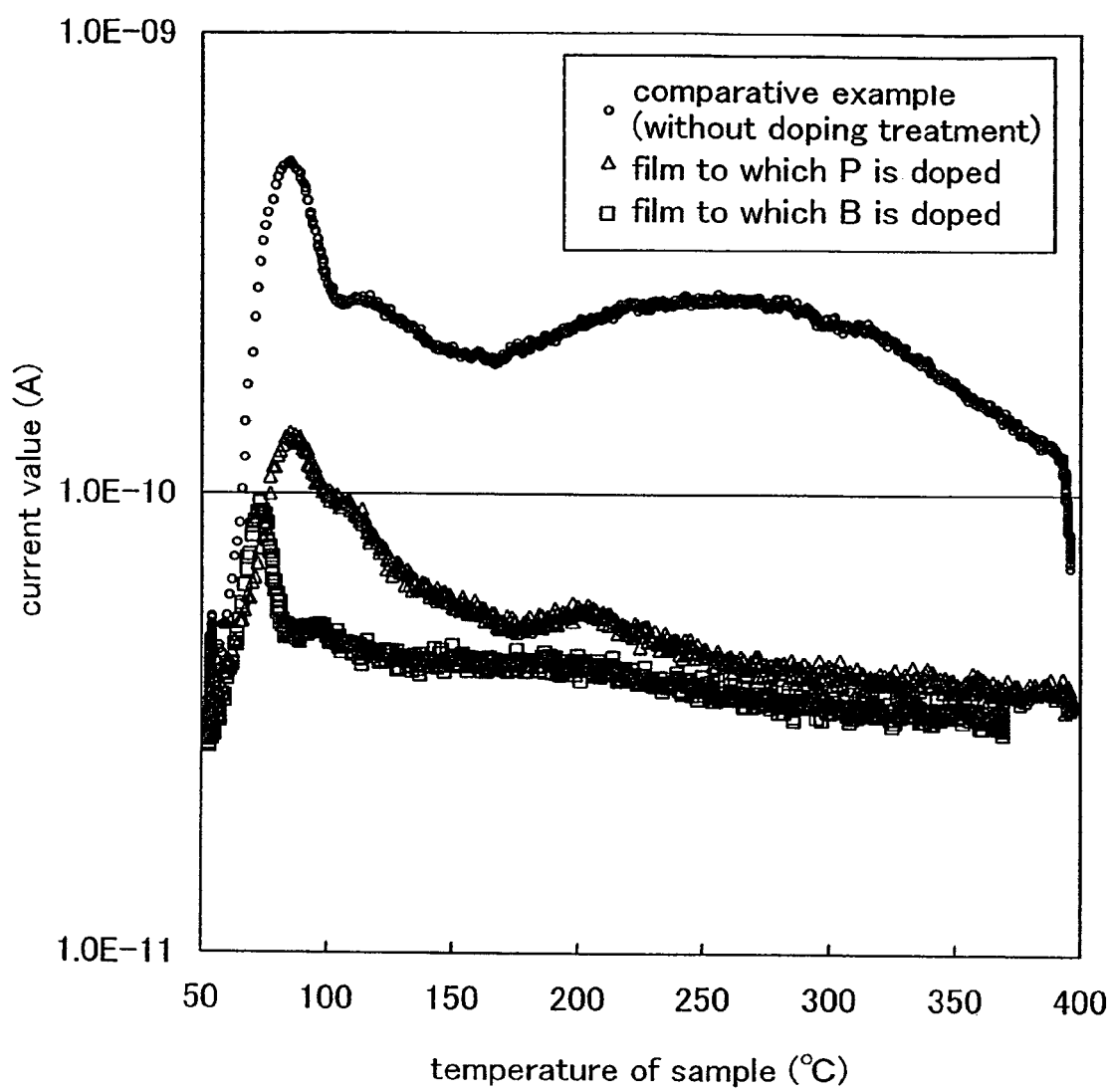
FIG. 27 is a graph showing results of TDS measurement.

The measurement result is shown in FIG. 27. White triangular dots mark the P-doped sample to which the invention is applied, white square dots mark the B-doped sample to which the invention is applied, and white circular dots mark the sample to which the invention is not applied as a comparative example. The amount of moisture is measured based on the increasing and decreasing current values. It is considered that the moisture detected at a temperature of about 80 to 100° C. is the one evaporated from within or the surface of the film, and the moisture detected at a temperature of about 250° C. is the one generated from within the film by thermal decomposition of the film. FIG. 27 shows that at a temperature of about 80 to 100° C. and 250° C., the amount of moisture is increased in the comparative example to which the invention is not applied, while it is decreased significantly in the film to which the invention is applied.

As another method for verifying the effect of densification of the film according to the invention, the amount of moisture included in the film is measured by secondary ion mass spectroscopy (SIMS). As samples, two silicon oxide (SiOx) films containing an alkyl group are formed and baked at a temperature of 270° C. for one hour, then, immersed in heavy water at a temperature of 65° C. for one hour One of the films to which the invention is applied is measured as well as the other film to which the invention is not applied as a comparative example. The film to which the invention is applied is doped with P at a dosage of $1\times10^{16}/cm^2$ after it being baked.

Figure 28:
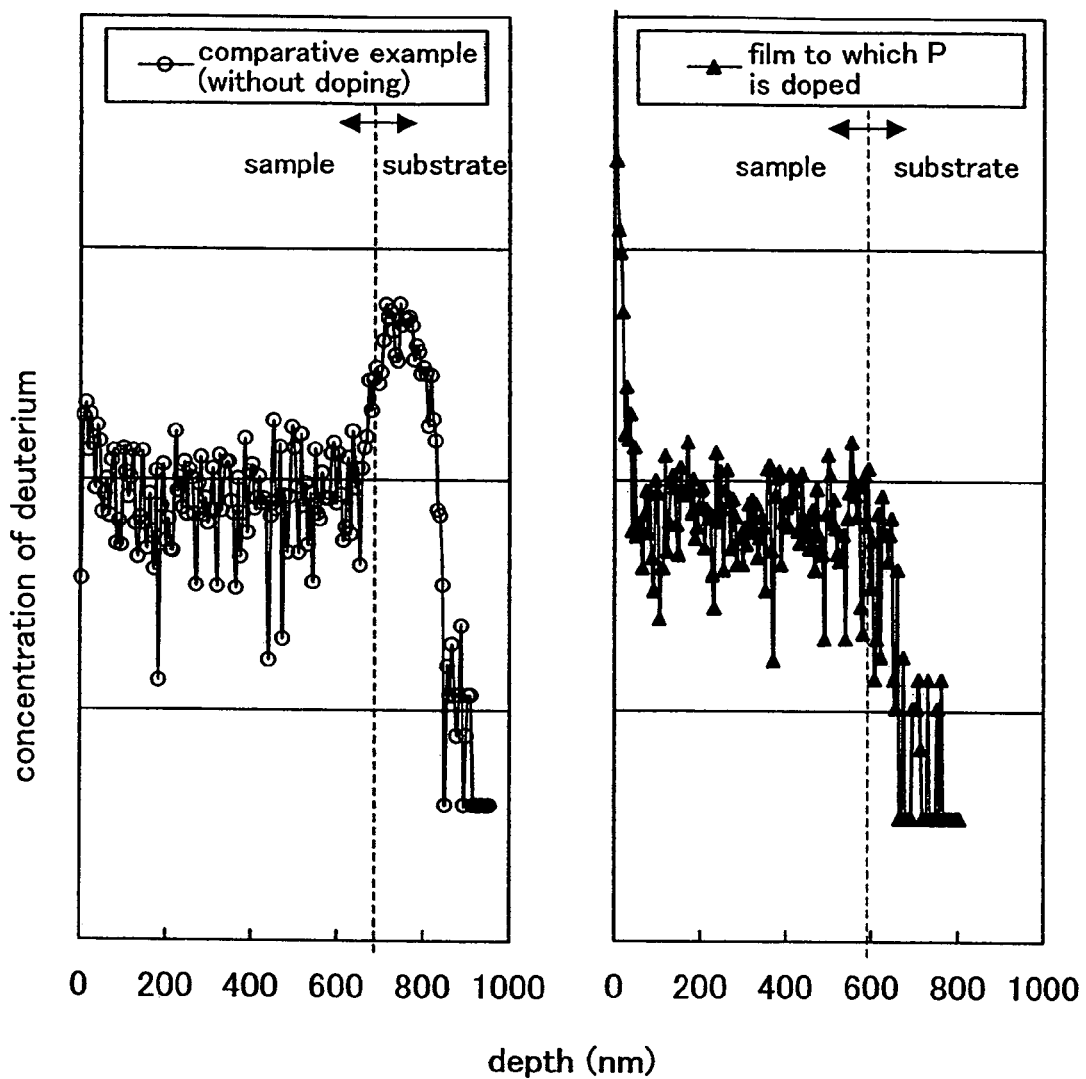
FIG. 28 is a graph showing results of SIMS measurement.

The measurement result is shown in FIG. 28. The abscissa represents the depth from the sample surface, and the left side represents the film as the sample whereas the right side represents the substrate. A dotted line at the vicinity of 630 nm depth is a boundary between the film as the sample and a substrate. Note that the substrate is formed of glass. Black circular dots mark the sample to which the invention is applied while white circular dots mark the sample to which the invention is not applied as a comparative example. The film to which the invention is not applied as a comparative example has a peak of deuterium at the vicinity of 700 nm depth in a substrate area. That is, heavy water penetrates into the film as a comparative example and deuterium extends to the boundary between the substrate and the film. On the other hand, deuterium is not detected in the boundary in the sample to which the invention is applied, which shows that heavy water does not penetrate into the film to which the invention is applied.

The aforementioned measurement results verify that the film to which the invention is applied is densified and improved in quality when doped with P or B. The film to which the invention is applied has a low water permeability and can prevent moisture or the like from entering. Thus, according to the invention, degradation of a display element can be prevented, leading to further improved reliability of a display device.

Furthermore, the sheet resistance of the first electrode is measured in order to check changes in electrical properties of the first electrode according to the invention. Two ITSO films are used as samples, and the invention is applied to one of the films but not applied to the other film. The film to which the invention is applied is doped with P at a voltage of 50 kV and B at a voltage of 80 kV, each of which corresponds to at least one element selected form the elements belonging to Group 13 or Group 15 in the periodic table.

Figure 24:
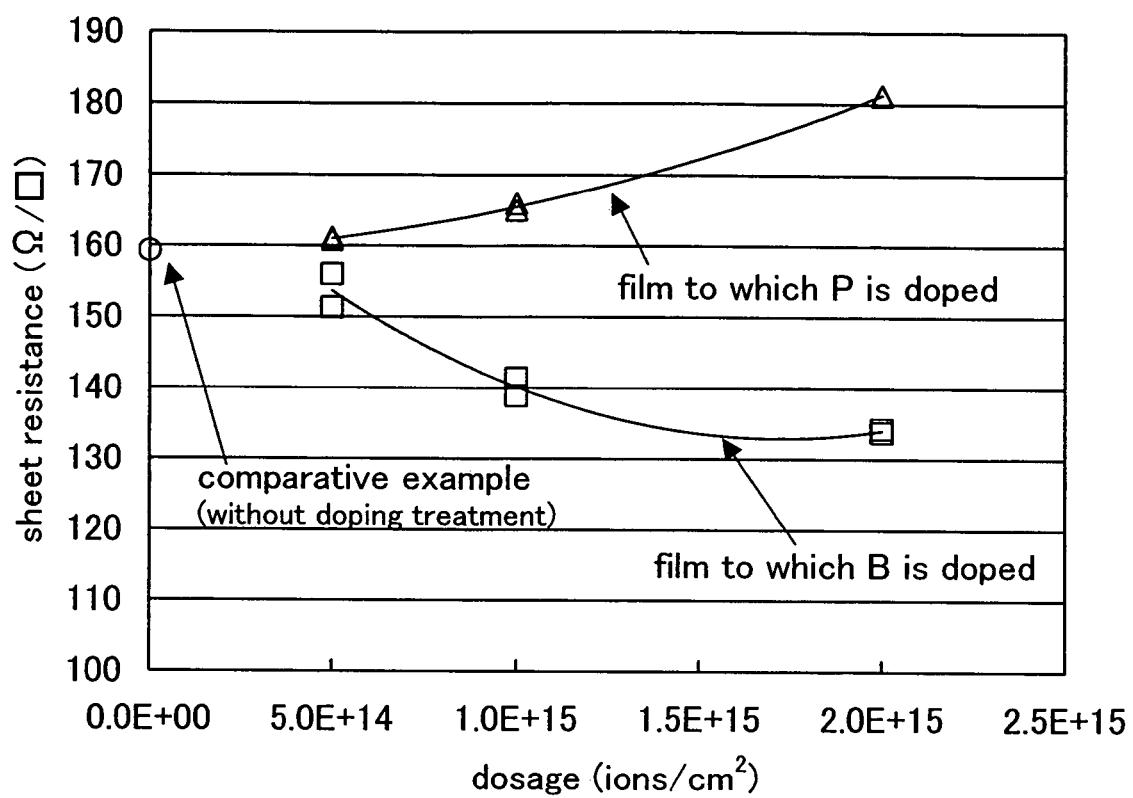
FIG. 24 is a graph showing electrical properties.

The measurement result is shown in FIG. 24. White triangular dots mark the P-doped sample to which the invention is applied, white square dots mark the B-doped sample to which the invention is applied, and white circular dots mark the sample to which the invention is not applied as a comparative example. The film doped with at least one element selected from the elements belonging to Group 13 or Group 15 in the periodic table changes in sheet resistance as compared to the film that is not doped with at least one element selected from the elements belonging to Group 13 or Group 15 in the periodic table. In both the films doped with P and B, relative to the comparative example, variation in sheet resistance is increased as the dosage in doping is increased.

The aforementioned measurement result verifies that the first electrode changes in electrical properties when doped with an element having a conductivity. Thus, according to the invention, electrical properties of an electrode can be controlled to manufacture a display device having increased emission efficiency and luminance.

According to the invention, the doped regions 116 and 118 in the heat resistant planarized film and the insulator are densified. In addition, electrical properties such as resistance can be controlled in the doped region 117 in the first electrode. At least one element selected from the elements belonging to Group 13 or Group 15 in the periodic table, which are relatively large in atomic diameter, is doped in order to generate distortions and modify or densify the surface (including side walls), thereby preventing moisture and oxygen from entering. In addition, the baking effect of the doping itself allows moisture to be released during the treatment. At least one element selected from the elements belonging to Group 13 or Group 15 in the periodic table, which is included in the doped regions, has a concentration of $1 \times 10^{18}$ to $5 \times 10^{21}/cm^3$, and typically $2 \times 10^{19}$ to $2 \times 10^{21}/cm^3$. It is to be noted that the tapered shape of the edge allows the side surface to be doped easily.

In this embodiment, in order to improve reliability, vacuum heating is performed before forming the light emitting layer 119 containing an organic compound, thereby performing degasification. Heat treatment is performed at a temperature of 200 to 300° C. under a reduced pressure atmosphere or an inert atmosphere in order to remove gas contained in the substrate, before evaporating an organic compound material. Since the interlayer insulating film and the bank are formed of a SiOx film having high heat resistance in this embodiment, heat treatment at a high temperature can be carried out without any problem. Accordingly, heat treatment steps for improving reliability can be performed sufficiently.

The light emitting layer 119 is formed on the first electrode 113 (doped region 117). Since the first electrode 113 functions as an anode in this embodiment, the light emitting layer 119 has a laminated structure of a hole injection layer formed of copper phthalocyanine (CuPc) with a thickness of 20 nm and a light emitting layer formed of tris-8-quinolinolato aluminum complex ($Alq_3$) with a thickness of 70 nm. Light emitting color can be controlled by adding to $Alq_3$ fluorescent pigment such as quinacridone, perylene, or DCM1.

Subsequently, the second electrode 120 formed of a conductive film is provided on the light emitting layer 119. Since the first electrode functions as an anode whereas the second electrode functions as a cathode in this embodiment, the second electrode 120 may be formed of a material having a low work function (Al, Ag, Li, Ca, or an alloy of these elements such as MgAg, MgIn, AlLi, $CaF_2$, or CaN). This embodiment adopts a structure in which the second electrode 120 functions as a cathode and light is extracted from the first electrode 113 side that functions as an anode. Therefore, the second electrode 120 is preferably formed by using a metal film (with a thickness of 50 to 200 nm) formed of Al, Ag, Li, Ca, or an alloy of these elements such as MgAg, MgIn, or AlLi.

In this embodiment, the passivation film 121 is provided so as to cover the second electrode 120. According to this embodiment, a silicon nitride film is formed by using a disk-shaped target formed of silicon in a deposition chamber including a nitrogen atmosphere or a nitrogen and argon atmosphere.

Then, the sealing substrate 123 is attached with the sealing member 124 to seal the light emitting element. The sealing substrate 123 is attached so that the sealing member 124 may cover the edge of the heat resistant planarized film 109 (doped region 116 densified by doping). The sealing member 124 prevents moisture from entering, thus degradation of the light emitting element can be prevented and reliability of a display device is improved. Note that a region surrounded by the sealing member 124 is filled with the filler 122 (see FIG. 2B). In this embodiment, light is extracted from the first electrode 113 side, therefore, the filler 122 is not required to transmit light. However, in the case of light being extracted through the filler 122, the filler 122 is required to transmit light. Typically, a visible light curable epoxy resin, a UV curable epoxy resin, or a heat curable epoxy resin may be used. Here, a high heat resistant UV epoxy resin (product name: 2500 Clear, manufactured by Electrolite Corporation) is used, which has a refractive index of 1.50, a viscosity of 500 cps, a Shore D hardness of 90, a tensile strength of 3000 psi, a Tg point of 150° C., a volume resistivity of $1 \times 10^{15}$ Ω·cm, and a withstand voltage of 450 V/mil. In addition, total transmittance can be improved by filling a region between a pair of substrates with the filler 122.

Figure 8:
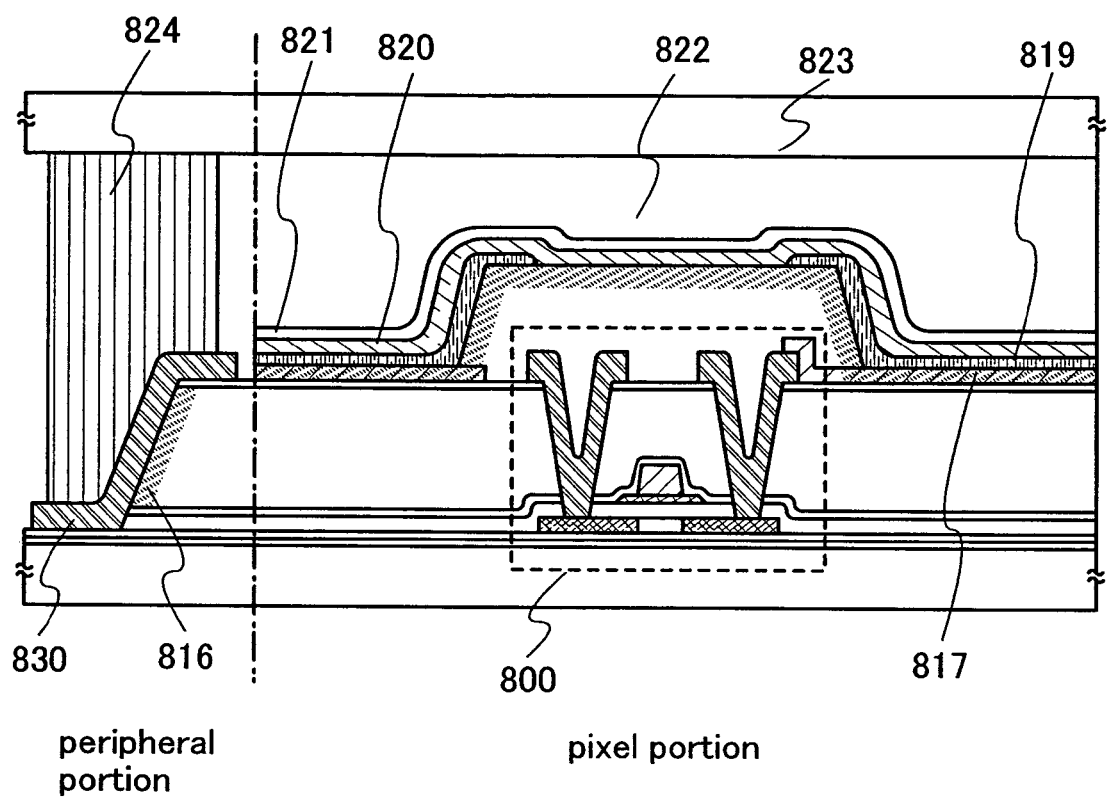
FIG. 8 is a diagram showing a configuration of the invention.

FIG. 8 shows an example in which the edge of the display device is covered with an impermeable protective film. The portions other than the edge are the same as the ones described in this embodiment with reference to FIG. 2B, therefore, the descriptions thereof are omitted herein.

In FIG. 8, reference numeral 800 denotes a TFT, 817 denotes a first electrode doped with at least one element selected from the elements belonging to Group 13 or Group 15 in the periodic table, 819 denotes a light emitting layer, 820 denotes a second electrode, 821 denotes a passivation film, 822 denotes a filler, 823 denotes a sealing substrate, and 824 denotes a sealing member. An impermeable protective film 830 is formed so as to cover the edge of the doped region 116 in the heat resistant planarized film, which is densified by doping at least one element selected from the elements belonging to Group 13 or Group 15 in the periodic table. In this embodiment, the impermeable protective film 830 is formed of a metal layer, and may be formed simultaneously with the formation of a source electrode or a drain electrode, or may be patterned to be formed separately.

In the case of using a metal layer, however, a lead wiring connected to a terminal electrode is not covered with the impermeable protective film 830. At that time, the edge portion of the substrate may be covered with the lead wiring.

The impermeable protective film 830 may be formed of one or more kinds of films selected from a conductive thin film and an insulating thin film. Used as a conductive thin film may be a film formed of one or more kinds of elements selected from Al, Ti, Mo, W, and Si. Used as an insulating thin film may be a film formed of one or more kinds of elements selected from silicon nitride, silicon oxide, silicon nitride oxide, aluminum nitride, aluminum oxynitride, aluminum nitride oxide, aluminum oxide, diamond like carbon (DLC), and a carbon film containing nitrogen (CN).

When the impermeable protective film 830 covers a side surface of the edge of the heat resistant planarized film, excellent step coverage can be provided because the edge has a tapered shape. In addition, the surface of the heat resistant planarized film is doped with at least one element selected from the elements belonging to Group 13 or Group 15 in the periodic table and a densified region 816 is formed, therefore, the surface exhibits excellent adhesiveness with the metal layer.

According to this embodiment, the impermeable protective film covers the side surface of the edge that is doped with at least one element selected from the elements belonging to Group 13 or Group 15 in the periodic table and that has a tapered shape. As a result, moisture or the like can be prevented from entering.

Further, the embodiment shown in FIG. 8 can be implemented in combination with Embodiment Modes 1 to 5.

Figure 17:
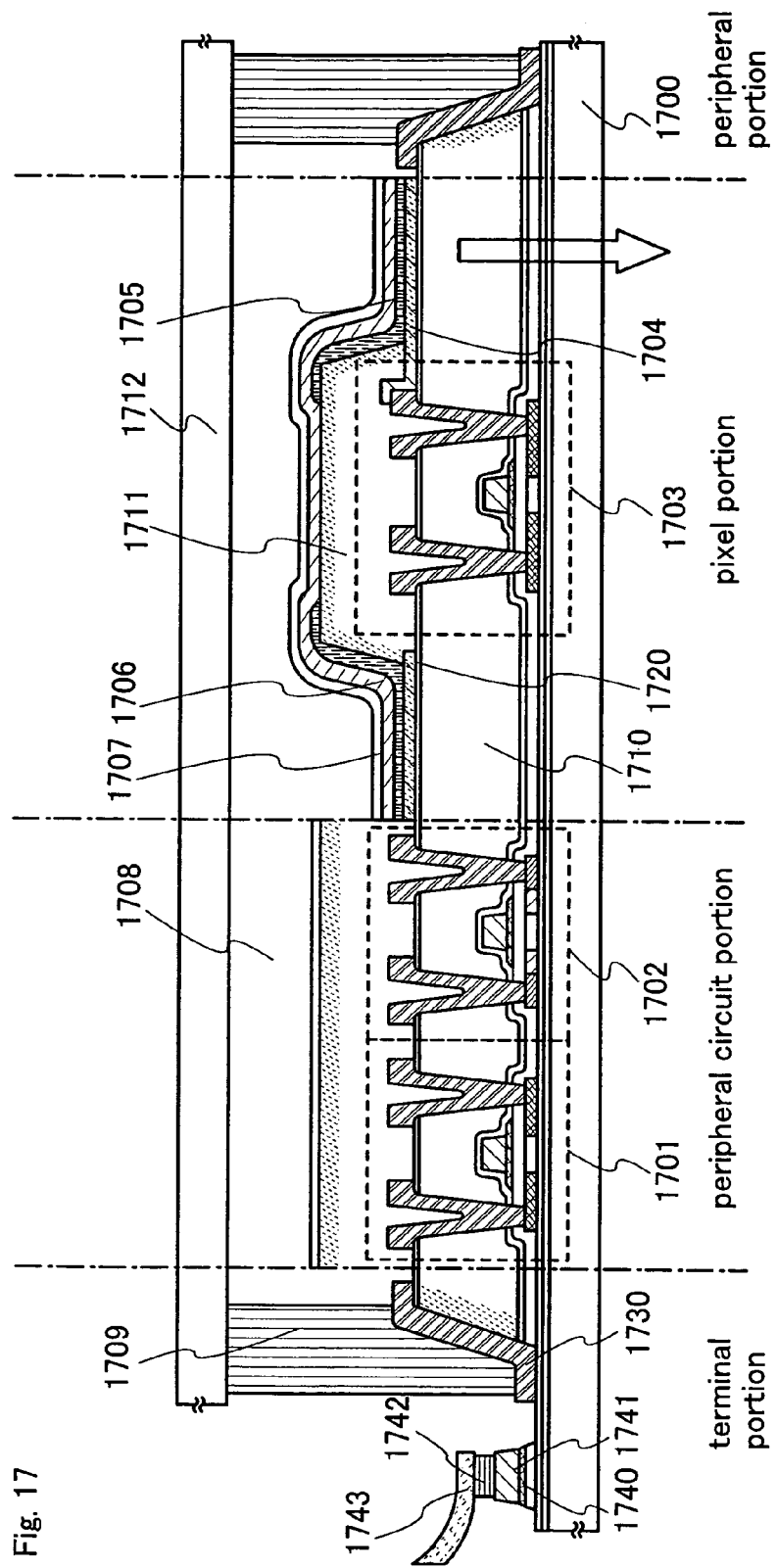
FIG. 17 is a cross sectional view of a display device of the invention.

A display device manufactured according to this embodiment is described in more detail with reference to FIGS. 17 and 20.

Figure 20:
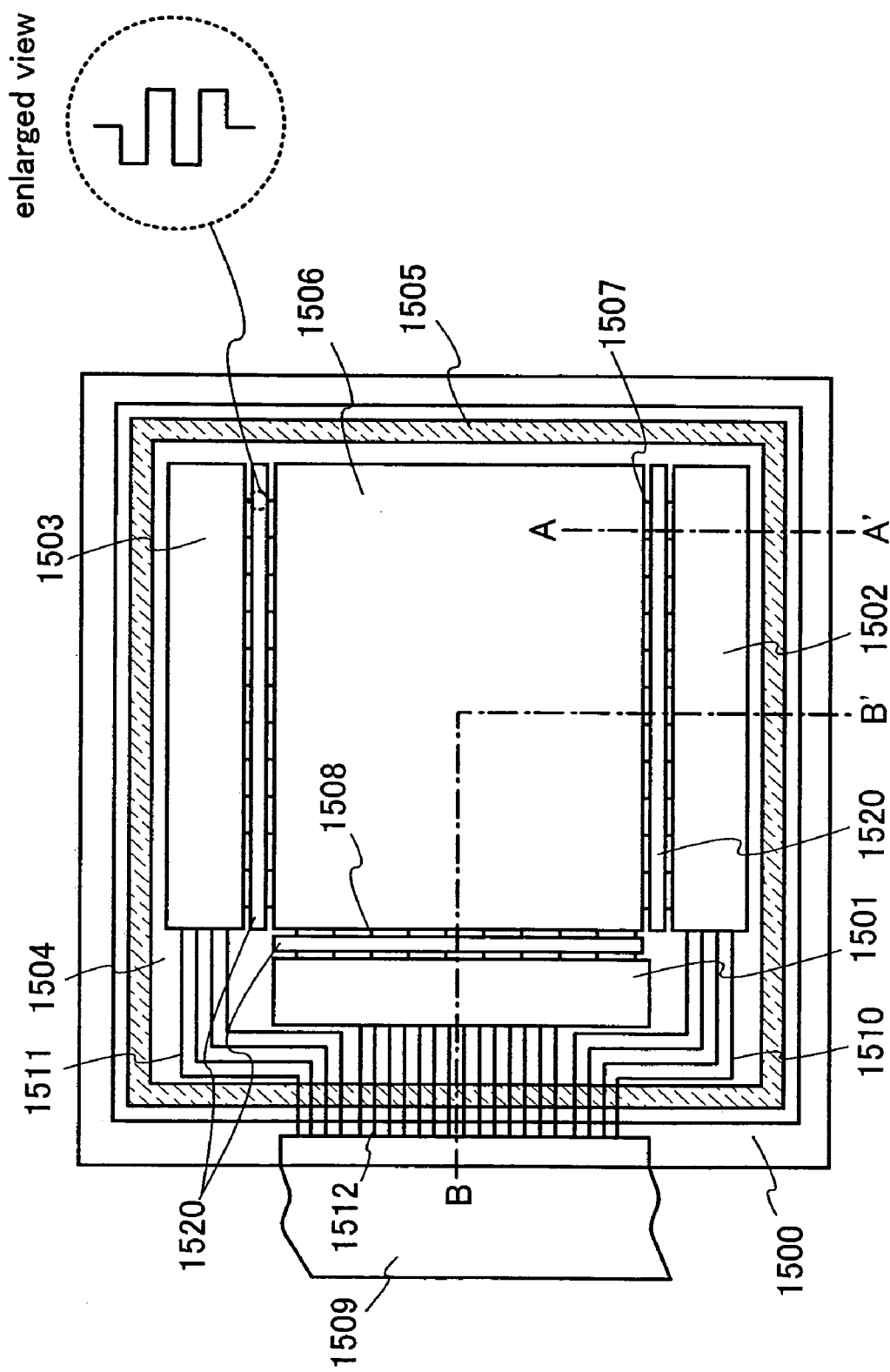
FIG. 20 is a top plan view of a display device of the invention.

FIG. 20 is a schematic top plan view of a display device of the invention. Reference numeral 1500 denotes an element substrate, 1501 denotes a source line driver circuit, 1502 and 1503 denote gate line driver circuits, 1504 denotes a sealing substrate, 1505 denotes a sealing member, 1506 denotes a pixel portion, 1507 denotes a scan line, 1508 denotes a signal line, 1509 denotes an FPC, 1510, 1511, and 1512 denote wirings, and 1520 denotes a protective circuit. FIG. 17 is a cross sectional view obtained by cutting along a line B-B' in FIG. 20. Reference numeral 1700 denotes an element substrate, 1701, 1702, and 1703 denote TFTs, 1704 denotes a first electrode, 1705 denotes a light emitting layer, 1706 denotes a second electrode, 1707 denotes a passivation film, 1708 denotes a filler, 1709 denotes a sealing member, 1710 denotes a heat resistant planarized film, 1711 denotes a bank, 1712 denotes a sealing substrate, 1720 denotes an insulting film, 1730 denotes a wiring, 1740 and 1741 denote terminal electrodes, 1742 denotes an anisotropic conductive film, and 1743 denotes an FPC.

Figure 18:
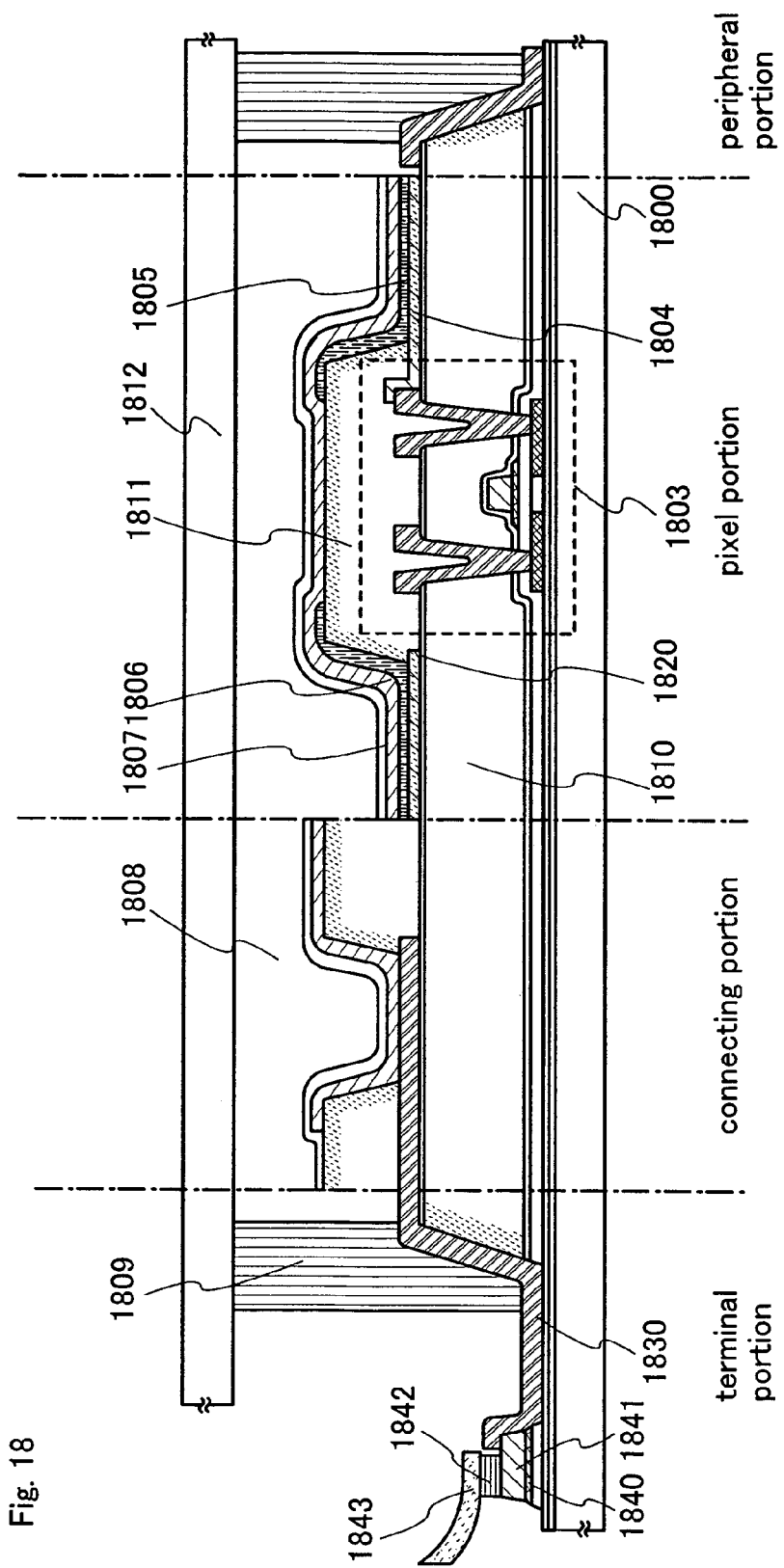
FIG. 18 is a cross sectional view of a display device of the invention.

FIG. 18 is a cross sectional view showing a lead wiring connected to the aforementioned terminal portion. Reference numeral 1800 denotes an element substrate, 1803 denotes a TFT, 1804 denotes a first electrode, 1805 denotes a light emitting layer, 1806 denotes a second electrode, 1807 denotes a passivation film, 1808 denotes a filler, 1809 denotes a sealing member, 1810 denotes a heat resistant planarized film, 1811 denotes a bank, 1812 denotes a sealing substrate, 1820 denotes an insulating film, 1830 denotes a lead wiring, 1840 and 1841 denote terminal electrodes, 1842 denotes an anisotropic conductive film, and 1843 denotes an FPC. According to this embodiment, the wiring is provided so as to cover a densified edge at the peripheral portion and the terminal portion, therefore, moisture is prevented from entering externally and degradation of a display element is inhibited, leading to further improved reliability of the display device.

The invention is not limited to such circuit configuration as shown in this embodiment, and a passive matrix circuit or an active matrix circuit may also be adopted. Further, an IC chip may be mounted or integrally formed by COG or TAB so as to function as a peripheral driver circuit. In addition, the number of gate line driver circuits and source line driver circuits is not exclusively limited.

FIG. 20 is a magnified view of the protective circuit 1520. In the protective circuit of this embodiment, wirings are made in rectangular shape, and capacitance is formed between the wirings to prevent electrostatic discharge, thereby inhibiting defects of the display device, such as electrostatic discharge damage. The protective circuit is not limited to the one shown in this embodiment, and may be formed by appropriately combining a TFT, a capacitor, a diode and the like. The protective circuit allows the display device to be further improved in reliability.

Although a light emitting element is used as a display element in this embodiment, a liquid crystal display element using a liquid crystal may also be employed as a display element. Even in the case of a liquid crystal display element being used, contamination such as moisture can be blocked by an interlayer insulating film or a bank (spacer) that has an improved and densified film. Therefore, it is possible not only to prevent contamination from entering from outside the display device but also to prevent moisture and gas existing within the interlayer insulating film or the bank from being discharged. As a result, degradation of the display device such as degradation of a liquid crystal display element due to moisture or the like, and degradation of wirings or the like can be prevented. It is to be noted that the interlayer insulating film or the bank colored by doping can be used as a good black matrix as in the case of a light emitting display device. Furthermore, when a pixel electrode is doped with one or more elements selected from inert elements, O, N, C, Si, and Ge, electrical properties of the electrode can be controlled and emission efficiency and luminance can be improved.

In a display device manufactured in this manner, the heat resistant planarized film (typically an interlayer insulating film of a TFT and used later as a base film of a light emitting element), which has a backbone structure obtained by binding silicon (Si) to oxygen (O), and the insulating layer (bank) 114 have an edge or an opening portion having a tapered shape. In addition, the heat resistant planarized film 109 and the insulating layer (bank) are doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode is also doped with at least one element selected from the elements belonging to Group 13 or Group 15 in the periodic table, physical properties such as resistance can be controlled.

Embodiment 2

In this embodiment, the display device shown in Embodiment 1, which adopts a top emission structure or a dual emission structure, is described with reference to FIGS. 13 and 16.

Figure 13:
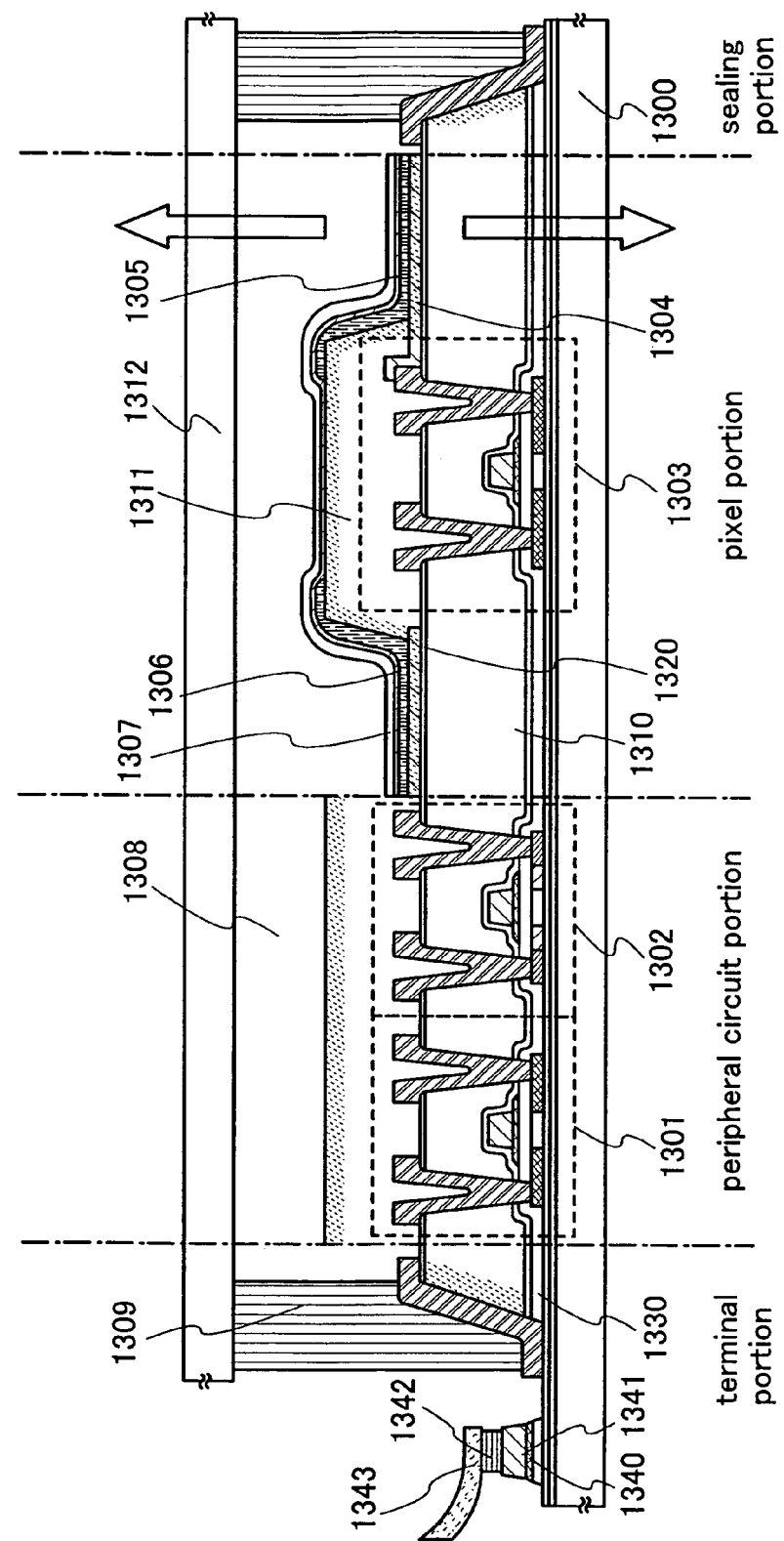
FIG. 13 is a cross sectional view of a display device of the invention.

In FIG. 13, reference numeral 1300 denotes an element substrate, 1301, 1302, and 1303 denote TFTs, 1304 denotes a first electrode, 1305 denotes a light emitting layer, 1306 denotes a second electrode, 1307 denotes a transparent conductive film, 1308 denotes a filler, 1309 denotes a sealing member, 1310 denotes a heat resistant planarized film, 1311 denotes a bank, 1312 denotes a sealing substrate, 1320 denotes an insulating film, 1330 denotes a wiring, 1340 and 1341 denote terminal electrodes, 1342 denotes an anisotropic conductive film, and 1343 denotes an FPC.

A light emitting display device shown in FIG. 13 is a dual emission type in which light is emitted in both directions shown by arrows. Note that in this embodiment, a conductive film is formed and etched to make a desired shape, and thereby the first electrode 1304 is formed. As the first electrode 1304, a transparent conductive film such as ITO, IZO, ITSO, and indium oxide mixed with zinc oxide (ZnO) of 2 to 20% may be employed. Alternatively, a titanium nitride film or a titanium film may also be used as the first electrode 1304. In that case, after forming the transparent conductive film, a titanium nitride film or a titanium film is formed to be thin enough to transmit light (preferably about 5 to 30 nm). In this embodiment, ITSO is used as the first electrode 1304.

Subsequently, the second electrode 1306 formed of a conductive film is formed on the light emitting layer 1305. The second electrode 1306 may be formed of a material having a low work function (Al, Ag, Li, Ca, or an alloy of these elements such as MgAg, MgIn, AlLi, $CaF_2$, or CaN). In this embodiment, in order to transmit light, the second electrode 1306 is formed of a metal thin film (MgAg with a thickness of 10 nm) and the transparent conductive film 1307 is formed of ITSO with a thickness of 100 nm. The ITSO film is formed by sputtering using as a target indium tin oxide mixed with 1 to 10% of silicon oxide ($SiO_2$) and setting the flow of Ar gas at 120 sccm; $O_2$ gas, 5 sccm; pressure, 0.25 Pa; and power, 3.2 kW. After forming the ITSO film, a heat treatment is carried out at a temperature of 200° C. for one hour. As the transparent conductive film 1307, ITO, an alloy of indium oxide and tin oxide, an alloy of indium oxide and zinc oxide, zinc oxide, tin oxide, indium oxide, and the like may be employed.

In the case of adopting the structure shown in FIG. 13, light from the light emitting element is transmitted and emitted to both the first electrode 1304 side and the second electrodes 1306 and 1307 side.

In the display device shown in FIG. 13, the edge of the heat resistant planarized film 1310, the first electrode 1304 formed of a transparent conductive film, and the bank 1311 are doped with at least one element selected from the elements belonging to Group 13 or Group 15 in the periodic table. Manufacturing steps of the display device shown in FIG. 13 from the formation of the bank 1311 to the doping of at least one element selected from the elements belonging to Group 13 or Group 15 in the periodic table are the same as those of the display device explained in Embodiment Mode 1 with reference to FIG. 2A, and they can thus be referred to.

Figure 16:
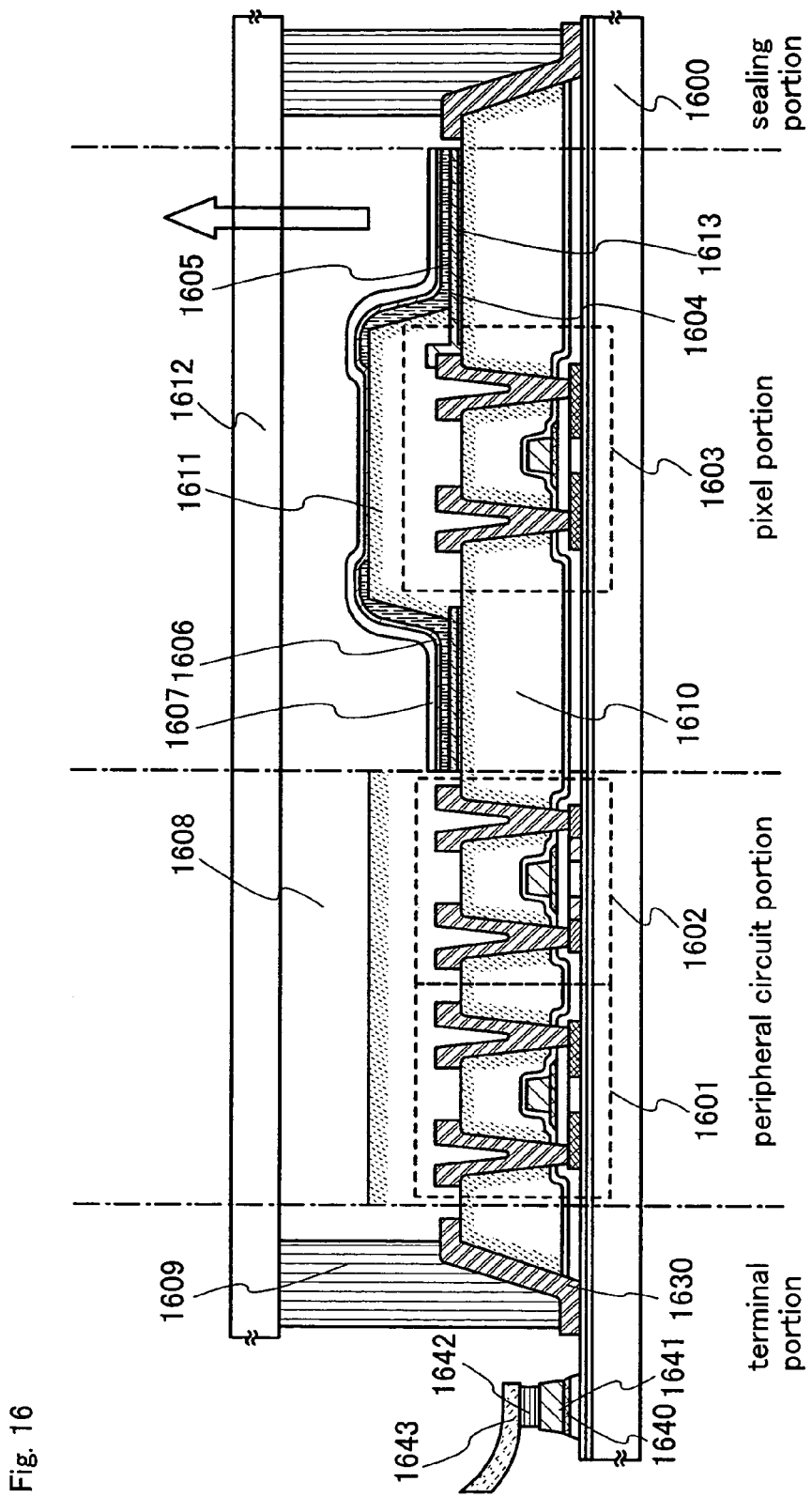
FIG. 16 is a cross sectional view of a display device of the invention.

A light emitting display device shown in FIG. 16 is a top emission type, in which light is emitted to the direction shown by an arrow. In FIG. 16, reference numeral 1600 denotes an element substrate, 1601, 1602, and 1603 denote TFTs, 1613 denotes a metal film having reflectivity, 1604 denotes a first electrode, 1605 denotes a light emitting layer, 1606 denotes a second electrode, 1607 denotes a conductive film, 1608 is a filler, 1609 denotes a sealing member, 1610 denotes a heat resistant planarized film, 1611 denotes a bank, 1612 denotes a sealing substrate, 1620 denotes an insulating film, 1630 denotes a wiring, 1640 and 1641 denote terminal electrodes, 1642 denotes an anisotropic conductive film, and 1643 denotes an FPC. In this case, the metal film 1613 having reflectivity is formed under the first electrode 1304 of the aforementioned dual emission display device shown in FIG. 13. The first electrode 1604 functioning as an anode is formed on the metal film 1613 having reflectivity. The metal film 1613 may be formed of a material having reflectivity such as Ta, W, Ti, Mo, Al, and Cu. In this embodiment, TiN film is used.

The second electrode 1606 formed of a conductive film is provided on the light emitting layer 1605. The second electrode 1606 functioning as a cathode may be formed of a material having a low work function (Al, Ag, Li, Ca, or an alloy of these elements such as MgAg, MgIn, AlLi, $CaF_2$, or CaN). In this embodiment, in order to transmit light, the second electrode 1606 is formed of a metal thin film (MgAg with a thickness of 10 nm) and the transparent conductive film 1607 is formed of ITSO with a thickness of 110 nm. As the transparent conductive film 1607, ITO, an alloy of indium oxide and tin oxide, an alloy of indium oxide and zinc oxide, zinc oxide, tin oxide, indium oxide, and the like may be employed.

In the display device shown in FIG. 16, the heat resistant planarized film 1610, the first electrode 1604 formed of a transparent conductive film, and the bank 1611 are doped with at least one element selected from the elements belonging to Group 13 or Group 15 in the periodic table. Manufacturing steps of the display device shown in FIG. 16 from the formation of the bank 1611 to the doping of at least one element selected from the elements belonging to Group 13 or Group 15 in the periodic table are the same as those of the display device explained in Embodiment Mode 4 with reference to FIG. 10A, and they can thus be referred to.

In the case of adopting the structure shown in FIG. 16, light from the light emitting element is reflected on the metal film 1613 having reflectivity and emitted upward through the second electrode 1606, the conductive film 1607 and the like. Therefore, the heat resistant planarized film 1610 is not required to transmit light, and thus it can be sufficiently doped with at least one element selected from the elements belonging to Group 13 or Group 15 in the periodic table. The periphery of a contact hole for forming the electrode of the TFT can also be doped with at least one element selected from the elements belonging to Group 13 or Group 15 in the periodic table and can be densified and modified. Accordingly, even when the wiring does not have excellent coverage and is broken, moisture can be blocked. Thus, degradation of the display element due to moisture can be prevented, leading to further improved reliability of the display device.

In a display device manufactured in this manner, the heat resistant planarized film (typically an interlayer insulating film of a TFT and used later as a base film of a light emitting element), which has a backbone structure obtained by binding silicon (Si) to oxygen (O), and the insulator (bank) have an edge or an opening portion having a tapered shape. In addition, the heat resistant planarized film and the insulating layer (bank) are doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode is also doped with at least one element selected from the elements belonging to Group 13 or Group 15 in the periodic table, physical properties such as resistance can be controlled.

Embodiment 3

In this embodiment, an example of an inverted staggered TFT is described with reference to FIGS. 14 and 15. The portions other than the TFT are the same as those described in Embodiment Mode 1 and Embodiment 1 with reference to FIG. 17, therefore, the description thereof is omitted herein. In this embodiment, a passivation film that is formed in FIG. 17 is not formed on a heat resistant planarized film, however, the passivation film may be provided in this embodiment as well.

Figure 14:
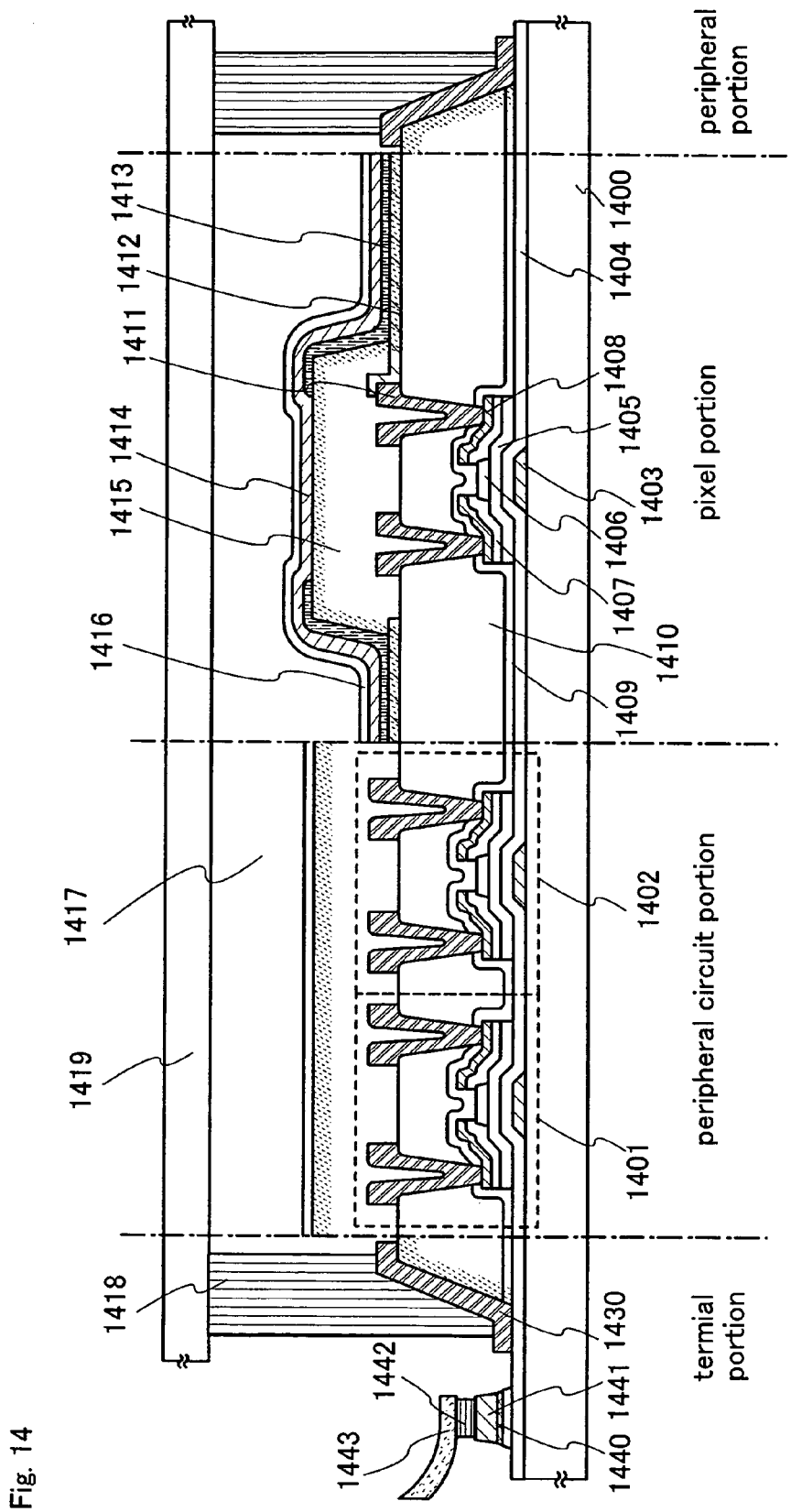
FIG. 14 is a cross sectional view of a display device of the invention.

A TFT shown in FIG. 14 is a channel stop type TFT. Reference numeral 1400 denotes an element substrate, and 1401 and 1402 denote TFTs in a driver circuit portion. A gate insulating film 1404, a semiconductor layer 1405 formed of an amorphous semiconductor film, an n+ layer 1407, and a metal layer 1408 are laminated in this order on a gate electrode 1403. A channel stopper 1406 is formed over a channel forming region in the semiconductor layer 1405. Reference numeral 1411 denotes a source electrode or a drain electrode. Reference numeral 1409 denoted an insulating film, 1412 denotes a first electrode, 1413 denotes a light emitting layer, 1414 denotes a second electrode, 1416 denotes a passivation film, 1417 denotes a filler, 1418 denotes a sealing member, 1410 denotes a heat resistant planarized film, 1415 denotes a bank, 1419 denotes a sealing substrate, 1430 denotes a wiring, 1440 and 1441 denote terminal electrodes, 1442 denotes an anisotropic conductive film, and 1443 denotes an FPC.

Figure 15:
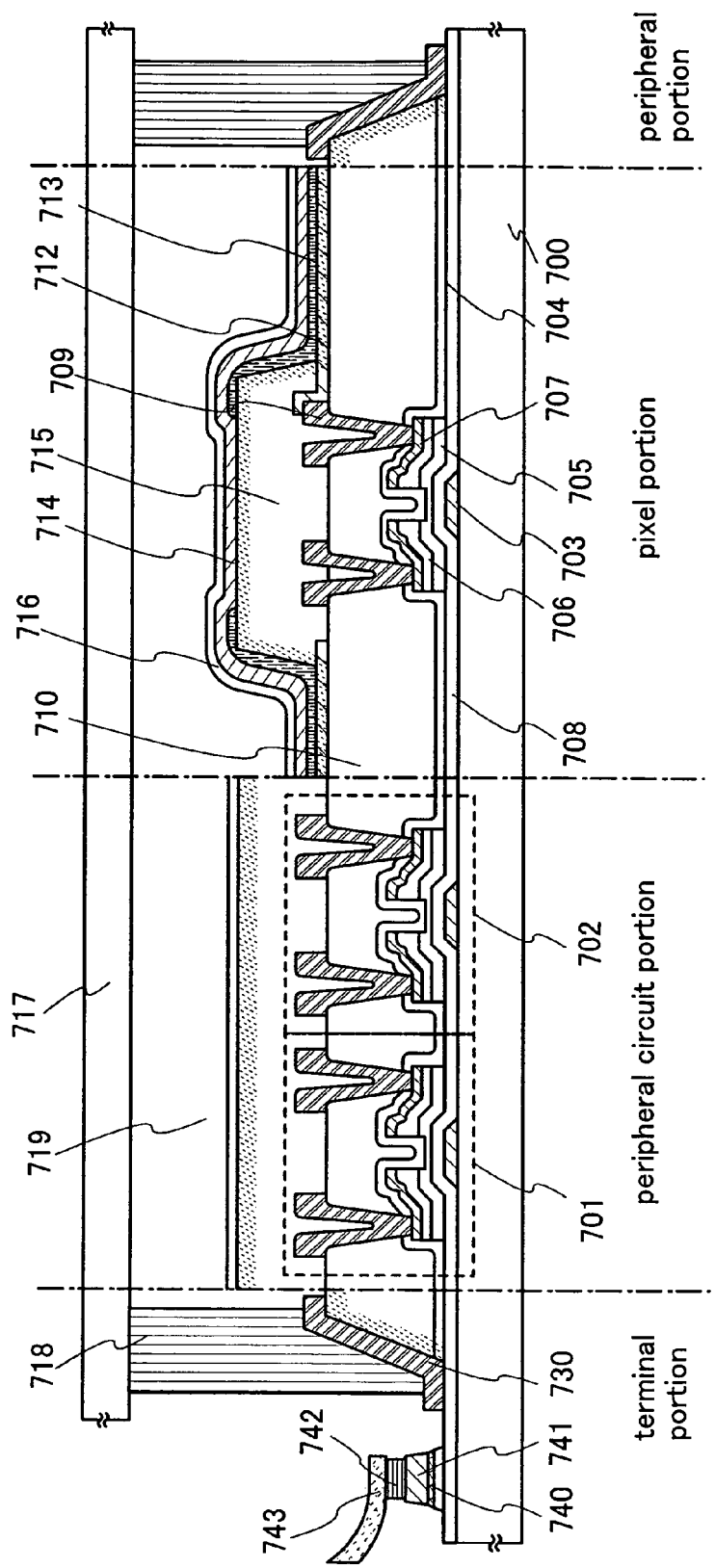
FIG. 15 is a cross sectional view of a display device of the invention.

A TFT shown in FIG. 15 is a channel etched type TFT. Reference numeral 700 denotes an element substrate, and 701 and 702 denote TFTs in a driver circuit portion. A gate insulating film 704, a semiconductor layer 705 formed of an amorphous semiconductor film, an n+ layer 706, and a metal layer 707 are laminated in this order on a gate electrode 703. A channel forming region in the semiconductor layer 705 is etched slightly. Reference numeral 709 denotes a source electrode or a drain electrode. Reference numeral 708 denotes an insulating film, 712 denotes a first electrode, 713 denotes a light emitting layer, 714 denotes a second electrode, 716 denotes a passivation film, 719 denotes a filler, 718 denotes a sealing member, 710 denotes a heat resistant planarized film, 715 denotes a bank, 717 denotes a sealing substrate, 730 denotes a wiring, 740 and 741 denote terminal electrodes, 742 denotes an anisotropic conductive film, and 743 denotes an FPC.

Instead of the amorphous semiconductor film, a semi-amorphous semiconductor film (also called a microcrystalline semiconductor film) may be used as well. The semi-amorphous semiconductor is a semiconductor having an intermediate structure between amorphous and crystalline (including single crystalline and polycrystalline) structures. This semiconductor has a third state that is stable in free energy, and includes a crystalline region having a short range order and a lattice distortion. The semi-amorphous semiconductor film can be obtained by glow discharge decomposition (plasma CVD) of silicon gas. Typically, $SiH_4$ is used as a silicon gas, though $Si_2H_6$, $SiH_2Cl_2$, $SiHCl_3$, $SiCl_4$, $SiF_4$ or the like may be used as well. The silicon gas may be diluted by adding a single or a plurality of noble gas elements selected from $H_2$, $H_2$ and He, Ar, Kr, and Ne. The dilution rate is in the range of 5 to 1000 and the pressure is in the range of about 0.1 to 133 Pa. The power supply frequency is in the range of 1 to 120 MHz, and more preferably in the range of 13 to 60 MHz. The substrate may be heated at a temperature of 300° C. or less, and more preferably 100 to 250° C. Among impurity elements that are mainly added during deposition, atmospheric elements such as oxygen, nitrogen and carbon desirably have a concentration of $1 \times 10^{20}$ $cm^{-3}$ or less. In particular, the concentration of oxygen is $5 \times 10^{19}$ $cm^3$ or less, and more preferably $1 \times 10^{19}$ $cm^3$ or less. The field effect mobility μ of a TFT using a semi-amorphous semiconductor film as an active layer is in the range of 1 to 10 $cm^2$/Vsec.

The inverted staggered TFTs shown in FIGS. 14 and 15 in this embodiment each has a semiconductor film formed of an amorphous semiconductor film. Therefore, the TFTs in a pixel portion according to this embodiment are N-channel TFTs, and the first electrodes (pixel electrodes) 1412 and 712 function as a cathode while the second electrodes 1414 and 714 functions as an anode. According to this embodiment, the first electrode and the second electrode are formed of ITSO that is a transparent conductive layer. Adopted in this embodiment is a laminated structure such as an electron injection layer (BzOs—Li: benzoxazole derivative (BzOs) doped with Li), an electron transporting layer (Alq), a light emitting layer (Alq doped with quinacridone derivative (DMQd), a hole transporting layer (4,4'-bis[N-(1-naphthyl)-N-phenyl-amino]-biphenyl(α-NPD)), a hole injection layer (molybdenum oxide (MoOx)), the second electrode (ITSO) are laminated in this order over the first electrode (ITSO). Materials of the electron injection layer, an electron transporting layer, a light emitting layer, a hole transporting layer, a hole injection layer or the like for forming the anode, the cathode, and the light emitting layer are not limited to those shown in this embodiment, and may be selected and combined arbitrarily.

Figure 29A:
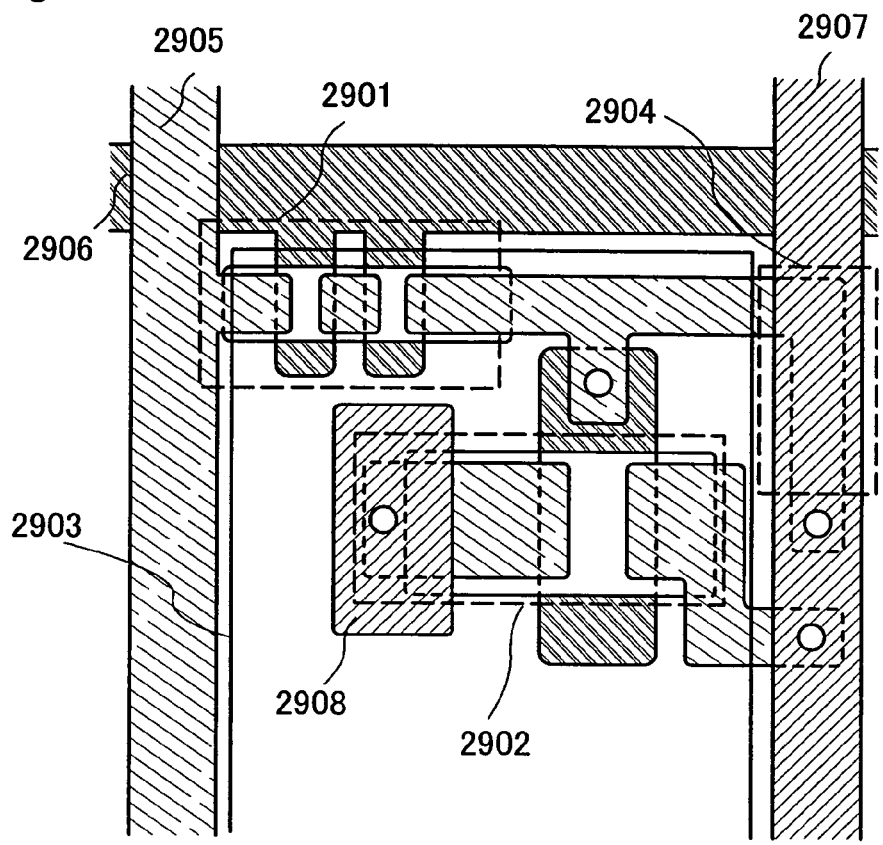
FIGS. 29A and 29B are top plan views of a display device of the invention.
Figure 29B:
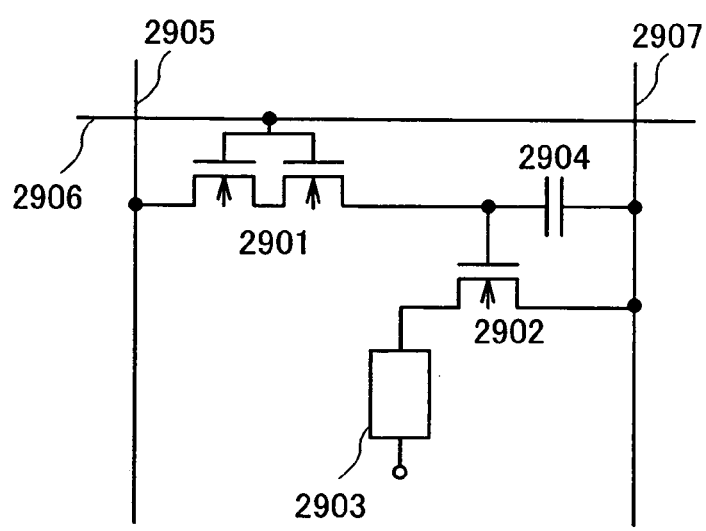

FIG. 29A is a top plan view of a pixel portion of the display device according to this embodiment, and FIG. 29B is a circuit diagram. Reference numerals 2901 and 2902 denote TFTs, 2903 denotes a light emitting element, 2904 denotes a capacitor, 2905 denotes a source line, 2906 denotes a gate line, 2907 denotes a power source line, and 2908 denotes a connection electrode connected a source or drain electrode with a first electrode (pixel electrode) of the light emitting element 2903.

In a display device manufactured in this manner, the heat resistant planarized film (typically an interlayer insulating film of a TFT and used later as a base film of a light emitting element), which has a backbone structure obtained by binding silicon (Si) to oxygen (O), and the insulating layer (bank) have an edge or an opening portion having a tapered shape. In addition, the heat resistant planarized film and the insulator (bank) are doped with at least one element selected from the elements belonging to Group 13 or Group 15 in the periodic table, which are relatively large in atomic diameter, in order to generate distortions and modify or densify the surface (including side walls). Accordingly, moisture and oxygen can be prevented from entering, leading to improved reliability of the display device. Moreover, when the first electrode is also doped with at least one element selected from the elements belonging to Group 13 or Group 15 in the periodic table, physical properties such as resistance can be controlled.

Embodiment 4

Described in this embodiment is a display device using a black matrix according to the invention.

A display device using a light emitting element as a display element includes red (R), green (G), and blue (B) pixels for displaying a plurality of colors. A black thin film called a black matrix (also called a light shielding film) is disposed between these pixels. The black matrix is provided in order to prevent degradation of TFTs due to light, prevent light leakage from adjacent electrodes arranged in matrix, and improve the definition.

Conventionally, used as a black matrix are a Cr black obtained by etching a Cr thin film, a photosensitive resin layer colored with a dye or a pigment, a film obtained by dispersing a black pigment into a polymer that can be etched, and the like. However, Cr is a toxic metal and has been limited in use in various fields. In addition, a black matrix formed of a resin has not exhibited excellent optical properties so far, and has many problems. Thus, what is required is a film having low reflectivity and transmittance (almost pure black) and being processed (etched) easily.

According to the invention, as described in Embodiment Modes 1 to 4 and Embodiments 1 to 3 with reference to the drawings, a bank of the display device is doped with at least one element selected from the elements belonging to Group 13 or Group 15 in the periodic table. At least one element selected from the elements belonging to Group 13 or Group 15 in the periodic table, which are relatively large in atomic diameter, is doped in order to generate distortions and modify or densify the surface (including side walls). Accordingly, moisture and oxygen can be prevented from entering, leading to improved reliability of the display device.

According to the invention, when at least one element selected from the elements belonging to Group 13 or Group 15 in the periodic table is doped to a silicon oxide (SiOx) film containing an alkyl group and a film containing an organic material such as polyimide and acryl, which are used for a bank, transmittance of these films changes. Thus, according to the invention, transmittance of a film can be controlled and the film can be colored in black to be used as a black matrix.

Transmittance and reflectivity of a silicon oxide (SiOx) film containing an alkyl group used as a bank are measured. Used as a sample is a film obtained by applying the invention to a sample formed by patterning a silicon oxide (SiOx) film containing an alkyl group with a resist and removing the resist with a resist stripper. As a comparative example, a film to which the invention is not applied is employed. The resist stripper used here contains as a composition 2-aminoethanol $HOC_2H_4NH_2$ (30 wt %) and glycol ether $R-(OCH_2)_2OH$ (70 wt %). The film to which the invention is applied is doped with P or B at a dosage of $1 \times 10^{16}/cm^2$ as at least one element selected from the elements belonging to Group 13 or Group 15 in the periodic table, and two kinds of films are prepared.

Figure 23:
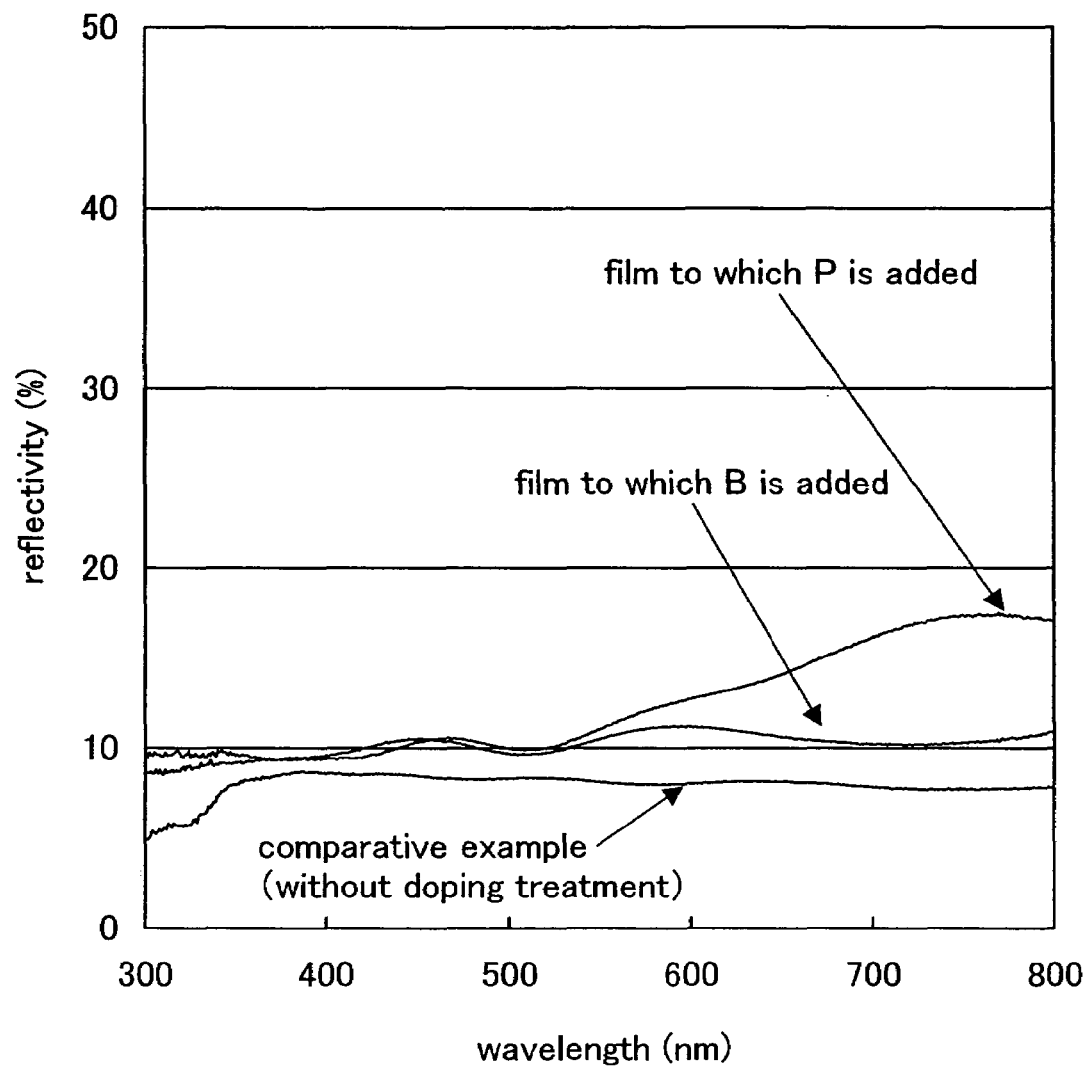
FIG. 23 is a graph showing reflectivity.
Figure 30:
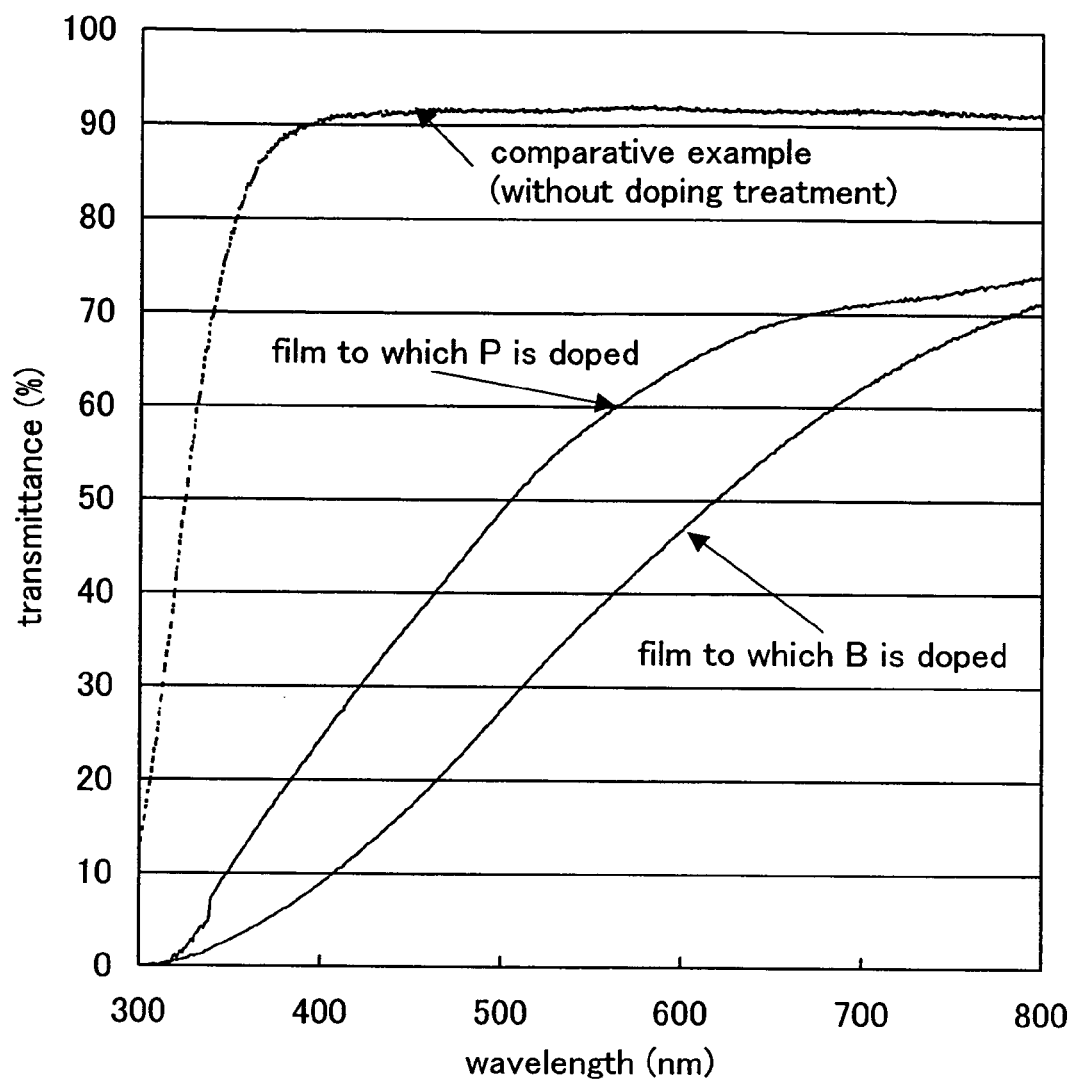
FIG. 30 is a graph showing transmittance.

The measurement result is shown in FIGS. 23 and 30. In the film to which the invention is not applied as a comparative example in FIG. 30, the transmittance is 90% or more in the visible range of about 400 to 800 nm. On the other hand, in the film to which the invention is applied and P or B is doped as at least one element selected from the elements belonging to Group 13 or Group 15 in the periodic table, the transmittance is lowered.

Meanwhile, the measurement result shows that all the samples have a low reflectivity of 20% or less in the visible range. That is, the reflectivity remains low even when doping at least one element selected from the elements belonging to Group 13 or Group 15 in the periodic table.

The aforementioned measurement results verify that according to the invention, an organic material is colored and transmittance is lowered, though reflectivity remains low. Therefore, an organic film to which the invention is applied can be used as a good black matrix. Furthermore, the organic film is harmless and easily processed. Thus, according to the invention, a bank can function as a densified barrier against moisture or the like as well as a black matrix that is easily processed and has improved optical properties.

In the display device described in Embodiment Modes 1 to 4 and Embodiments 1 to 3 with reference to the drawings, the insulator functioning as a bank is formed and patterned, and then the first electrode and the bank are doped with at least one element selected from the elements belonging to Group 13 or Group 15 in the periodic table. However, patterning may be performed after forming the insulator functioning as a bank and doping the whole surface thereof with at least one element selected from the elements belonging to Group 13 or Group 15 in the periodic table to be colored. In this case, the first electrode is not doped with at least one element selected from the elements belonging to Group 13 or Group 15 in the periodic table during the doping step, therefore, the concentration of an element, the area to be doped, and the like can be determined arbitrarily, which expands the design flexibility.

Thus, according to the invention, an inexpensive display device with improved yield and reliability can be provided while reducing the number of manufacturing steps.

Embodiment 5

Figure 25:
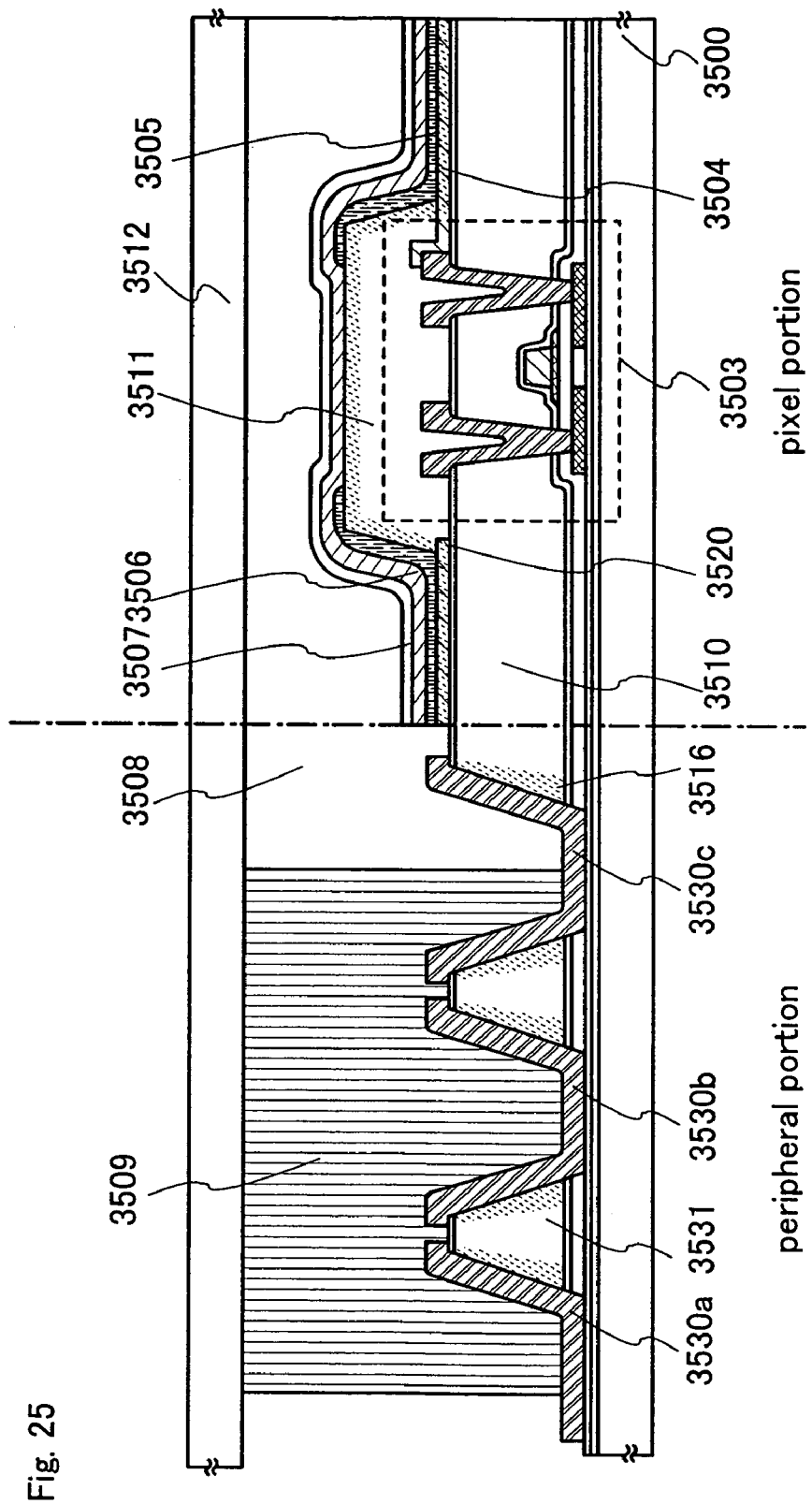
FIG. 25 is a cross sectional view of a display device of the invention.

In this embodiment, other display devices according to the invention are described with reference to FIGS. 20, 25, and 26.

FIG. 20 is an example of a top plan view of the display device according to the invention. A terminal portion 1509, 1512 and a pixel portion 1506 are connected with lead wirings 1510 and 1511 and the like. FIG. 25 is an example of a cross sectional view obtained by cutting along a line A-A' of FIG. 20. Reference numeral 3500 denotes an element substrate, 3503 denotes a TFT, 3504 denotes a first electrode, 3505 denotes a light emitting layer, 3506 denotes a second electrode, 3507 denotes a passivation film, 3508 denotes a filler, 3509 denotes a sealing member, 3510 denotes a heat resistant planarized film, 3511 denotes a bank, 3512 denotes a sealing substrate, and 3520 denotes an insulating film (passivation film). A region shown by dotted lines such as a region 3516 is densified by doping of at least one element selected from the elements belonging to Group 13 or Group 15 in the periodic table. The densified edge 3516 of the heat resistant planarized film 3510 is covered with a lead wiring 3530c, and thereby moisture blocking effect can be further increased. Three lead wirings 3530a, 3530b, and 3530c are shown in the drawing, though the invention is not limited to this. The lead wirings 3530a, 3530b, and 3530c are formed with an insulating layer 3531 interposed therebetween.

Figure 26:
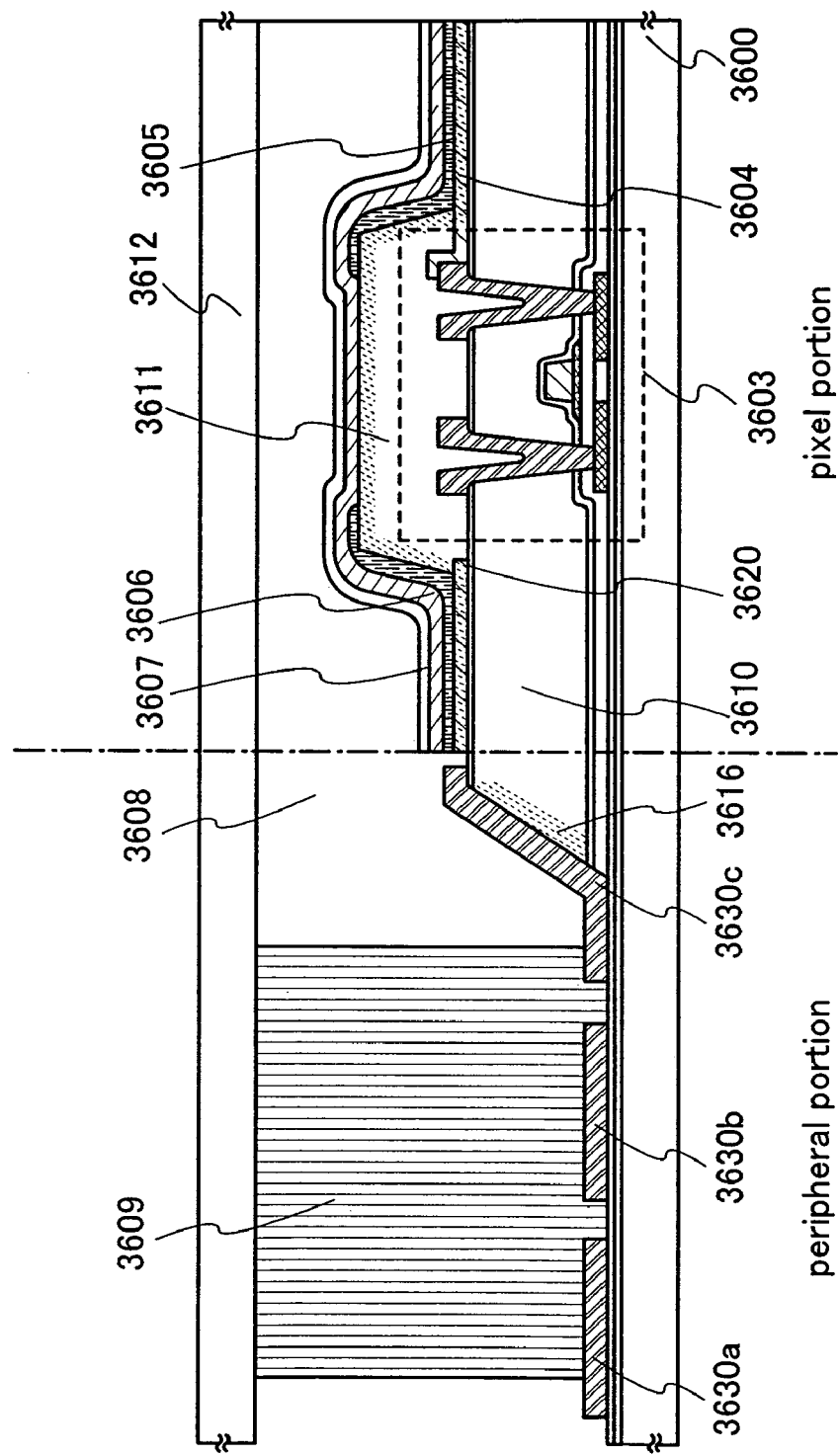
FIG. 26 is a cross sectional view of a display device of the invention.

FIG. 26 shows another example of the display device according to the invention. Reference numeral 3600 denotes an element substrate, 3603 denotes a TFT, 3604 denotes a first electrode, 3605 denotes a light emitting layer, 3606 denotes a second electrode, 3607 denotes a passivation film, 3608 denotes a filler, 3609 denotes a sealing member, 3610 denotes a heat resistant planarized film, 3611 denotes a bank, 3612 denotes a sealing substrate, and 3620 denotes an insulating film (passivation film). A region shown by dotted lines such as a region 3616 is densified by doping of at least one element selected from the elements belonging to Group 13 or Group 15 in the periodic table. The densified edge 3616 of the heat resistant planarized film 3610 is covered with a lead wiring 3630c, and thereby moisture blocking effect can be further increased. Three lead wirings 3630a, 3630b, and 3630c are shown in the drawing, though the invention is not limited to this. The three lead wirings 3630a, 3630b, and 3630c are formed with the sealing member 3609 interposed therebetween instead of an insulating layer.

In the display device shown in FIG. 26, a taper angle of the edge 3616 of the heat resistant planarized film 3610 has to be made relatively small. This is to avoid the possibility that when a conductive film functioning as a wiring is formed on the edge 3616 with a small taper angle and then patterned by etching, the conductive film may be left on the tapered edge 3616 as etching residue. The conductive film left on the edge of the heat resistant planarized film will cause defects such as a short circuit between wirings.

When an isotropic etching such as wet etching can be carried out, a tapered shape can be easily obtained as long as a margin for etching and a certain film thickness can be ensured.

Described in this embodiment is a method for making a desired tapered shape with a relatively small taper angle by anisotropic dry etching.

When forming a mask by photolithography, a slit narrower than a resolution limit of an exposure unit used for exposure is formed at the edge of the photomask so as to make a tapered shape. A mask material such as a resist is not completely exposed in the slit narrower than a resolution limit of an exposure unit, and the mask with a reduced thickness is left after removing the exposed region with a developer.

As described above, a slit or a hole that is narrower than a resolution limit of an exposure unit is formed in a photomask. Accordingly, a photosensitive mask material such as a resist may include an incompletely exposed region between a non-exposed region and a completely exposed region, and thereby the edge of an etching mask can have a tapered shape.

When an etching mask with a tapered shape and an object under the mask are both etched by anisotropic etching typified by dry etching, not only the object but also the etching mask begins to be etched from a part with a thinner thickness. When the etching mask is etched and disappears, the object that is exposed to an etching atmosphere is etched in sequence, and thereby the object with a desired shape can be obtained by reflecting the form of the etching mask more or less.

As a result, with the use of the etching mask having an edge with a tapered shape, the object having an edge with the same tapered shape, that is, the edge 3616 with a desired tapered shape of the heat resistant planarized film 3610 in FIG. 26 can be obtained.

The edge 3616 does not include an etching residue of wiring as shown in FIG. 26, therefore, an insulating layer is not required to be provided between lead wirings. According to this, manufacturing steps can be simplified, and the insulating layer through which water is easily dispersed can be completely sealed within a display device with a sealing member while making an enclosed space. Thus, degradation of a display element can be prevented, leading to further improved reliability of the display device.

Embodiment 6

In this embodiment, other display devices according to the invention are described with reference to FIGS. 19 and 20.

FIG. 20 is an example of a top plan view of the display device according to the invention. A cross sectional view as shown in B-B' of FIG. 20 is shown in FIG. 19. FIG. 19 is a cross sectional view showing a lead wiring portion connected to a terminal portion. Reference numeral 1900 denotes an element substrate, 1903 denotes a TFT, 1904 denotes a first electrode, 1905 denotes a light emitting layer, 1906 denotes a second electrode, 1907 denotes a passivation film, 1908 denotes a filler, 1909 denotes a sealing member, 1910 denotes a heat resistant planarized film, 1911 denotes a bank, 1912 denotes a sealing substrate, 1920 denotes an insulating film (passivation film), 1930 denotes a lead wiring, 1940 and 1941 denote terminal electrodes, 1942 denotes an anisotropic conductive film, and 1943 denotes an FPC. In the display device of this embodiment, densified edges 1916 and 1926 are covered with wirings 1930 and 1933 at the peripheral portion and the terminal portion. Therefore, moisture can be prevented from entering and deterioration of the display element can be inhibited, leading to improved reliability.

Figure 19:
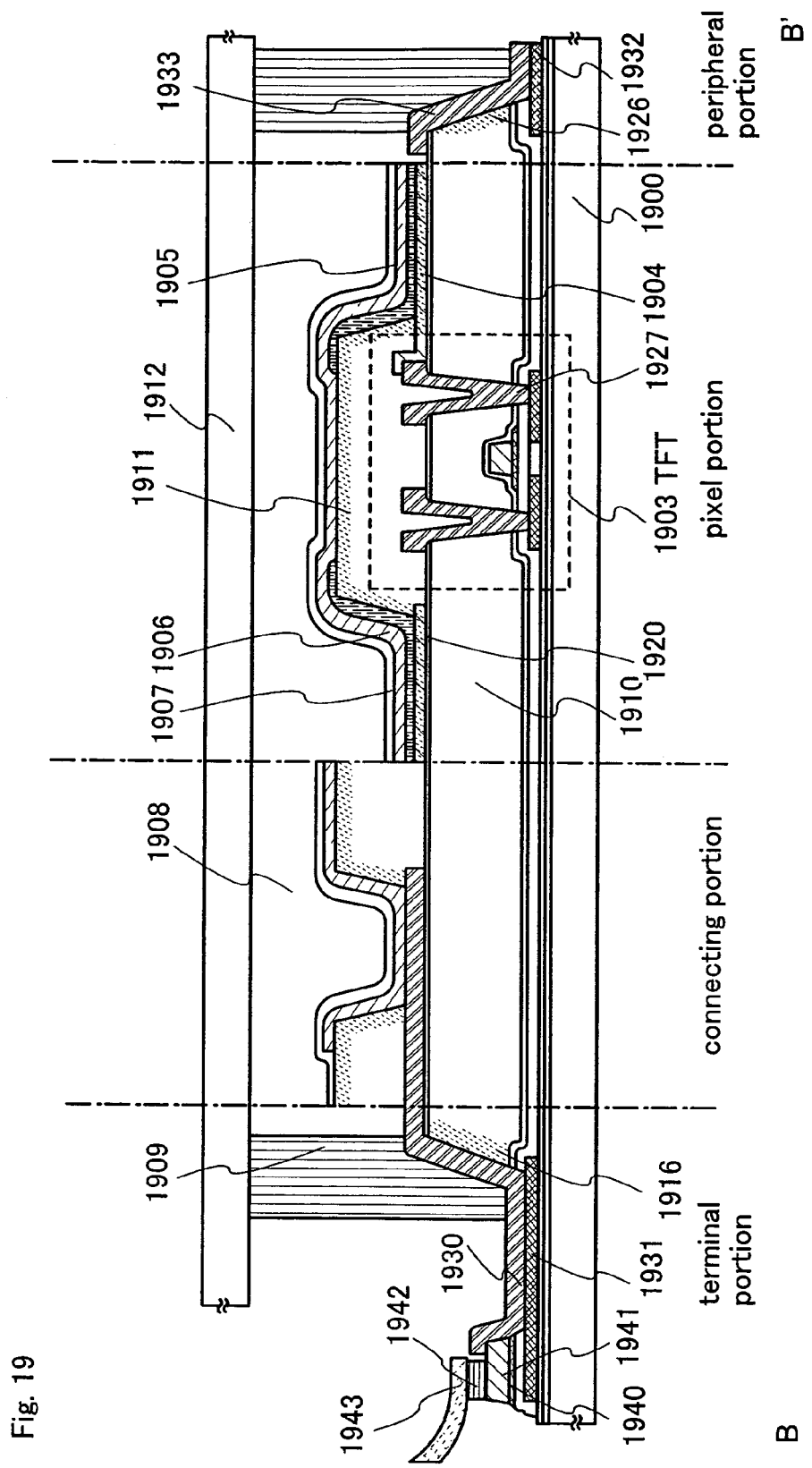
FIG. 19 is a cross sectional view of a display device of the invention.

In FIG. 19, a contact hole is formed in the heat resistant planarized film 1910 in order to form an electrode 1927 connected to a semiconductor layer, while removing the heat resistant planarized film 1910 in the peripheral edge portion of the substrate. At this time, the contact hole can be etched without irregularity because the semiconductor layer functions as an etching stopper. However, a semiconductor layer, namely an etching stopper is not formed over a substrate at the peripheral portion and the terminal portion, thus a base film and a glass substrate are etched. Therefore, the base film or the glass substrate cannot have high planarization rate and has irregular surface thereof at the peripheral portion and the terminal portion.

When a wiring is formed over the film with irregularity, a conductive film cannot have excellent coverage, which causes defects such as broken wiring and short circuit. Further, the irregularity causes variations in reflectivity of the wiring, leading to a clouded pattern at the peripheral portion and the terminal portion.

Accordingly, in the display device shown in FIG. 19, layers 1931 and 1932 functioning as etching stoppers are formed in the peripheral portion and the edge portion. Each of the etching stopper layers 1931 and 1932 is preferably formed of a material having high etch selectivity relative to a gate insulating film, such as a material used for a semiconductor layer such as silicon or a conductive layer used for a gate electrode. When the etching stopper layers 1931 and 1932 are formed of the same material as that used for forming a TFT, they can be obtained in the same step as the formation of the TFT, and thereby the manufacturing steps can be simplified.

In this embodiment, the etching stopper layers 1931 and 1932 are formed of silicon that is the same material as a semiconductor layer. Since the etching stopper layers 1931 and 1932 function as etching stoppers, insulating layers such as the heat resistant planarized film at the terminal portion and the peripheral portion can be etched without irregularity. Therefore, the wirings 1930 and 1933 can be formed thereon with excellent coverage. Electrical property defects and appearance defects such as a clouded pattern due to variations in reflectivity can thus be solved, leading to improved reliability of the display device.

Since the etching stopper layers 1931 and 1932 are doped with an impurity element such as phosphorous and boron, the display device is surrounded part way by a semiconductor layer with relatively low resistance, and potentials on the whole substrate can be kept equal. Accordingly, electrostatic discharge damage and plasma damage can also be prevented.

Thus, according to the invention, a display device with improved reliability and yield can be provided.

Embodiment 7

The invention can be applied to various display devices. That is, the invention can be applied to various electronic appliances using these display devices for a display portion.

The invention can be applied to electronic appliances such as a video camera, digital camera, a projector, a head mounted display (goggle type display), a car navigation system, an in-car audio system, a personal computer, a game machine, a portable information terminal (mobile computer, mobile phone, an electronic book or the like), an image reproducing device provided with a recording medium (specifically, a device that can reproduce a recording medium such as a DVD (Digital Versatile Disc) and that includes a display capable of displaying the reproduced image). Examples of these electronic appliances are shown in FIGS. 21A to 21E.

Figure 21A:
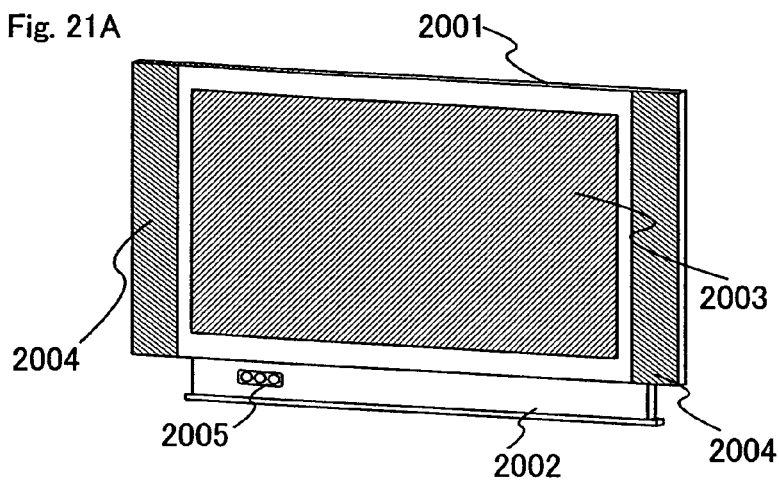
FIGS. 21A to 21E are views showing display devices of the invention.

FIG. 21A illustrates a display device having, for example, a 20 to 80-inch large display portion. The display device includes a housing 2001, a supporting base 2002, a display portion 2003, speaker portions 2004, a video input terminal 2005 and the like. The invention can be applied to the display portion 2003. In view of the productivity and the cost, such a large display device is preferably formed by using a large substrate of a so-called fifth generation (1000× 1200 mm), sixth generation (1400×1600 mm), or seventh generation (1500×1800 mm) panel. According to the invention, an inexpensive display device with improved reliability can be provided while reducing the number of manufacturing steps, even when using such a large substrate.

Figure 21B:
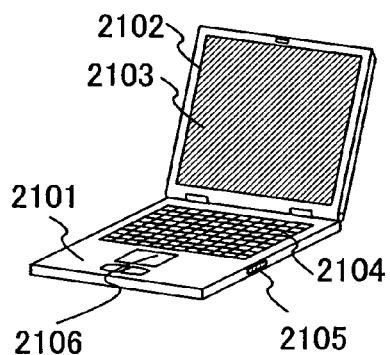

FIG. 21B illustrates a laptop personal computer that includes a main body 2101, a housing 2102, a display portion 2103, a keyboard 2104, an external connecting port 2105, a pointing mouse 2106 and the like. The invention can be applied to the display portion 2103. According to the invention, a laptop personal computer that is often used in the open air can provide a high quality image with improved reliability even when being used in a harsh environment.

Figure 21C:
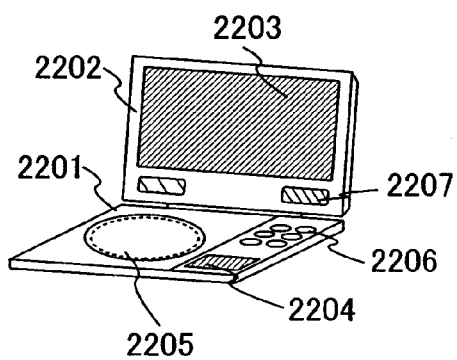

FIG. 21C illustrates an image reproducing device provided with a recording medium (specifically, a DVD reproducing device), that includes a main body 2201, a housing 2202, a display portion A2203, a display portion B2204, a recording medium (such as DVD) reading portion 2205, an operating key 2206, a speaker portion 2207 and the like. The display portion A 2203 mainly displays image data whereas the display portion B2204 mainly displays character data. The invention can be applied to these display portions A2203 and B2204. According to the invention, a high quality image can be provided with improved reliability.

Figure 21D:
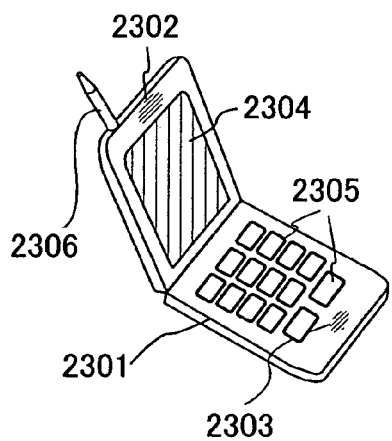

FIG. 21D illustrates a mobile phone that includes a main body 2301, an audio output portion 2302, an audio input portion 2303, a display portion 2304, operating switches 2305, an antenna 2306 and the like. When the display device according to the invention is applied to the display portion 2304, a mobile phone that is often used in a hot and humid environment such as in the open air can provide a high quality image with improved reliability.

Figure 21E:
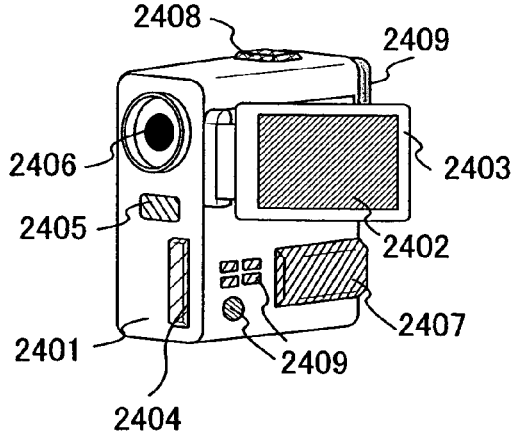

FIG. 21E illustrates a video camera that includes a main body 2401, a display portion 2402, a housing 2403, an external connecting port 2404, a remote control receiving portion 2405, an image receiving portion 2406, a battery 2407, an audio input portion 2408, operating keys 2409 and the like. The invention can be applied to the display portion 2402. When the display device according to the invention is applied to the display portion 2402, a video camera can provide a high quality image with improved reliability even when being used in a hot and humid environment such as in the open air.

Figure 22:
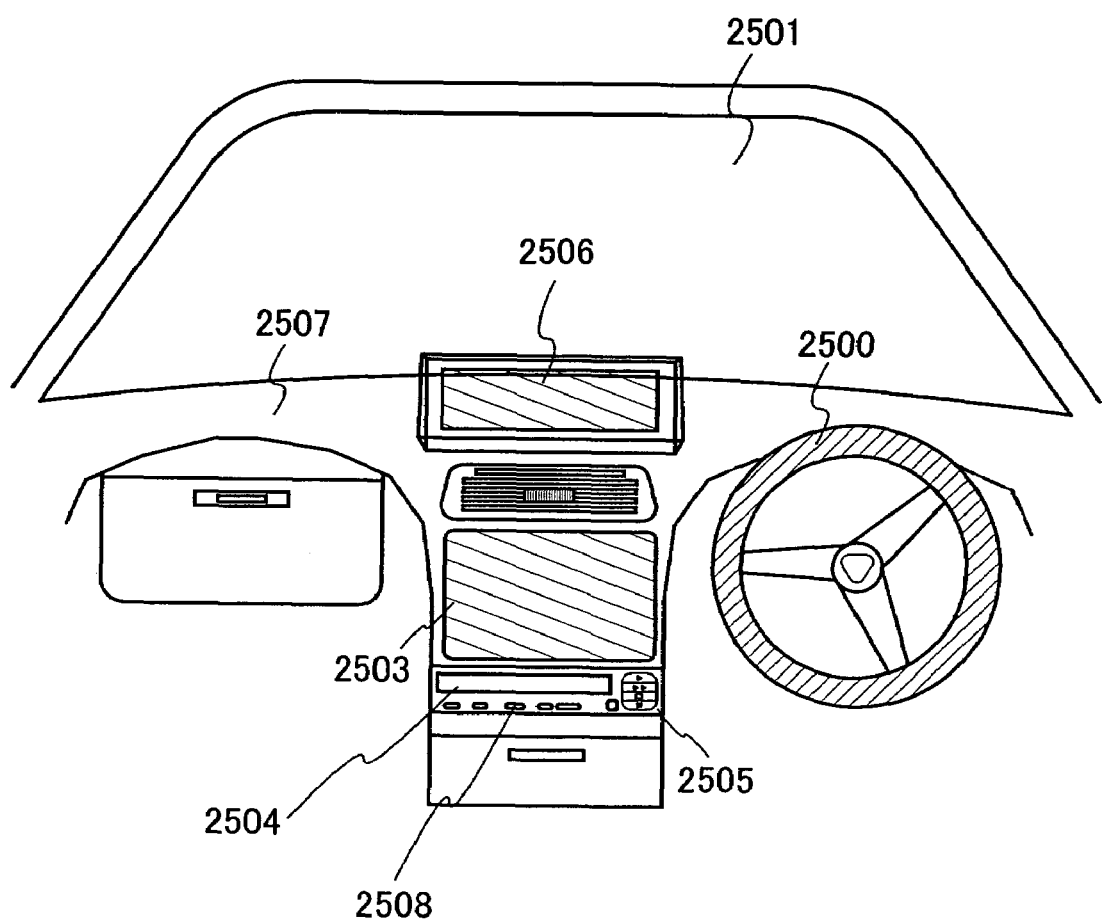
FIG. 22 is a view showing a display device of the invention.

FIG. 22 shows an example of a display portion mounted on an auto car. Although an auto car is taken as an example of a vehicle herein, the invention is not exclusively limited to this and may be applied to a plane, a train, an electric train or the like. In particular, it is important for a display device mounted on an auto car to have high reliability even in a harsh environment (in a hot and humid car).

FIG. 22 illustrates an area around the driver seat. A dashboard 2507 includes an audio reproducing device, specifically an in-car audio system and a car navigation system. A main body 2505 of the in-car audio system includes a display portion 2504 and an operating button 2508. The invention is applied to the display portion 2504, leading to high reliability of the in-car audio system.

The invention can also be applied to a display portion 2503 of the car navigation system and a display portion 2506 for displaying the status of air conditioning in the car, leading to high reliability of the car navigation system.

Although the in-car audio system and the car navigation system are shown in this embodiment, the invention can be applied to a display device for other vehicles, and a stationary audio system or navigation system.

As set forth above, the application range of the invention is so wide that the invention can be applied to electronic appliances of all fields.

This application is based on Japanese Patent Application serial no. 2003-365229 filed in Japan Patent Office on 24, Oct., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A manufacturing method of a display device comprising:

forming a thin film transistor over a first substrate;

forming an interlayer insulating film over the thin film transistor;

removing the interlayer insulating film selectively so that at least one opening is formed in the interlayer insulating film and a side surface of the interlayer insulating film has a tapered shape at an edge of the first substrate;

first doping an impurity element of one conductivity to the opening portion and the side surface of the interlayer insulating film;

forming a first electrode electrically connected to the thin film transistor over the interlayer insulating film;

forming an insulating layer covering an edge of the first electrode;

second doping an impurity element of one conductivity to the first electrode and the insulating layer;

forming a layer including an organic compound over the first electrode; and forming a second electrode over the layer including an organic compound, wherein at the first doping step, a high concentration impurity region is formed in a semiconductor layer of the thin film transistor.

2. The manufacturing method of a display device, according to claim 1, wherein the method further comprises attaching a second substrate to the first substrate with a sealing member surrounding an outer edge of the interlayer insulating film.

3. The manufacturing method of a display device, according to claim 1, wherein the high concentration impurity region is formed in a source region or a drain region of the semiconductor layer.

4. The manufacturing method of a display device, according to claim 1, wherein the side surface of the interlayer insulating film is tapered in the range between 30 and 75°.

5. The manufacturing method of a display device, according to claim 1, wherein the impurity element of one conductivity is doped so that a dosage thereof is equal in the first electrode and the insulating layer.

6. The manufacturing method of a display device, according to claim 1, wherein the impurity element of one conductivity is doped so that the concentration thereof is in the range of $1\times10^{18}$ to $5\times10^{21}/\text{cm}^3$, and typically in the range of $2\times10^{19}$ to $2\times10^{21}/\text{cm}^3$.

7. The manufacturing method of a display device, according to claim 1, wherein at least one element selected from elements belonging to Group 13 or Group 15 in the periodic table is doped as the impurity element of one conductivity.

8. The manufacturing method of a display device, according to claim 1, wherein the interlayer insulating film or the insulating layer is formed by an application method using a silicon oxide film including an alkyl group.

9. The manufacturing method of a display device, according to claim 1, wherein the first electrode is formed by sputtering using as a target indium tin oxide including silicon oxide.

10. The manufacturing method of a display device, according to claim 1, wherein the insulating layer is colored to be used as a black matrix.

* * * * *